US012663714B2

(12) United States Patent
Otomo et al.

(10) Patent No.: US 12,663,714 B2

(45) Date of Patent: Jun. 23, 2026

(54) RESIST COMPOSITION AND PATTERN FORMING PROCESS

(71) Applicant: Shin-Etsu Chemical Co., Ltd., Tokyo (JP)

(72) Inventors: Yutaro Otomo, Joetsu (JP); Tomohiro Kobayashi, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 530 days.

(21) Appl. No.: 18/226,436

(22) Filed: Jul. 26, 2023

(65) Prior Publication Data

US 2024/0053678 A1 Feb. 15, 2024

(30) Foreign Application Priority Data

Aug. 8, 2022 (JP) ................................ 2022-126073

(51) Int. Cl.

*G03F 7/004* (2006.01)
*G03F 7/038* (2006.01)
*G03F 7/039* (2006.01)
*G03F 7/30* (2006.01)

(52) U.S. Cl.

CPC ............ *G03F 7/0045* (2013.01); *G03F 7/038* (2013.01); *G03F 7/30* (2013.01)

(58) Field of Classification Search

CPC .... G03F 7/0045; G03F 7/0392; G03F 7/0397; G03F 7/30

See application file for complete search history.

(56) References Cited

U.S. PATENT DOCUMENTS 5,736,296 A * 4/1998 Sato ........................ G03F 7/039 430/905
7,687,208 B2 * 3/2010 Shibui .................. G03F 7/0045 430/326
2005/0020710 A1 * 1/2005 Ishihara .................... C08F 2/50 522/31
2005/0233253 A1 * 10/2005 Ishihara ............... C08G 65/105 430/311
2009/0274980 A1 11/2009 Kang et al.
2011/0159429 A1 6/2011 Thackeray et al.
2013/0034813 A1 * 2/2013 Ohsawa ................ G03F 7/0397 430/326
2014/0004705 A1 1/2014 Kang et al.
2019/0094690 A1 3/2019 Hatakeyama et al.

(Continued)

FOREIGN PATENT DOCUMENTS

CN 101572226 A 11/2009
JP 2010-175893 A 8/2010

(Continued)

OTHER PUBLICATIONS

Office Action dated Apr. 30, 2025, issued in counterpart TW Application No. 112129225, with English translation.(17 pages).

(Continued)

*Primary Examiner* — John S. Chu

(74) *Attorney, Agent, or Firm* — WHDA, LLP

(57) ABSTRACT

A resist composition comprising an acid compound, a photoacid generator of iodonium salt type and/or a photodecomposable quencher of iodonium salt type, and a base polymer has a high sensitivity, reduced edge roughness or size variation, improved resolution and satisfactory storage stability.

12 Claims, 1 Drawing Sheet

(56) References Cited

U.S. PATENT DOCUMENTS

| | | | | |
|---|---|---|---|---|
| 2020/0379345 | A1* | 12/2020 | Fukushima | G03F 7/004 |
| 2021/0188770 | A1* | 6/2021 | Fujiwara | C07C 69/76 |
| 2021/0232048 | A1 | 7/2021 | Hatakeyama et al. | |
| 2022/0004101 | A1* | 1/2022 | Hatakeyama | G03F 7/325 |

FOREIGN PATENT DOCUMENTS

| | | | |
|---|---|---|---|
| KR | 10-2019-0035543 | A | 4/2019 |
| TW | 201136957 | A | 11/2011 |
| TW | 202132915 | A | 9/2021 |
| WO | 2019/130866 | A1 | 7/2019 |

OTHER PUBLICATIONS

Office Action dated Aug. 27, 2024, issued in counterpart KR Application No. 10-2023-0102003, with English translation (15 pages).

Hutchinson, "The Shot Noise Impact on Resist Roughness in EUV Lithography", SPIE, 1998, vol. 3331, pp. 531-536, (7 pages).

Goldfarb et al., "Acid generation efficiency. EUV photons versus photoelectrons", SPIE, 2016, vol. 9779 pp. 97790A-1-97790A-13, (13 pages).

* cited by examiner

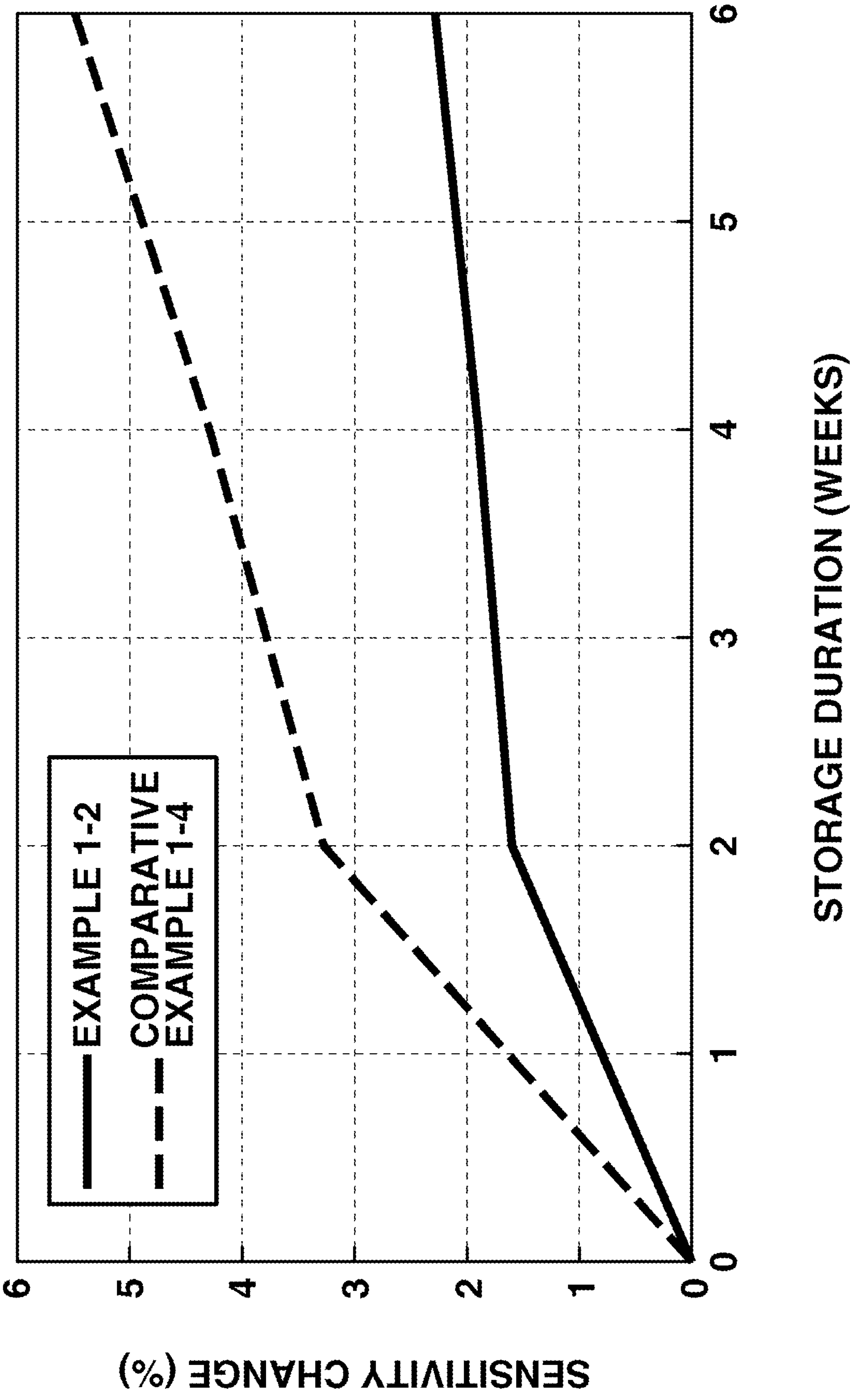
SENSITIVITY CHANGE (%)
0
1
2
3
4
5
6
STORAGE DURATION (WEEKS)
EXAMPLE 1-2
COMPARATIVE
EXAMPLE 1-4

RESIST COMPOSITION AND PATTERN FORMING PROCESS

CROSS-REFERENCE TO RELATED APPLICATIONS

This non-provisional application claims priority under 35 U.S.C. § 119(a) on Patent Application No. 2022-126073 filed in Japan on Aug. 8, 2022, the entire contents of which are hereby incorporated by reference.

TECHNICAL FIELD

This invention relates to a resist composition and a patterning process using the composition.

BACKGROUND ART

To meet the demand for higher integration density and operating speed of LSIs, the effort to reduce the pattern rule is in rapid progress. As the use of 5G high-speed communications and artificial intelligence (AI) is widely spreading, high-performance devices are needed for their processing. As the advanced miniaturization technology, manufacturing of microelectronic devices at the 5-nm node by the lithography using EUV of wavelength 13.5 nm has been implemented in a mass scale. Studies are made on the application of EUV lithography to 3-nm node devices of the next generation and 2-nm node devices of the next-but-one generation.

In the lithography using a DUV energy source, that is, KrF or ArF excimer laser, a chemically amplified resist composition comprising a base polymer and a photosensitive compound or photoacid generator is used. Upon exposure, the photoacid generator generates an acid, the base polymer undergoes such reaction under the catalysis of the generated acid that the resist composition may change its dissolution in a developer, achieving a high sensitivity and high resolution. The chemically, amplified resist composition plays a predominant role in the actual manufacturing process and drives the miniaturization technology forward.

In the lithography of the next generation, typically EUV lithography, studies are continuously made on the chemically amplified resist compositions, which now reach the commercially acceptable level. To meet the miniaturization demand, resist performance improvements are required more and more. In particular, a variation of resist pattern size, for example, line width roughness (LWR) affects a variation of pattern size after substrate processing, and finally the operating stability of a device. It is thus required to minimize the variation of resist pattern size. It is also required that the resist composition have a satisfactory storage stability.

The EUV energy source on current use has a low power and a high level of energy due to a short wavelength. Thus the number of photons involved upon light exposure is very small. The amount of the photoacid generator responding to EUV exposure is smaller than that of the photoacid generator responding to DUV. As a result, the distribution of acid in a resist film is non-uniform. It is known from Non-Patent Document 1 that such photon shot noise causes LWR performance to be degraded.

For overcoming the problem of shot noise, it is effective to increase the acid generation efficiency of a photoacid generator and enhance the sensitivity of a resist. A photoacid generator of iodonium salt type consisting of au iodonium cation and a counter anion is blown as a material having a high acid generation efficiency because its electron acceptance is high in addition to the high EUV absorption efficiency (see Non-Patent Document 2).

While the photoacid generators of iodonium salt type have the above-mentioned advantages, they suffer the problem of poor storage stability. For example, Patent Documents 1 and 2 describe attempts to improve storage stability by tailoring the molecular structure of iodonium salts.

CITATION LIST

Patent Document 1: WO 2019/130866
Patent Document 2: JP-A 2010-175893
Non-Patent Document 1: SPIE Vol. 3331 p 531 (1998)
Non-Patent Document 2: SPIE Vol. 9779 97790A (2016)

SUMMARY OF THE INVENTION

It is desired to have a chemically amplified resist composition adapted for EUV lithography having a high sensitivity and improved LWR performance. Photosensitive compounds having an iodonium cation suffer from poor storage stability despite a high sensitivity. The methods for improving storage stability by tailoring the molecular structure as in Patent Documents 1 and 2 pose some restrictions to the molecular design and have the risk of reducing electron acceptance or solvent solubility.

An object of the invention is to provide a resist composition comprising a photosensitive compound containing an iodonium cation, having a high sensitivity, reduced edge roughness or size variation, improved resolution and satisfactory storage stability, and a pattern forming process using the same.

The inventors have found that the problems of sensitivity and storage stability are overcome by adding an acid compound of specific structure to a resist composition comprising a photosensitive compound having an iodonium cation structure.

In one aspect, the invention provides a resist composition comprising (I) an acid compound having the formula (A):

(A)

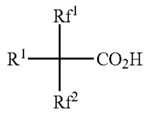

wherein $R^1$ is fluorine, hydroxy or a $C_1$-$C_{20}$ hydrocarbyl group which may contain a heteroatom, $Rf^1$ and $Rf^2$ are each independently fluorine or trifluoromethyl, (II) an acid generator having the formula (1):

$$Ar^1—I^+—Ar^2 \quad (Xa^{n-})_{1/n} \tag{1}$$

wherein $Ar^1$ and $Ar^2$ are each independently a $C_6$-$C_{18}$ aryl group which may contain a heteroatom, $Xa^{n-}$ is an n-valent anion of strong acid, and n is an integer of at least 1 and/or (III) a photo-decomposable quencher having the formula (2):

$$Ar^3—I^+—Ar^4 \quad (Xq^{m-})_{1/m} \tag{2}$$

wherein $Ar^3$ and $Ar^4$ are each independently a $C_6$-$C_{18}$ group which may contain a heteroatom, $Xq^{m-}$ is an m-valent anion of weak acid, and in is an integer of at least 1, and (IV) a base polymer adapted to change its dissolution rate in a developer under the action of an acid.

In another aspect, the invention provides a resist composition comprising (I) an acid compound having the formula (A):

(A)

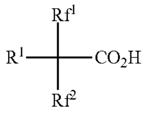

wherein $R^1$ is fluorine, hydroxy or a $C_1$-$C_{20}$ hydrocarbyl group which may contain a heteroatom, $Rf^1$ and $Rf^2$ are each independently fluorine or trifluoromethyl, and (IV') a base polymer adapted to change its dissolution rate in a developer tinder the action of an acid and comprising repeat units having the formula (b1):

(b1)

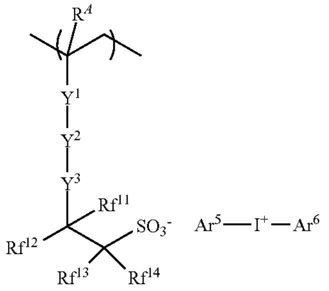

wherein $R^A$ is hydrogen or methyl, $Y^1$ is a single bond or ester bond, $Y^2$ is a single bond or a $C_1$-$C_{20}$ hydrocarbylene group which may contain at least one moiety selected from an ester bond, ether bond, lactone ring, amide bond, sultone ring and iodine, $Y^3$ is a single bond, ether bond or ester bond, $Rf^{11}$ to $Rf^{14}$ are each independently hydrogen, fluorine or trifluoromethyl, at least one thereof being fluorine or trifluoromethyl, and $Ar^5$ and $Ar^6$ are each independently a $C_6$-$C_{18}$ aryl group which may contain a heteroatom.

In one preferred embodiment, the resist composition further comprises (III) a photo-decomposable quencher having the formula (2):

$$Ar^3—I^+—Ar^4 \quad (Xq^{m-})_{1/m} \tag{2}$$

wherein $Ar^3$ and $Ar^4$ are each independently a $C_6$-$C_{18}$ aryl group which may contain a heteroatom, $Xq^{m-}$ is an m-valent anion of weak acid, and m is an integer of at least 1.

In another preferred embodiment, the acid compound having formula (A) has any one of the formulae (A-1) to (A-3):

(A-1)

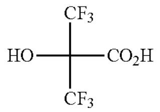

(A-2)

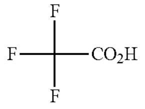

(A-3)

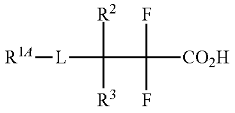

wherein $R^{1A}$ is hydrogen or a $C_1$-$C_{20}$ hydrocarbyl group which may contain a heteroatom, $R^2$ and $R^3$ are each independently hydrogen or a $C_1$-$C_{20}$ hydrocarbyl group, $R^2$ and $R^3$ may bond together to form a ring with the carbon atom to which they are attached, and L is a single bond, ether bond or ester bond.

In a preferred embodiment, the base polymer comprises repeat units having the formula (a):

(a)

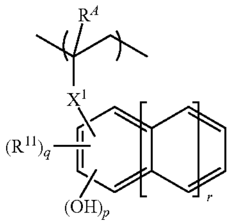

wherein $R^A$ is hydrogen or methyl, $X^1$ is a single bond, ester bond, amide bond, or a $C_1$-$C_{12}$ divalent linking group containing at least one moiety selected from phenylene, naphthylene, ester bond, ether bond, lactone ring, and amide bond, $R^{11}$ is hydrogen, fluorine, or a $C_1$-$C_6$ saturated hydrocarbyl group, $R^{11}$ and $X^1$ may bond together to form a ring with the carbon atoms on the aromatic ring to which they are attached, p is 1 or 2, q is an integer of 0 to 4, p+q is from 1 to 5, and r is 0 or 1.

In a preferred embodiment, the base polymer comprises repeat units having a structural site which is decomposed to generate an acid upon exposure to actinic ray or radiation.

The repeat units having a structural site which is decomposed to generate an acid upon exposure to actinic ray or radiation preferably have the formula (b2):

(b2)

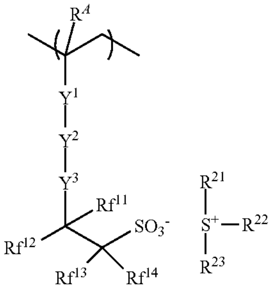

wherein $R^A$ is hydrogen or methyl, $Y^1$ is a single bond or ester bond, $Y^2$ is a single bond or a $C_1$-$C_{20}$ hydrocarbylene group which may contain at least one moiety selected from an ester bond, ether bond, lactone ring, amide bond, sultone ring and iodine, $Y^3$ is a single bond, ether bond or ester bond, $Rf^{11}$ to $Rf^{14}$ are each independently hydrogen, fluorine or trifluoromethyl, at least one thereof being fluorine or trifluoromethyl, $R^{21}$ to $R^{23}$ are each independently a $C_1$-$C_{20}$ hydrocarbyl group which may contain a heteroatom, $R^{21}$ and $R^{22}$ may bond together to form a ring with the sulfur atom to which they are attached.

The base polymer may further comprise repeat units (c) having a carboxy group whose hydrogen is substituted by an acid labile group.

The repeat units (c) preferably have the formula (c):

(c)

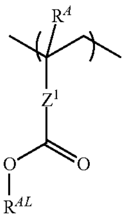

wherein $R^A$ is hydrogen or methyl, $Z^1$ is a single bond, phenylene group, naphthylene group, or a $C_1$-$C_{12}$ linking group containing at least one moiety selected from an ester bond, ether bond and lactone ring, and $R^{AL}$ is an acid labile group.

In another embodiment, the base polymer is free of repeat units substituted with an acid labile group. In this case, the resist composition may further comprise a crosslinker.

In a further aspect, the invention provides a pattern forming process comprising the steps of (i) applying the resist composition defined herein onto a substrate to form a resist film thereon, (ii) exposing the resist film to high-energy radiation, and (iii) developing the exposed resist film in a developer.

Advantageous Effects of Invention

The resist composition comprising an iodonium salt type photosensitive compound and a specific acid compound wherein the acid compound restrains the decomposition of the photosensitive compound has a high sensitivity, reduced edge roughness or size variation, improved resolution, and satisfactory storage stability. By virtue of these advantages, the composition is fully useful in commercial application and suited as a small-size pattern-forming material for the fabrication of VLSIs, micropatterning material for the fabrication of photomasks by EB writing, and a pattern-forming material adapted for EB or EUV lithography. The resist composition may be used not only in the lithography for forming semiconductor circuits, but also in the formation of mask circuit patterns, micromachines, and thin-film magnetic head circuits.

BRIEF DESCRIPTION OF THE DRAWINGS

The only FIGURE, FIG. 1 graphically illustrates how the sensitivity change shifts as the storage duration is prolonged in Example 2-2 and Comparative Example 2-4.

DETAILED DESCRIPTION OF THE INVENTION

As used herein, the singular forms "a," "an" and "the" include plural referents unless the context clearly dictates otherwise. "Optional" or "optionally" means that the subsequently described event or circumstances may or may not occur, and that description includes instances where the event or circumstance occurs and instances where it does not. The notation (Cn-Cm) means a group containing from n to m carbon atoms per group. In chemical formulae, Me stands for methyl, Ac stands for acetyl, the broken line designates a valence bond. As used herein, the term "fluorinated" refers to a fluorine-substituted or fluorine-containing compound or group. The terms "group" and "moiety" are interchangeable.

The abbreviations and acronyms have the following meaning.

EB: electron beam
EUV: extreme ultraviolet
Mw: weight average molecular weight
Mn: number average molecular weight
Mw/Mn: molecular weight distribution or dispersity
GPC: gel permeation chromatography
PEB: post-exposure bake
PAG: photoacid generator
LWR: line width roughness
CDU: critical dimension uniformity Resist Composition One embodiment of the invention is a resist composition comprising (I) a specific acid compound, (II) an acid generator of iodonium salt type and/or (III) a photo-decomposable quencher of iodonium salt type, and (IV) a base polymer adapted to change its dissolution rate in a developer under the action of an acid. Another embodiment is a resist composition comprising (I) a specific acid compound and (IV') a base polymer comprising acid-generating units of iodonium salt type and adapted to change its dissolution rate in a developer under the action of an acid. Since the iodonium salt is an unstable compound as described above, it gradually decomposes during storage of a resist solution, inviting a change of resist sensitivity and aggravation of lithography performance. One of the mechanisms estimated for the decomposition of the iodonium salt during storage is reaction of the iodonium cation with nucleophilic components in the resist solution. As used herein, the nucleophilic components include hydroxide ions, carboxylate ions, amines and the like, and correspond to a polymer, quencher, solvent and other components indispensable for the resist composition.

Since the iodonium salt has a high absorption efficiency of EUV radiation and a high electron acceptability, a resist material having a higher sensitivity can be designed. On the other hand, since the iodonium salt is unstable, an iodonium salt-containing system which can be handled in a stable manner is limited.

Studying a variety of additives for restraining the decomposition of the iodonium salt, the inventors have found that a specific acid compound is effective for the purpose. The specific acid compound is a Bronsted acid which is dissociated in a resist solution to release protons. When the acid is added, protons are donated to the nucleophilic components to weaken their nucleophilicity. As a result, the decomposition reaction of the iodonium salt is restrained. Further continuing studies reveal that fluorocarboxylic acid having fluorine or trifluoromethyl group at α-position of carboxy group is an optimum additive for improving storage stability. While a strong acid such as sulfonic acid or fluorosulfonic acid is effective for restraining decomposition of the iodonium salt, the reaction of a polymer adapted to change its dissolution rate under the action of acid proceeds. An acid as weak as fluorine-free carboxylic acid is insufficient to restrain decomposition of the iodonium salt.

The optimum acid compound is a carboxylic acid having fluorine or trifluoromethyl group at α-position. An acid which is stronger than the carboxylic acid can incur alteration of the base polymer. On the other hand, fluorine-free carboxylic acid is insufficient in the effect of restraining decomposition of the iodonium salt.

(I) Acid Compound

Component (I) is an acid compound having the formula (A).

(A)

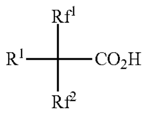

In formula (A), $R^1$ is fluorine, hydroxy or a $C_1$-$C_{20}$ hydrocarbyl group which may contain a heteroatom. $Rf^1$ and $Rf^2$ are each independently fluorine or trifluoromethyl. The hydrocarbyl group represented by $R^1$ may be saturated or unsaturated and straight, branched or cyclic. In the hydrocarbyl group, some or all of the hydrogen atoms may be substituted by a moiety containing a heteroatom such as oxygen, sulfur, nitrogen or halogen, and some constituent —$CH_2$— may be replaced by a moiety containing a heteroatom such as oxygen, sulfur or nitrogen, so that the group may contain hydroxy, fluorine, chlorine, bromine, iodine, cyano, nitro, mercapto, carbonyl, ether bond, ester bond, sulfonic ester bond, carbonate bond, lactone ring, sultone ring, carboxylic anhydride (—C(=O)—O—C(=O)—), or haloalkyl moiety.

Preferably the acid compound has any one of the formulae (A-1) to (A-3).

(A-1)

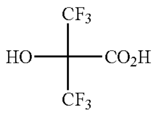

(A-2)

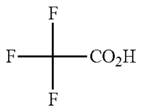

-continued (A-3)

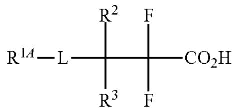

In formula (A-3), $R^{1A}$ is hydrogen or a $C_1$-$C_{20}$ hydrocarbyl group which may contain a heteroatom. The $C_1$-$C_{20}$ hydrocarbyl group may be saturated or unsaturated and straight, branched or cyclic. Examples thereof include $C_1$-$C_{20}$ alkyl groups such as methyl, ethyl, n-propyl, isopropyl, n-butyl, isobutyl, sec-butyl, tert-butyl, n-pentyl, n-hexyl, n-octyl, n-nonyl, n-decyl, undecyl, dodecyl, tridecyl, tetradecyl, pentadecyl, heptadecyl, octadecyl, nonadecyl, icosyl; $C_3$-$C_{20}$ cyclic saturated hydrocarbyl groups such as cyclopropyl, cyclopentyl, cyclohexyl, cyclopropylmethyl, 4-methylcyclohexyl, cyclohexylmethyl, norbornyl, adamantyl; $C_2$-$C_{20}$ alkenyl groups such as vinyl, propenyl, butenyl, hexenyl; $C_2$-$C_{20}$ alkynyl groups such as ethynyl, propynyl, butynyl; $C_3$-$C_{20}$ cyclic unsaturated aliphatic hydrocarbyl groups such as cyclohexenyl, norbornenyl; $C_6$-$C_{20}$ aryl groups such as phenyl, methylphenyl, ethylphenyl, n-propylphenyl, isopropylphenyl, n-butylphenyl, isobutylphenyl, sec-butylphenyl, tert-butylphenyl, naphthyl, methylnaphthyl, ethylnaphthyl, n-propylnaphthyl, isopropylnaphthyl, n-butylnaphthyl, isobutylnaphthyl, sec-butylnaphthyl, tert-butylnaphthyl; $C_7$-$C_{20}$ aralkyl groups such as benzyl and phenethyl; and combinations thereof. In the hydrocarbyl group, some or all of the hydrogen atoms may be substituted by a moiety containing a heteroatom such as oxygen, sulfur, nitrogen or halogen, and some constituent —$CH_2$— may be replaced by a moiety containing a heteroatom such as oxygen, sulfur or nitrogen, so that the group may contain a hydroxy, fluorine, chlorine, bromine, iodine, cyano, nitro, mercapto, carbonyl, ether bond, ester bond, sulfonic ester bond, carbonate bond, lactone ring, sultone ring, carboxylic anhydride (—C(=O)—O—C(=O)—), or haloalkyl moiety.

In formula (A-3), $R^2$ and $R^3$ are each independently hydrogen or a $C_1$-$C_{20}$ hydrocarbyl group. The $C_1$-$C_{20}$ hydrocarbyl group may be saturated or unsaturated and straight, branched or cyclic, and examples thereof are as exemplified above for the $C_1$-$C_{20}$ hydrocarbyl group $R^{1A}$. $R^2$ and $R^3$ may bond together to form a ring with the carbon atom to which they are attached, preferably a $C_3$-$C_{12}$ aliphatic ring.

In formula (A-3), L is a single bond, ether bond or ester bond.

Examples of the acid compound are shown below, but not limited thereto.

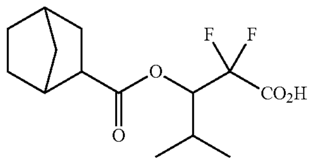

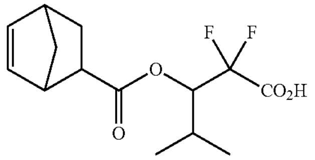

-continued
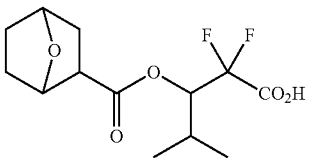
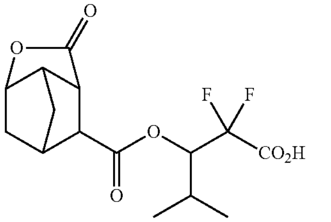
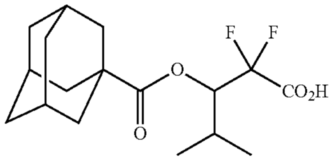
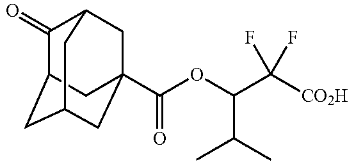
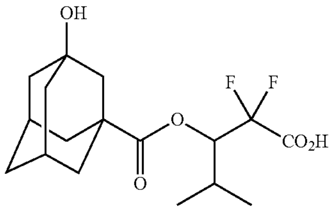
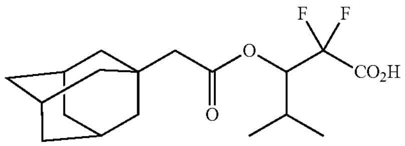
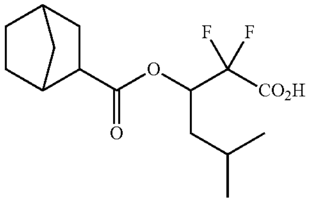
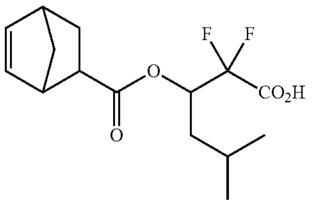
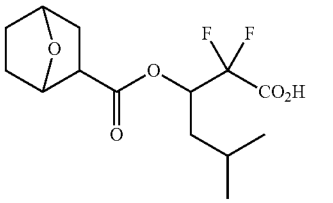
-continued
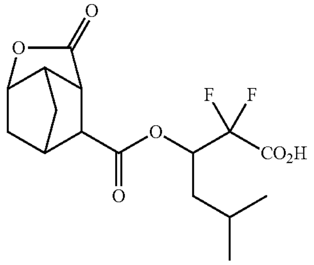
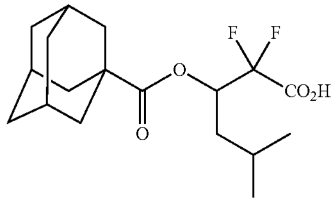
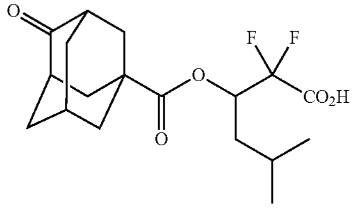
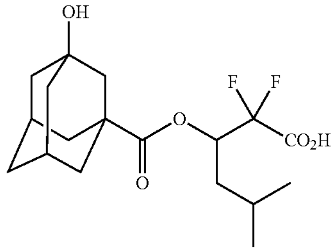
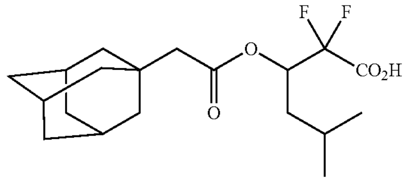
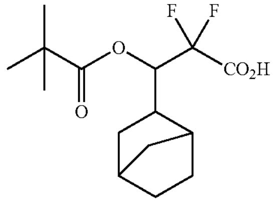
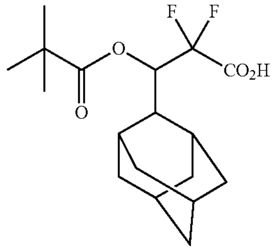
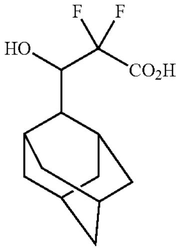
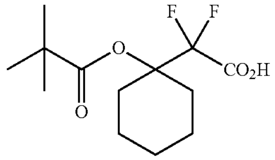

-continued
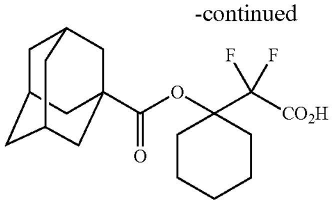
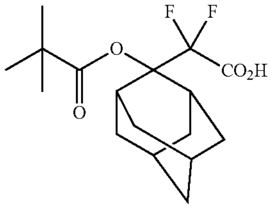
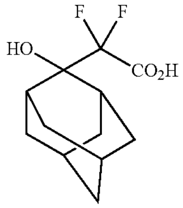
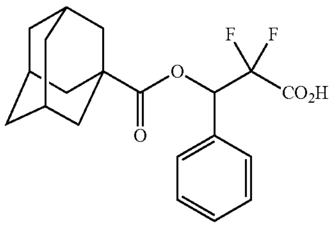
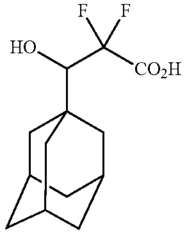
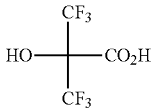
$CF_3CO_2H$
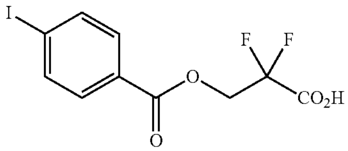
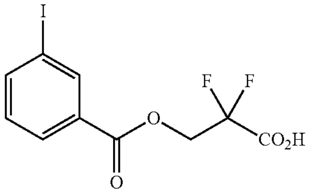
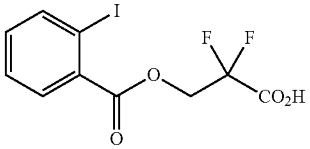
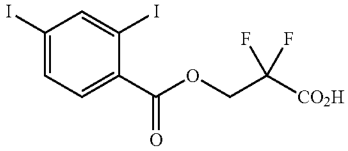
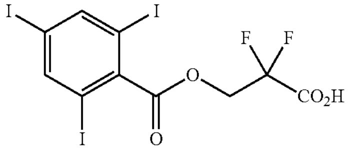
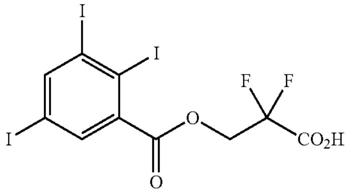
-continued
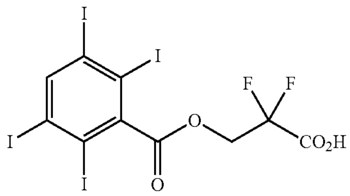
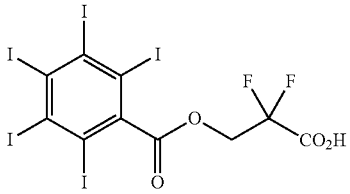
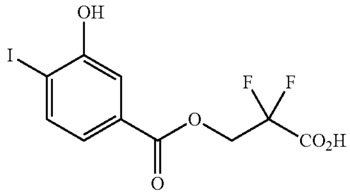
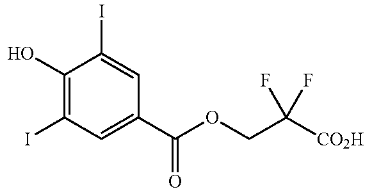
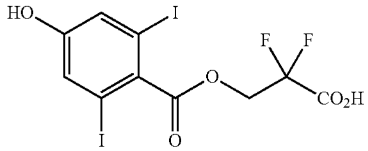
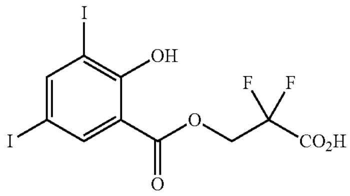
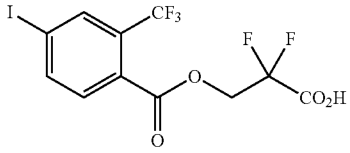
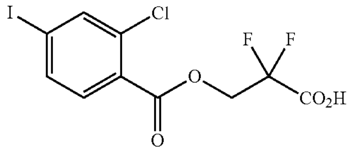
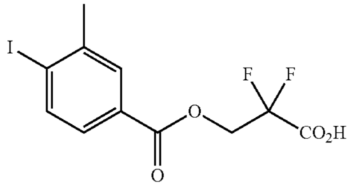

-continued

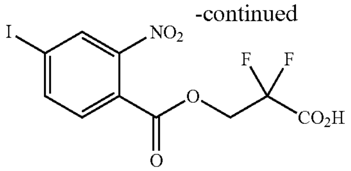

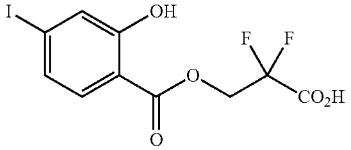

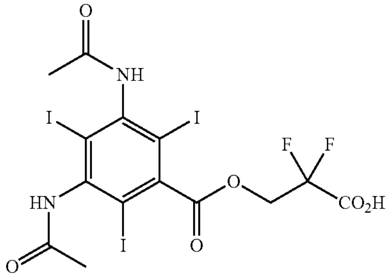

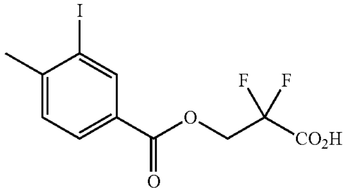

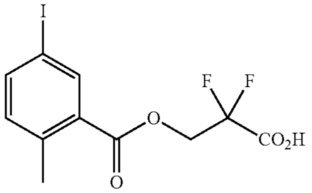

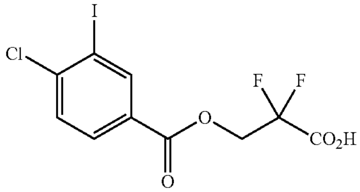

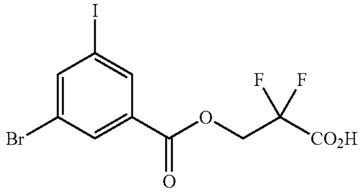

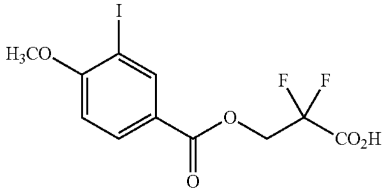

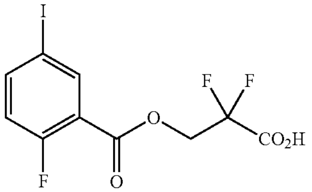

-continued

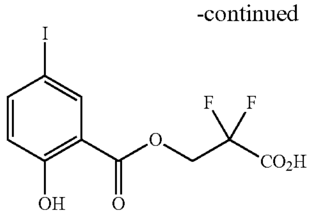

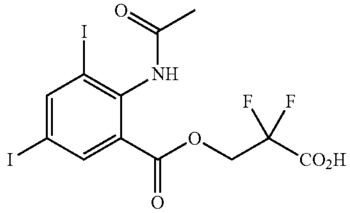

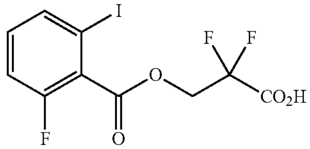

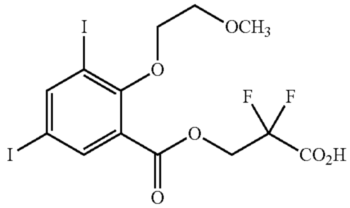

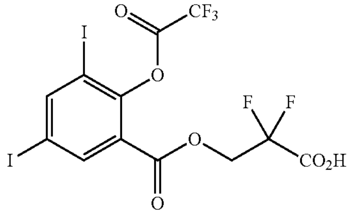

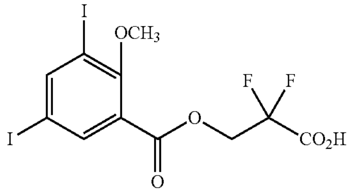

In the resist composition, the acid compound as component (I) is preferably present in an amount of 0.1 to 20 parts by weight, more preferably 0.5 to 10 parts by weight per 80 parts by weight of the base polymer as component (IV) to be described later. The acid compound may be used alone or in admixture of two or more.

(II) Photoacid Generator

Component (II) is a photoacid generator which is decomposed to generate a strong acid upon light exposure. The acid acts on the base polymer as component (IV) to change the dissolution rate of a resist film in developer. The PAG is an iodonium salt consisting of an anion of a strong acid such as fluorosulfonic acid or methide acid (methidic acid) and an iodonium cation. The PAG of iodonium salt type has a high absorption efficiency of EUV radiation and a high electron acceptability and hence, a high acid generating efficiency.

The PAG has the formula (1).

$$Ar^1—I^+—Ar^2 \quad (Xa^{n-})_{1/n} \qquad (1)$$

In formula (1), $Ar^1$ and $Ar^2$ are each independently a $C_6$-$C_{18}$ aryl group which may contain a heteroatom. Examples of the aryl group include phenyl, methylphenyl, ethylphenyl, n-propylphenyl, isopropylphenyl, n-butylphenyl, isobutylphenyl, sec-butylphenyl, tert-butylphenyl, cyclohexylphenyl, naphthyl, methylnaphthyl, ethylnaphthyl, n-propylnaphthyl, isopropylnaphthyl, n-butylnaphthyl, isobutylnaphthyl, sec-butylnaphthyl, tert-butylnaphthyl, and cyclohexylnaphthyl. In the aryl group, some or all of the hydrogen atoms may be substituted by a moiety containing a heteroatom such as oxygen, sulfur, nitrogen or halogen, and some constituent $—CH_2—$ may be replaced by a moiety containing a heteroatom such as oxygen, sulfur or nitrogen, so that the group may contain a hydroxy, fluorine, chlorine, bromine, iodine, cyano, carbonyl, ether bond, ester bond, sulfonic ester bond, carbonate bond, lactone ring, sultone ring, carboxylic anhydride (—C(═O)—O—C(═O)—), or haloalkyl moiety.

Examples of the cation of the PAG are shown below, but not limited thereto.

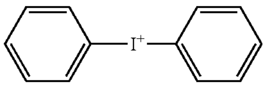
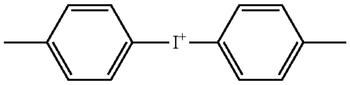
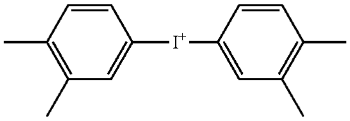
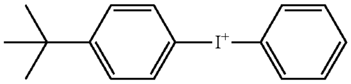
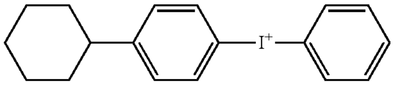
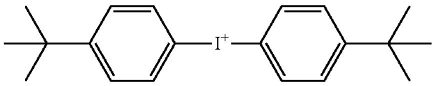
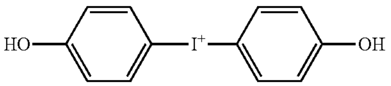
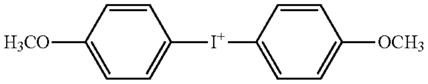
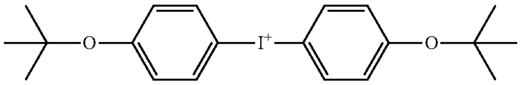
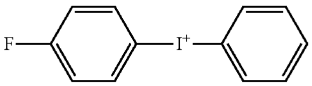
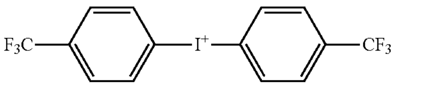

-continued

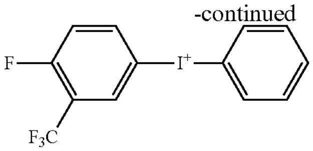
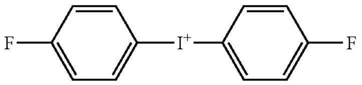
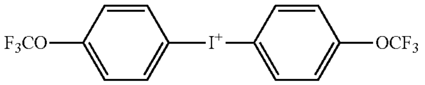
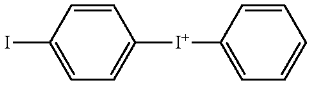

In formula (1), $Xa^{n-}$ is an n-valent anion of strong acid, and n is an integer of at least 1, preferably an integer of 1 to 3, more preferably 1 or 2, most preferably 1.

The anion of strong acid is preferably selected from those anions having the formulae (1a) to (1d).

$$R^{fa}—CF_2—SO_3^- \qquad (1a)$$

(1b)

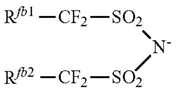

(1c)

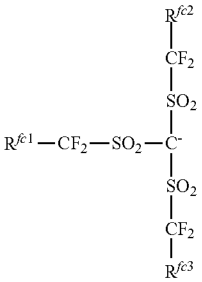

(1d)

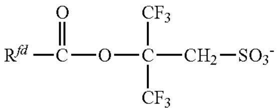

In formula (1a), $R^{fa}$ is fluorine or a $C_1$-$C_{40}$ hydrocarbyl group which may contain a heteroatom. The hydrocarbyl group may be saturated or unsaturated and straight, branched or cyclic. Examples thereof are as will be exemplified later for the hydrocarbyl group represented by $R^{111}$ in formula (1a').

The preferred anion of formula (1a) has the formula (1a').

(1a')

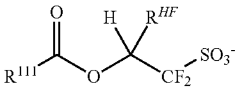

In formula (1a'), $R^{HF}$ is hydrogen or trifluoromethyl, preferably trifluoromethyl. $R^{111}$ is a $C_1$-$C_{38}$ hydrocarbyl group which may contain a heteroatom. Suitable heteroatoms include oxygen, nitrogen, sulfur and halogen, with oxygen being preferred. Of the hydrocarbyl groups, those of 6 to 30 carbon atoms are preferred because a high resolution is available in fine pattern formation. The $C_1$-$C_{38}$ hydrocarbyl group $R^{111}$ may be saturated or unsaturated and straight, branched or cyclic. Suitable hydrocarbyl groups include $C_1$-$C_{38}$ alkyl groups such as methyl, ethyl, n-propyl, isopropyl, butyl, isobutyl, sec-butyl, tert-butyl, pentyl, neopentyl, hexyl, heptyl, 2-ethylhexyl, nonyl, undecyl, tridecyl, pentadecyl, heptadecyl, icosanyl; $C_3$-$C_{38}$ cyclic saturated hydrocarbyl groups such as cyclopentyl, cyclohexyl, 1-adamantyl, 2-adamantyl, 1-adamantylmethyl, norbornyl, norbornylmethyl, tricyclodecanyl, tetracyclododecanyl, tetracyclododecanylmethyl, dicyclohexylmethyl; $C_2$-$C_{38}$ unsaturated aliphatic hydrocarbyl groups such as allyl and 3-cyclohexenyl; $C_6$-$C_{38}$ aryl groups such as phenyl, 1-naphthyl, 2-naphthyl, $C_7$-$C_{38}$ aralkyl groups such as benzyl and diphenylmethyl; and combinations thereof.

In the hydrocarbyl group, some or all of the hydrogen atoms may be substituted by a moiety containing a heteroatom such as oxygen, sulfur, nitrogen or halogen, or some constituent $—CH_2—$ may be replaced by a moiety containing a heteroatom such as oxygen, sulfur or nitrogen, so that the group may contain a hydroxy, fluorine, chlorine, bromine, iodine, cyano, nitro, carbonyl, ether bond, ester bond, sulfonic acid ester bond, carbonate bond, lactone ring, sultone ring, carboxylic anhydride (—C(═O)—O—C(═O)—) or haloalkyl moiety. Examples of the heteroatom-containing hydrocarbyl group include tetrahydrofuryl, methoxymethyl, ethoxymethyl, methylthiomethyl, acetamidomethyl, trifluoroethyl, (2-methoxyethoxy)methyl, acetoxymethyl, 2-carboxy-1-cyclohexyl, 2-oxopropyl, 4-oxo-1-adamantyl, and 3-oxocyclohexyl.

In formula (1b), $R^{fb1}$ and $R^{fb2}$ are each independently fluorine or a $C_1$-$C_{40}$ hydrocarbyl group which may contain a heteroatom. The hydrocarbyl group may be saturated or unsaturated and straight, branched or cyclic. Examples thereof are as exemplified above for the hydrocarbyl group represented by $R^{111}$ in formula (1a'). Preferably $R^{fb1}$ and $R^{fb2}$ each are fluorine or a straight $C_1$-$C_4$ fluorinated alkyl group. A pair of $R^{fb1}$ and $R^{fb2}$ may bond together to form a ring with the linkage ($—CF_2—SO_2—N^-—SO_2—CF_2—$) to which they are attached, and the ring-forming pair is preferably a fluorinated ethylene or fluorinated propylene group.

In formula (1c), $R^{fc1}$, and $R^{fc2}$ and $R^{fc3}$ are each independently fluorine or a $C_1$-$C_{40}$ hydrocarbyl group which may contain a heteroatom. The hydrocarbyl group may be saturated or unsaturated and straight, branched or cyclic. Suitable hydrocarbyl groups are as exemplified above for $R^{111}$ in formula (1a'). Preferably $R^{fc1}$, $R^{fc2}$ and $R^{fc3}$ each are fluorine or a straight $C_1$-$C_4$ fluorinated alkyl group. A pair of $R^{fc1}$ and $R^{fc2}$ may bond together to form a ring with the linkage ($—CF_2—SO_2—C^-—SO_2—CF_2—$) to which they are attached, and the ring-forming pair is preferably a fluorinated ethylene or fluorinated propylene group.

In formula (1d), $R^{fd}$ is a $C_1$-$C_{40}$ hydrocarbyl group which may contain a heteroatom. The hydrocarbyl group may be saturated or unsaturated and straight, branched or cyclic. Suitable hydrocarbyl groups are as exemplified above for $R^{111}$.

Examples of the anion having formula (1d) are as exemplified for the anion having formula (1D) in US 20180335696 (JP-A 2018-197853).

The compound having the anion of formula (1d) has a sufficient acid strength to cleave acid labile groups in the base polymer because it is free of fluorine at α-position of sulfo group, but has two trifluoromethyl groups at β-position. Thus the compound is a useful PAG.

Examples of the anion of photoacid generator are shown below, but not limited thereto.

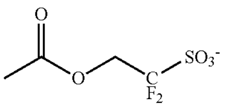
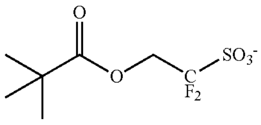
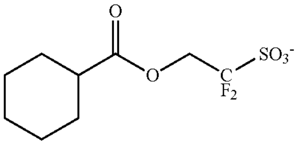
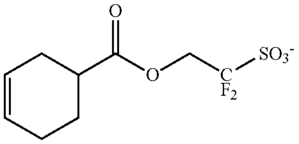
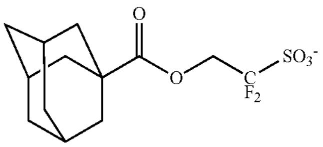
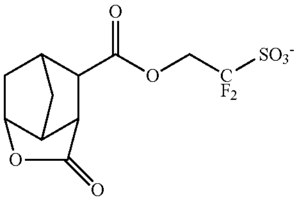
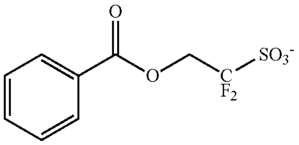
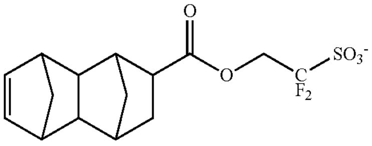
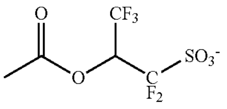
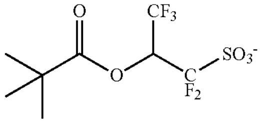
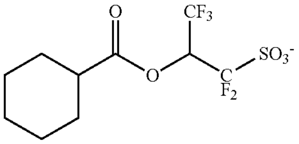
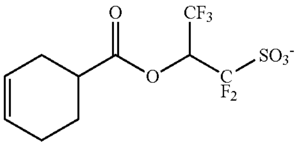
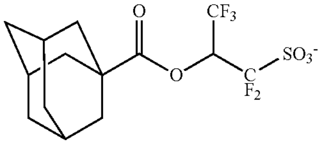

-continued
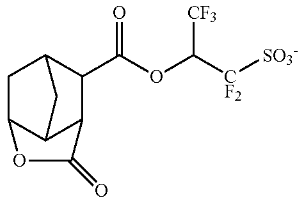
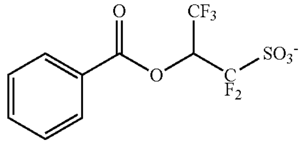
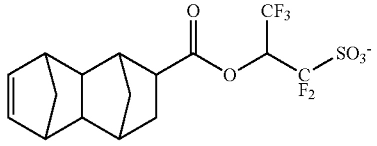
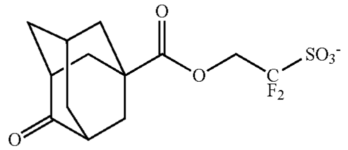
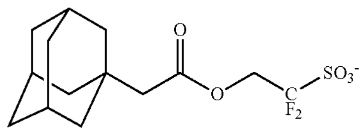
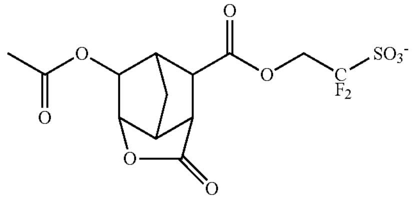
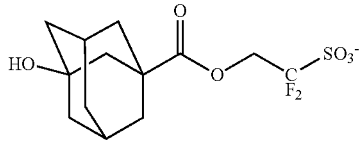
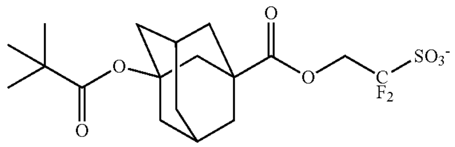
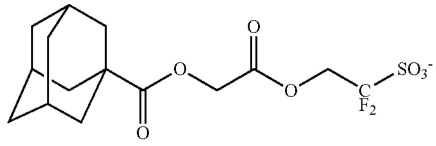
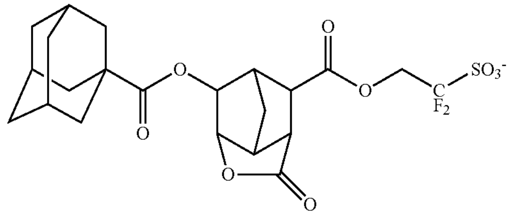
-continued
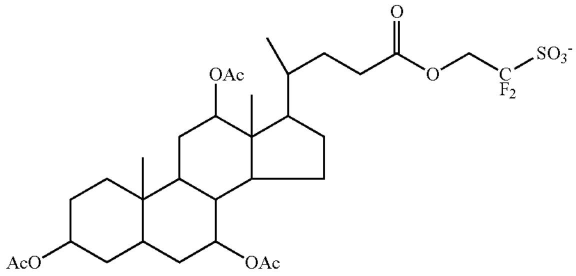
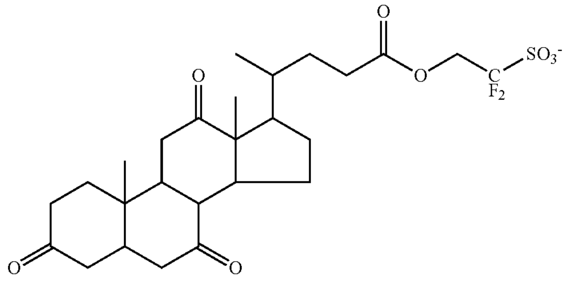
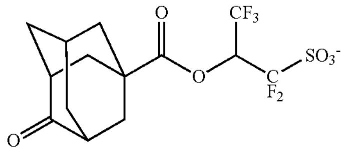
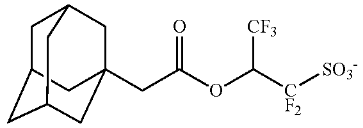
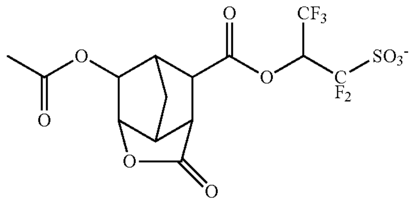
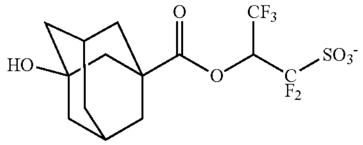
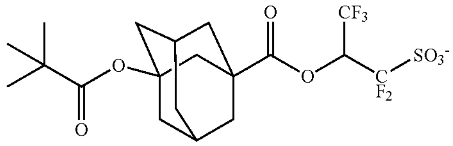
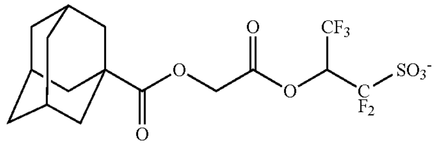
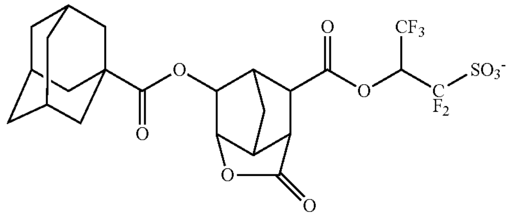

-continued
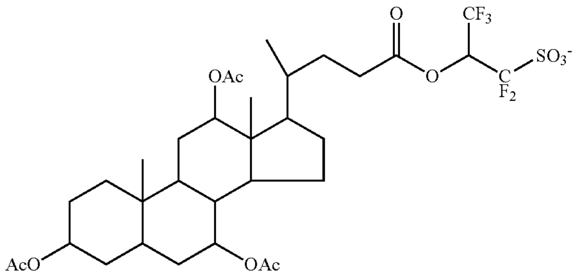
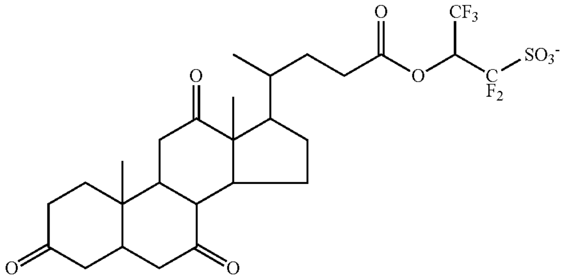
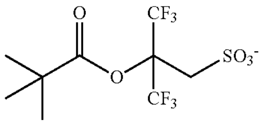
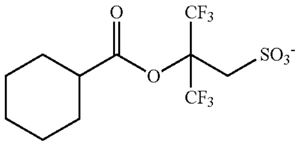
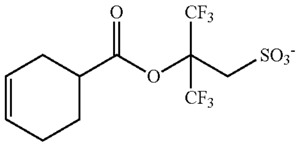
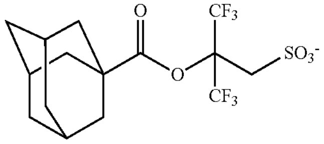
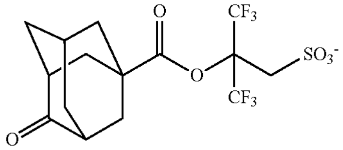
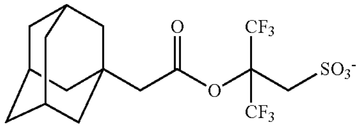
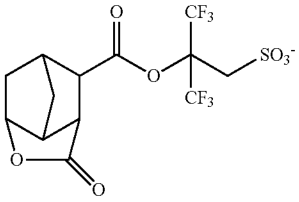
-continued
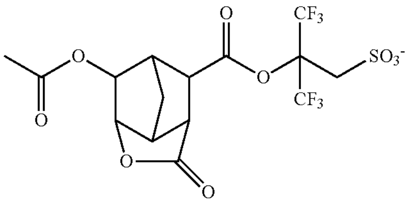
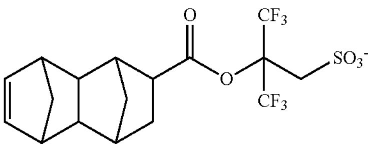
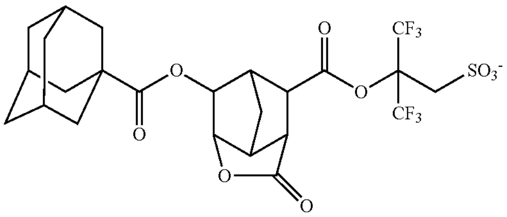
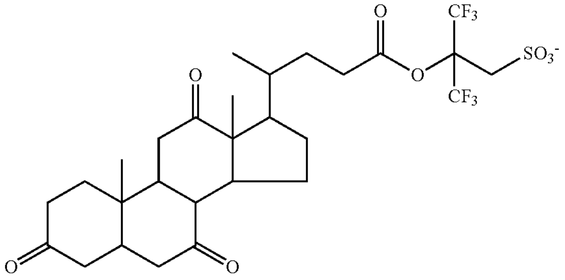
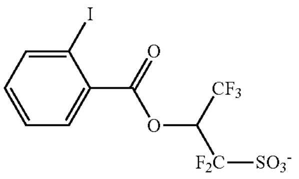
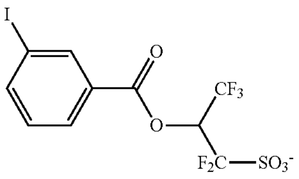
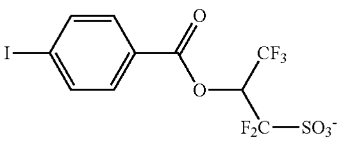
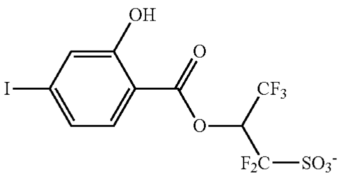
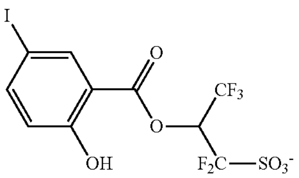

-continued
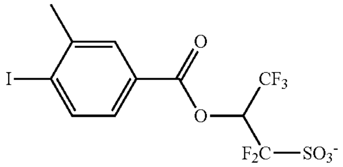
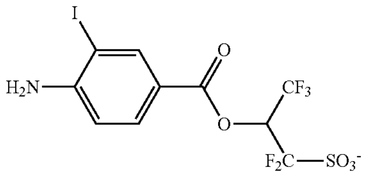
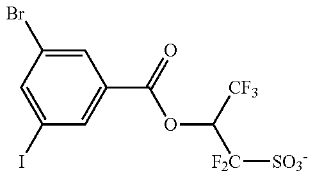
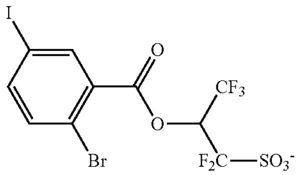
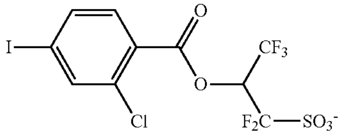
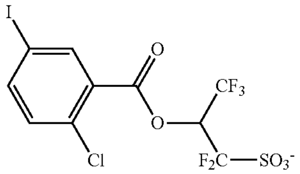
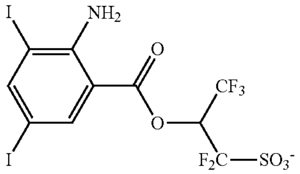
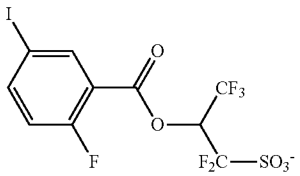
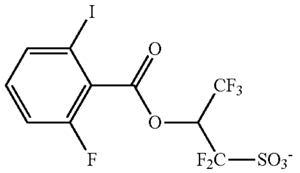
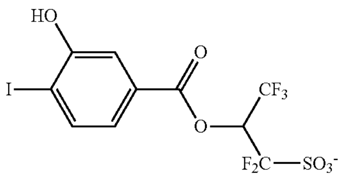
-continued
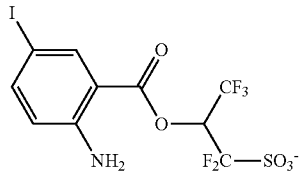
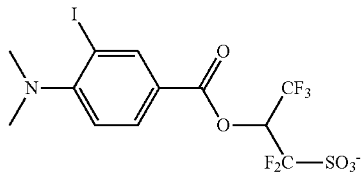
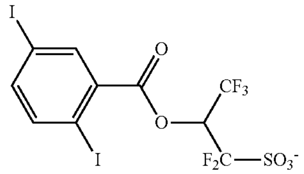
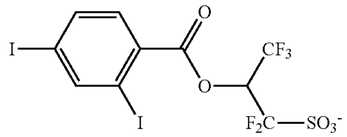
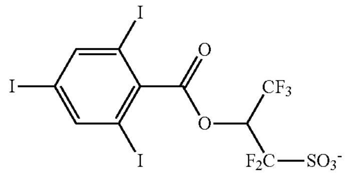
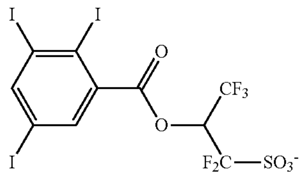
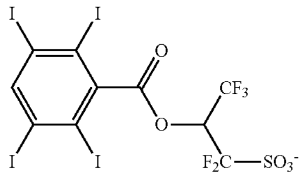
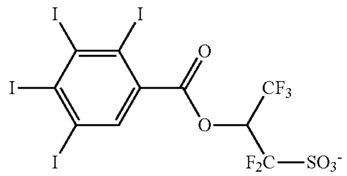
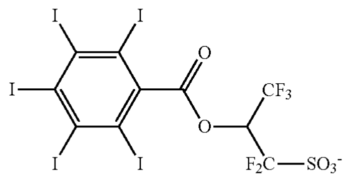

-continued
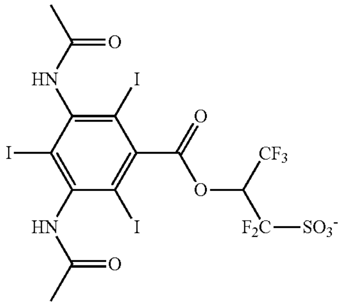
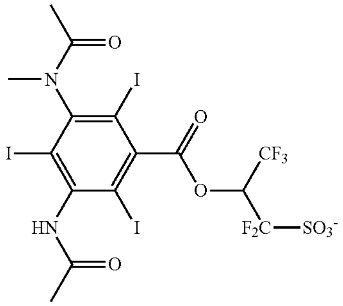
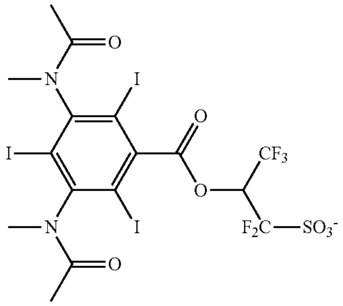
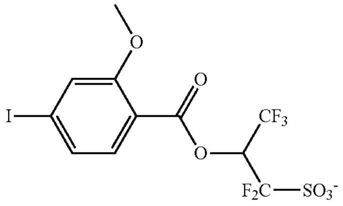
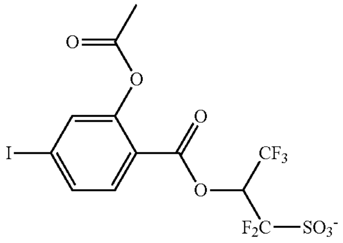
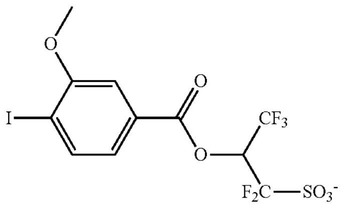
-continued
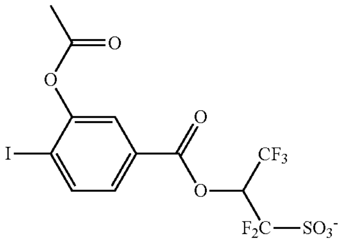
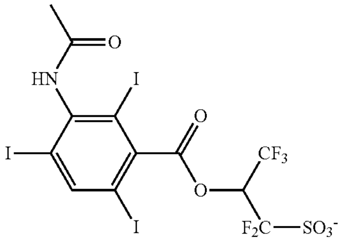
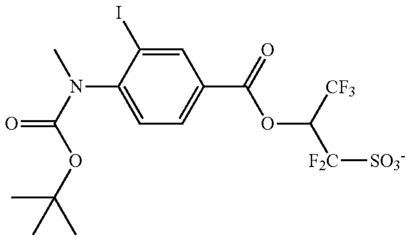
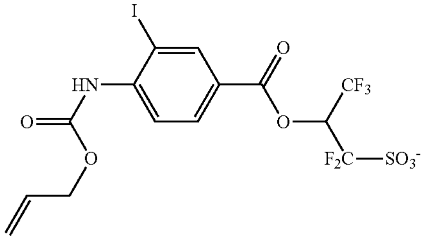
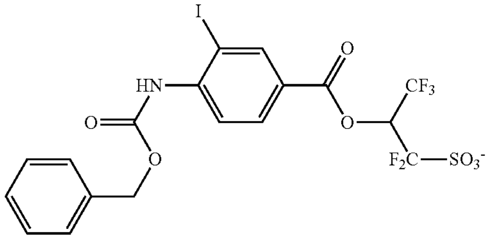
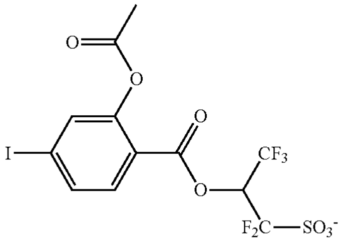
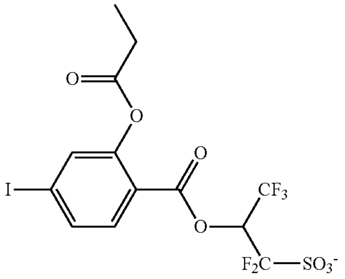

-continued
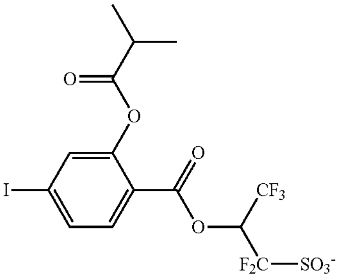
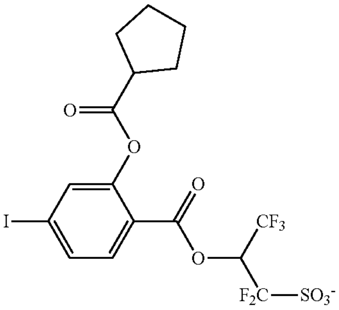
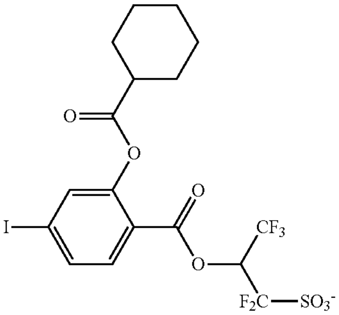
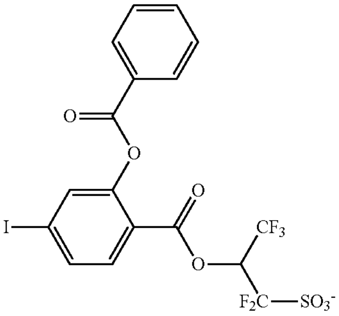
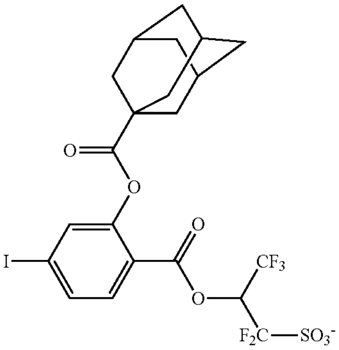
-continued
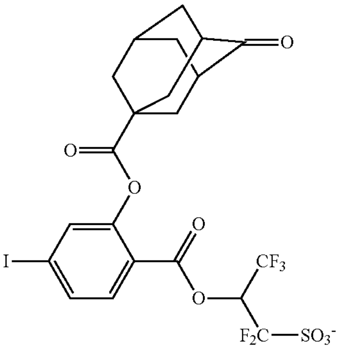
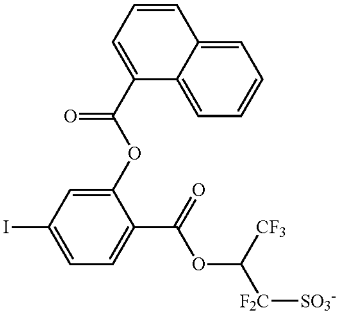
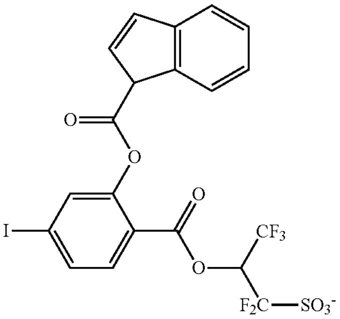
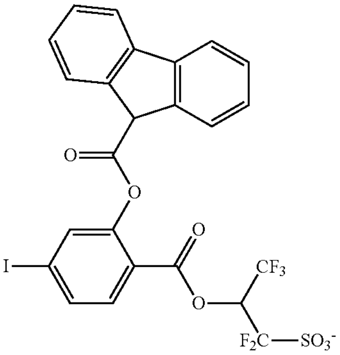
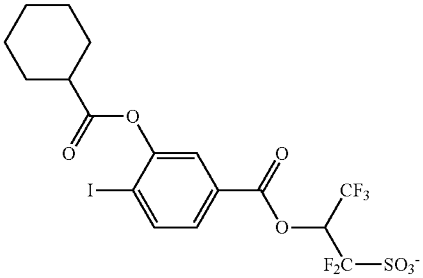

-continued
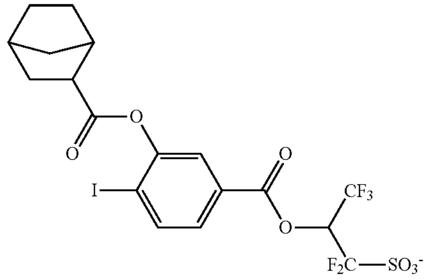
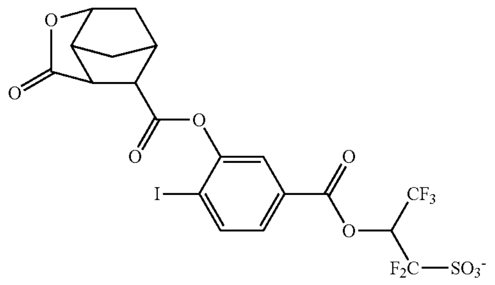
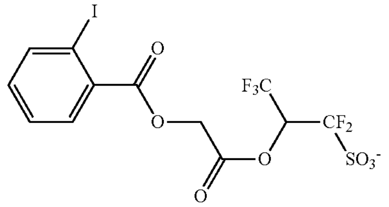
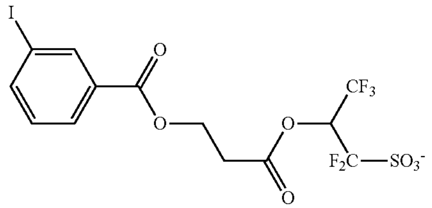
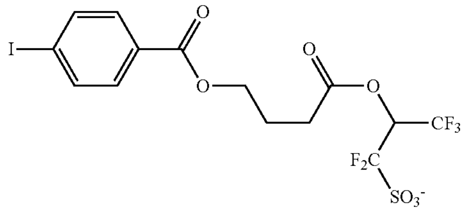
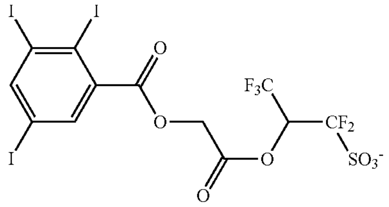
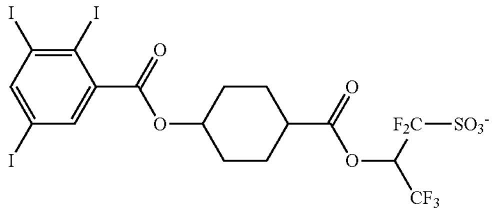
-continued
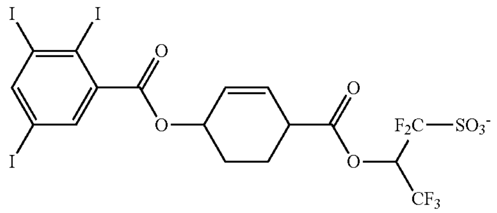
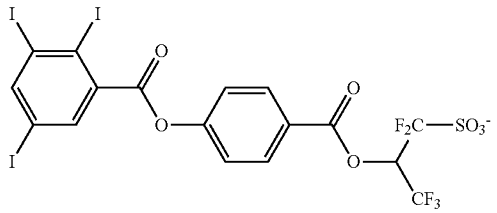
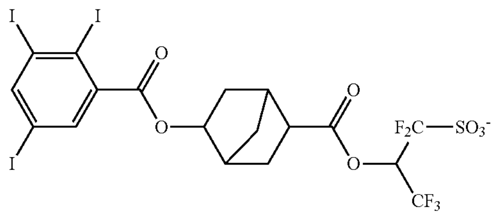
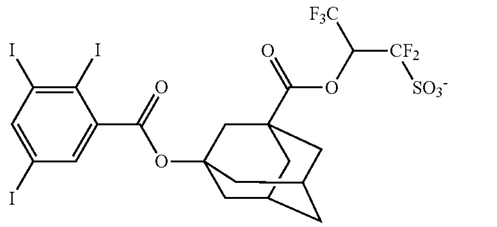
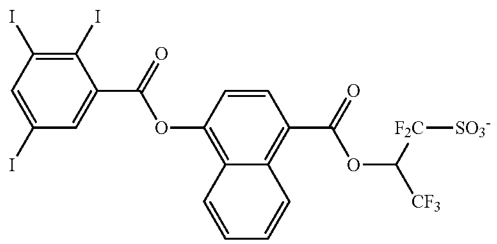
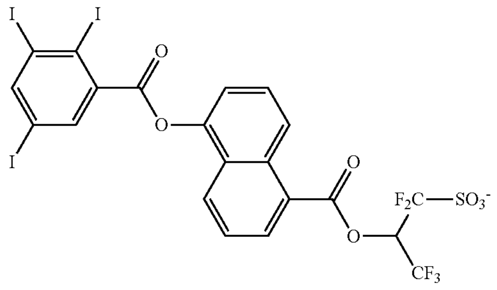
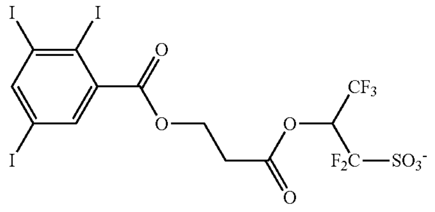

-continued

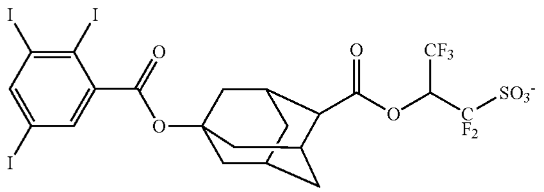

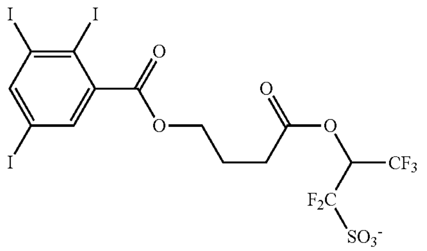

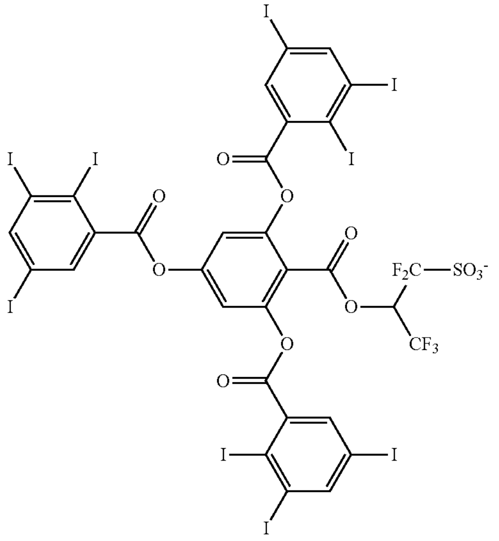

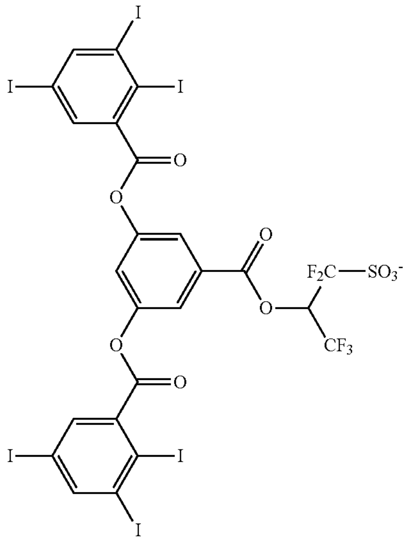

In the resist composition, the PAG as component (II) is preferably present in an amount of 1 to 40 parts by weight, more preferably 5 to 35 parts by weight per 80 parts by weight of the base polymer as component (IV) to be described later. The PAG may be used alone or in admixture of two or more.

(III) Photo-Decomposable Quencher

Component (III) is a photo-decomposable quencher. It is an iodonium salt capable of generating a weaker acid than the PAG as component (II). The anion of weak acid undergoes salt exchange with the strong acid generated upon light exposure, to form a weak acid and a strong acid-iodonium salt. The strong acid generated in the exposed region is converted to a weak acid in this way, for thereby preventing the base polymer from being altered by the acid. In the exposed region with a sufficient dose, the iodonium cation after the salt exchange is also decomposed to generate the strong acid. This changes the dissolution rate of the resist film in developer so that a pattern is formed.

The photo-decomposable quencher has the formula (2).

$$Ar^3—I^+—Ar^4 \quad (Xq^{m-})_{1/m} \qquad (2)$$

In formula (2), $Ar^3$ and $Ar^4$ are each independently a $C_6$-$C_{18}$ aryl group which may contain a heteroatom. Examples of the aryl group include phenyl, methylphenyl, ethylphenyl, n-propylphenyl, isopropylphenyl, n-butylphenyl, isobutylphenyl, sec-butylphenyl, tert-butylphenyl, cyclohexylphenyl, naphthyl, methylnaphthyl, ethylnaphthyl, n-propylnaphthyl, isopropylnaphthyl, n-butylnaphthyl, isobutylnaphthyl, sec-butylnaphthyl, tert-butylnaphthyl, and cyclohexylnaphthyl. In the aryl group, some or all of the hydrogen atoms may be substituted by a moiety containing a heteroatom such as oxygen, sulfur, nitrogen or halogen, and some constituent $—CH_2—$ may be replaced by a moiety containing a heteroatom such as oxygen, sulfur or nitrogen, so that the group may contain a hydroxy, fluorine, chlorine, bromine, iodine, cyano, carbonyl, ether bond, ester bond, sulfonic ester bond, carbonate bond, lactone ring, sultone ring, carboxylic anhydride (—C(═O)—O—C(═O)—), or haloalkyl moiety.

Examples of the cation of the photo-decomposable quencher are as exemplified above for the cation of the photoacid generator as component (II).

In formula (2), $Xq^{m-}$ is an m-valent anion of weak acid, and m is an integer of at least 1, preferably an integer of 1 to 3, more preferably 1 or 2, and most preferably 1.

Examples of the anion of the photo-decomposable quencher are shown below, but not limited thereto.

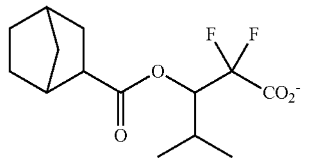

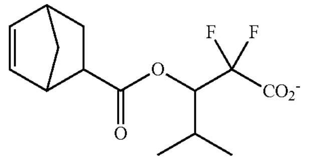

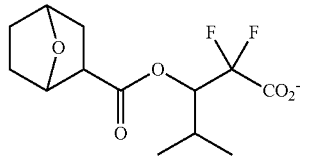

-continued
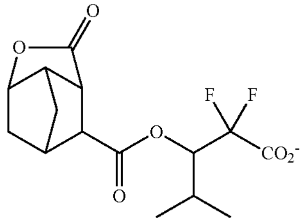
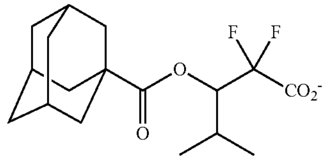
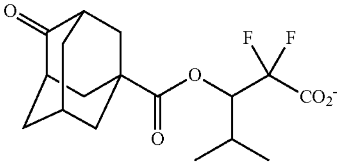
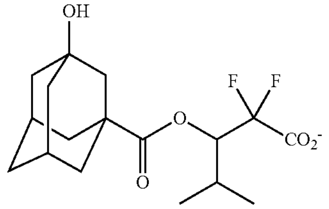
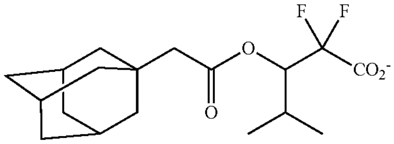
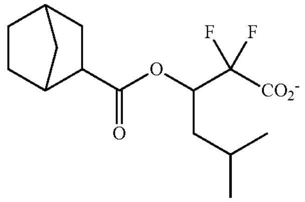
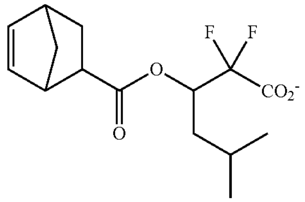
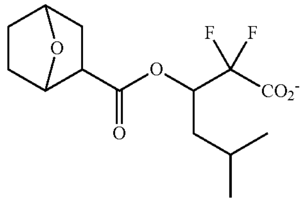
-continued
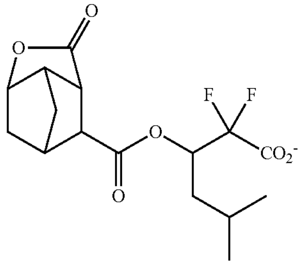
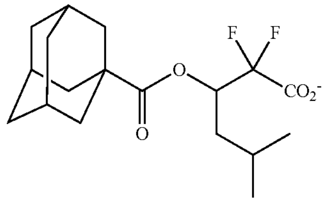
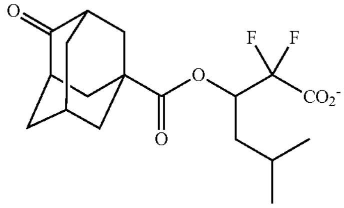
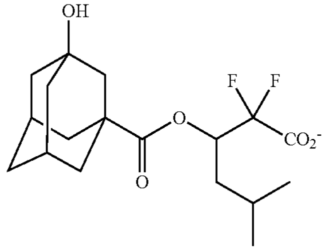
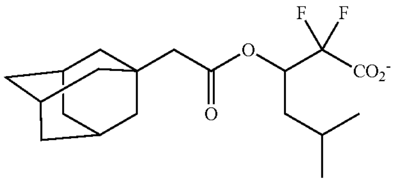
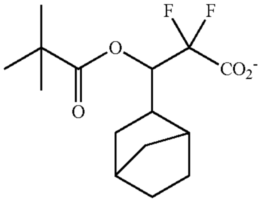
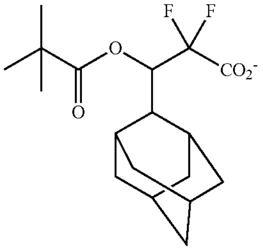
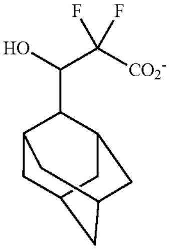
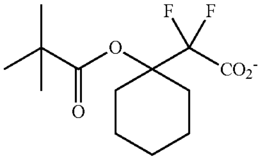

-continued
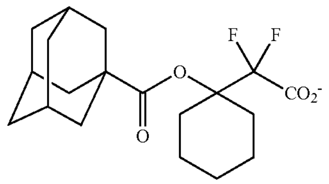
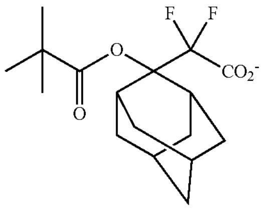
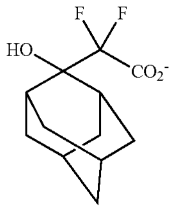
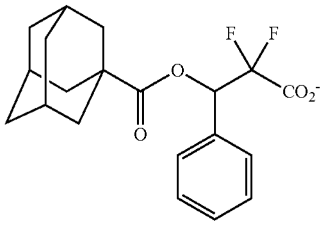
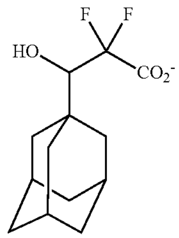
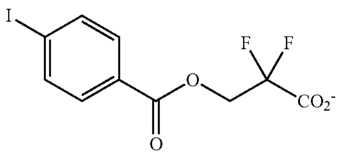
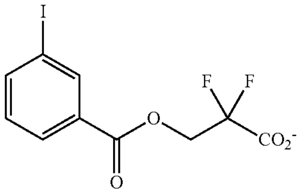
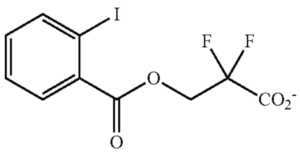
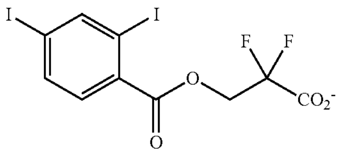
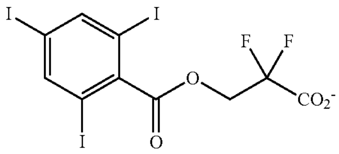
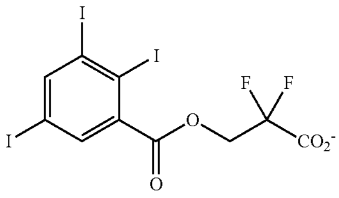
-continued
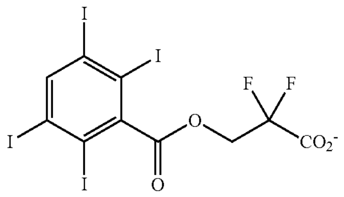
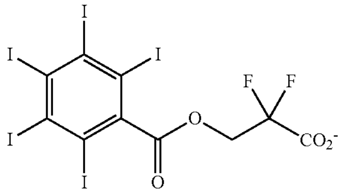
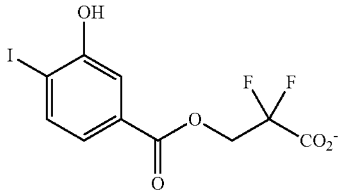
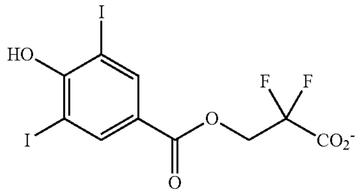
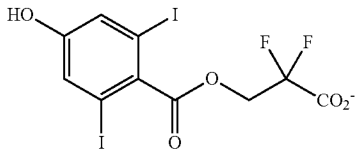
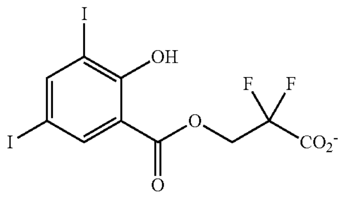
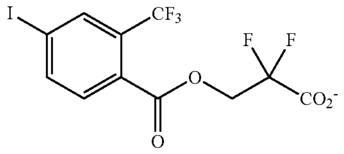
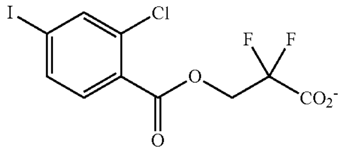
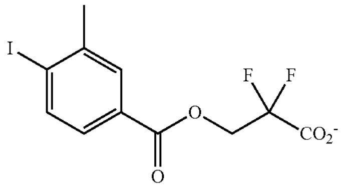

-continued
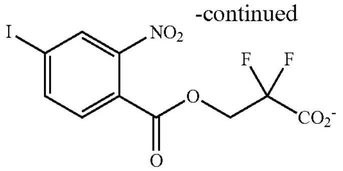
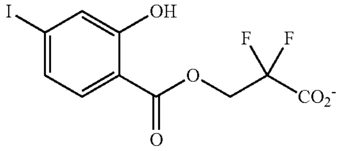
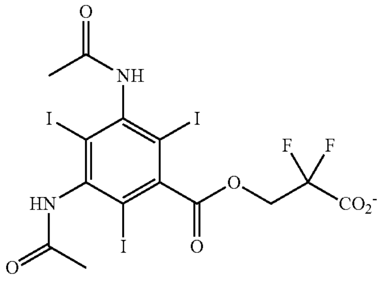
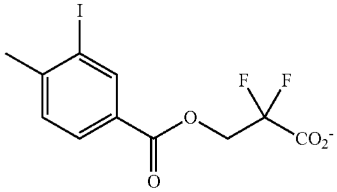
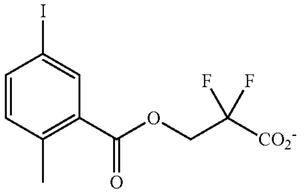
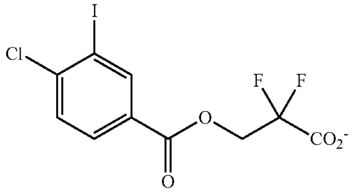
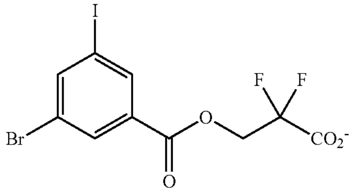
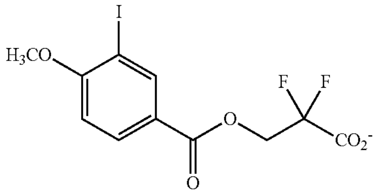
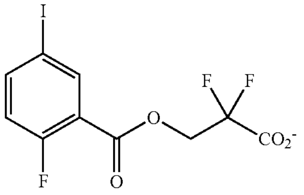
-continued
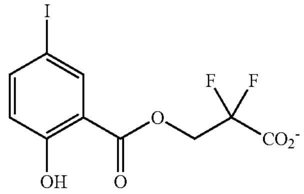
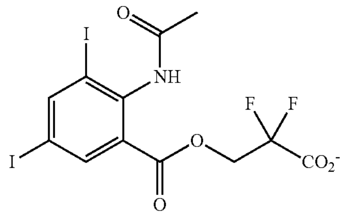
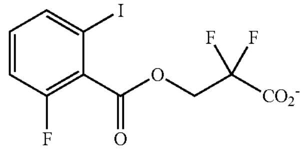
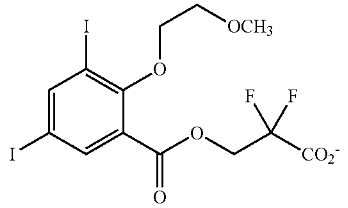
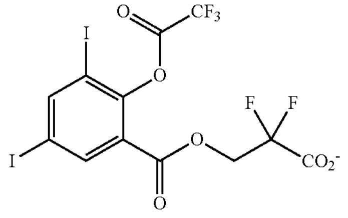
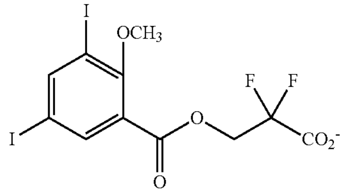
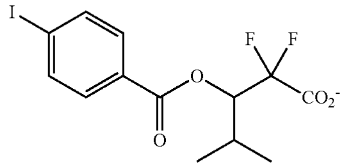
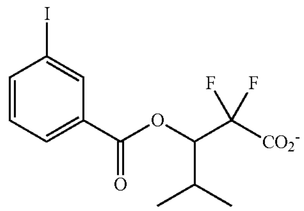
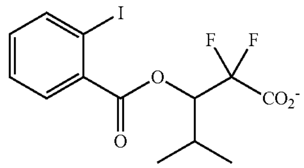

-continued
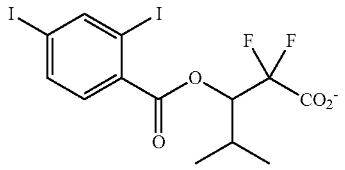
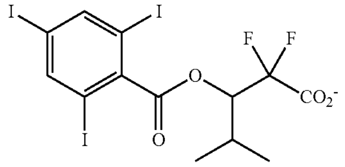
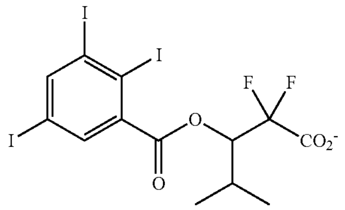
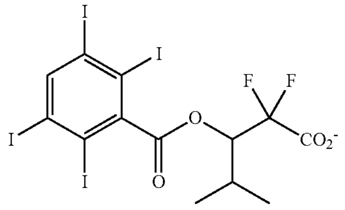
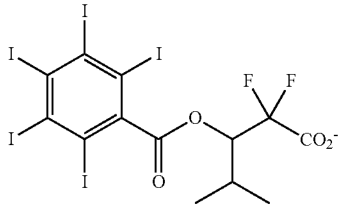
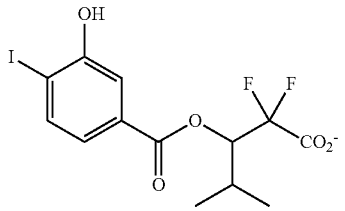
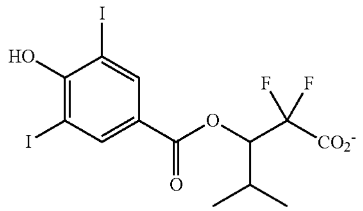
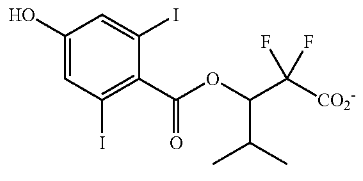
-continued
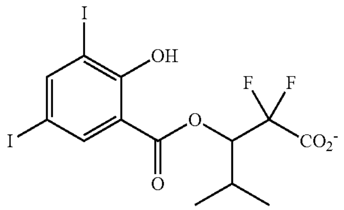
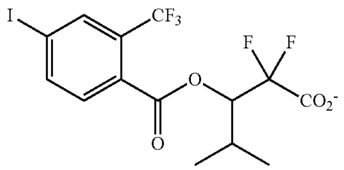
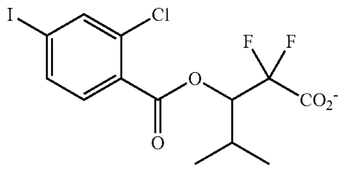
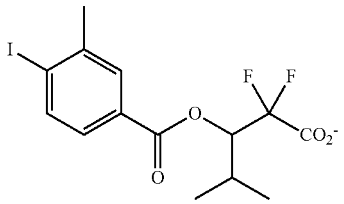
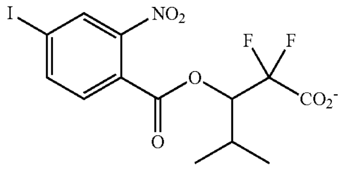
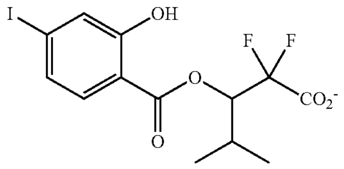
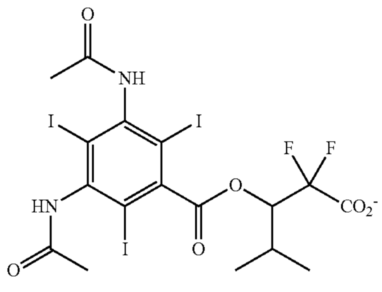
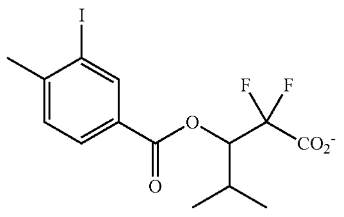

-continued
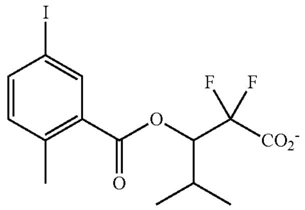
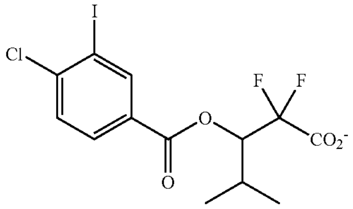
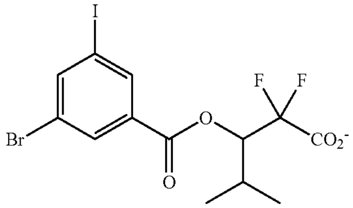
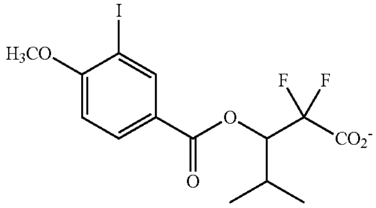
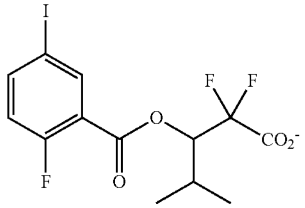
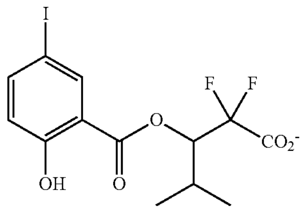
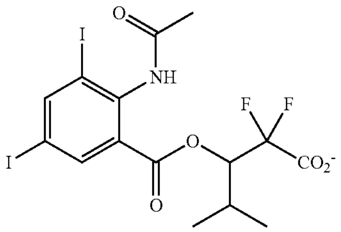
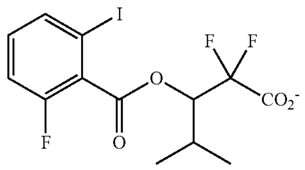
-continued
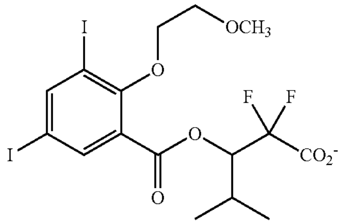
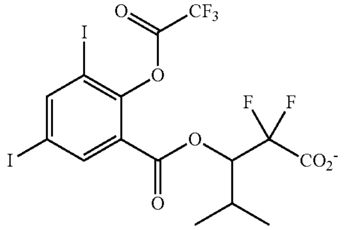
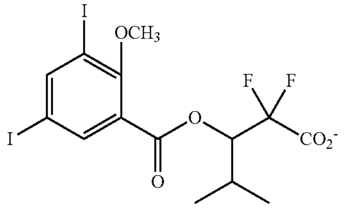
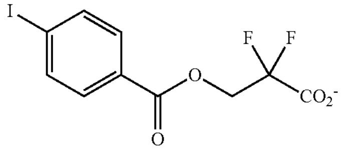
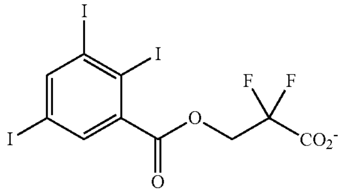
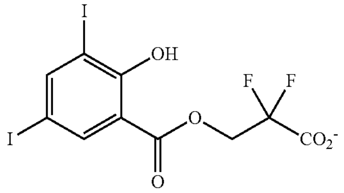
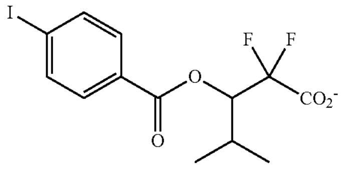
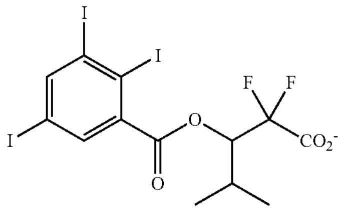

-continued

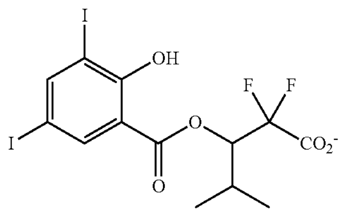

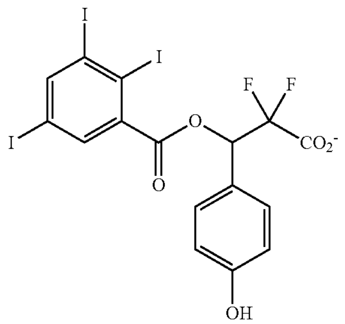

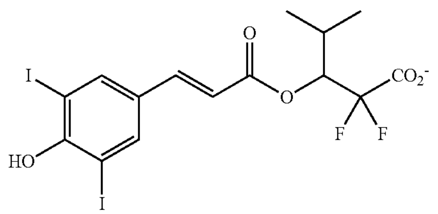

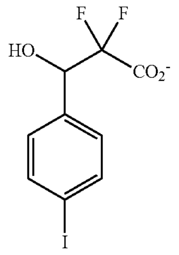

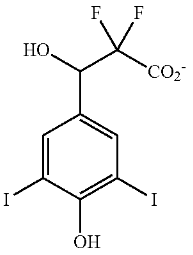

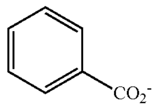

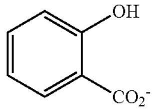

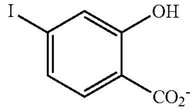

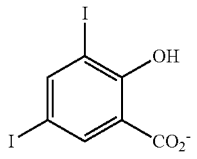

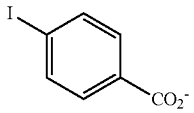

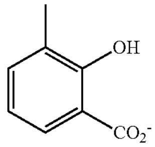

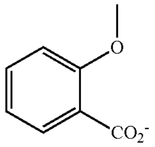

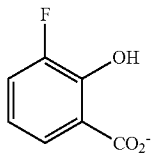

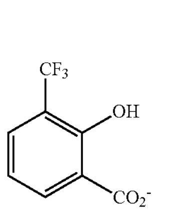

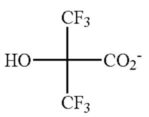

-continued

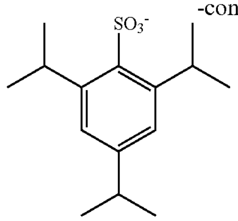

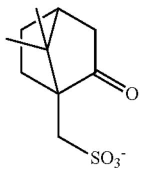

In the resist composition, the photo-decomposable quencher as component (III) is preferably present in an amount of 5 to 20 parts by weight, more preferably 10 to 15 parts by weight per 80 parts by weight of the base polymer as component (IV) to be described later. The photo-decomposable quencher may be used alone or in admixture of two or more.

(IV) Base Polymer

Component (IV) is a base polymer adapted to change its dissolution rate in a developer under the action of au acid. The dissolution rate may increase or decrease. Suitable polymers include a polymer adapted to change its molecular weight through crosslinking or decomposition of the polymer chain and a polymer adapted to change its polarity through decomposition of acid labile groups. The crosslinking of the polymer chain may take place with the aid of a crosslinker.

Preferably, the base polymer comprises repeat units having the formula. (a), which are also referred to as repeat units (a), hereinafter.

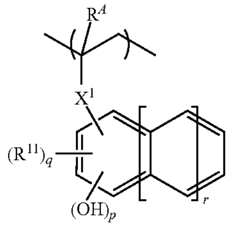

(a)

In formula (a), $R^A$ is hydrogen or methyl. $X^1$ is a single bond, ester bond, amide bond, or a $C_1$-$C_{12}$ divalent linking group containing at least one moiety selected from phenylene, naphthylene, ester bond, ether bond, intone ring, and amide bond. $R^{11}$ is hydrogen, fluorine, or a $C_1$-$C_6$ saturated hydrocarbyl group. $R^{11}$ and $X^1$ may bond together to form a ring with the carbon atoms on the aromatic ring to which they are attached, p is 1 or 2, q is an integer of 0 to 4, p+q is from 1 to 5, and r is 0 or 1.

The repeat unit (a) having a phenolic hydroxy group exhibits a sensitizing action of increasing the efficiency of acid generation roar the PAG and is effective for enhancing sensitivity. However, it is presumed that the repeat unit (a) generates a highly nucleophilic phenoxide anion in a resist solution, to promote decomposition of the iodonium salt. Since the resist composition of the invention is improved in storage stability due to inclusion of the acid compound as component (I), it is possible to use the photosensitive compound of iodonium salt type along with repeat unit (a).

Examples of the monomer from which repeat unit (a) is derived are shown below, but not limited thereto.

-continued
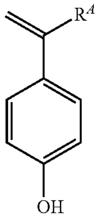
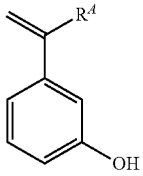
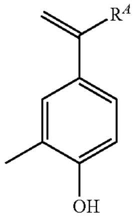
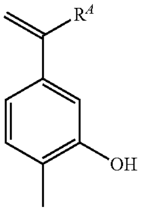
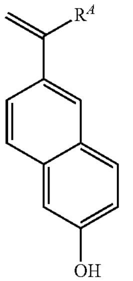
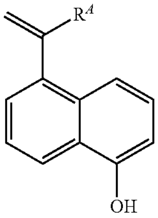
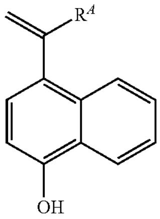
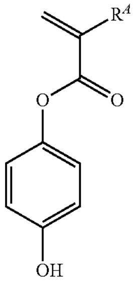
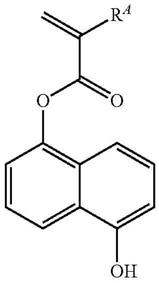
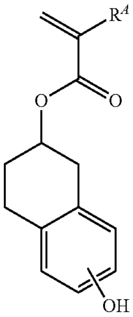
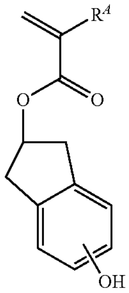
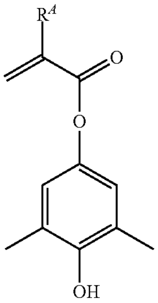
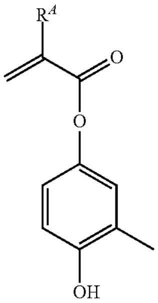
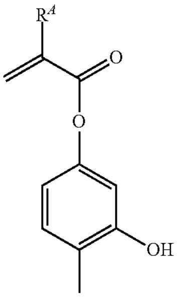
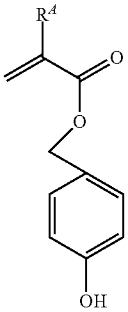
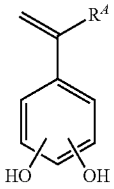
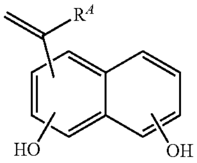
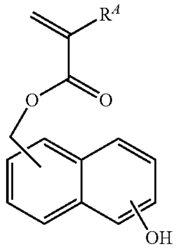
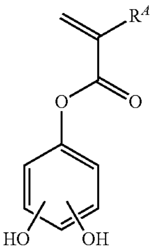
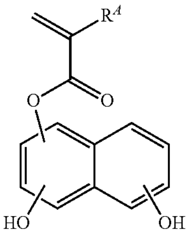
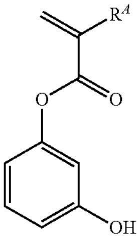
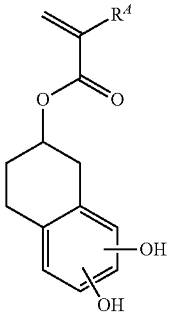

-continued

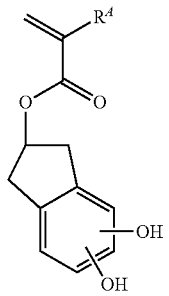
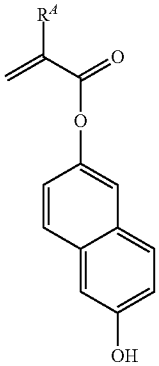
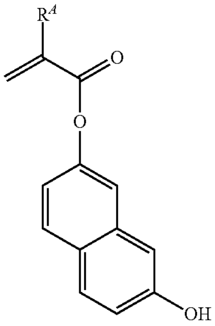
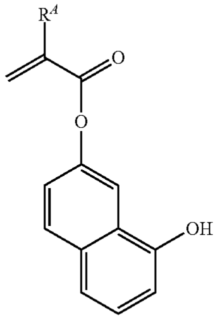
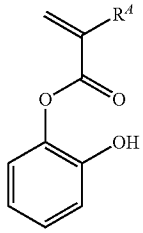
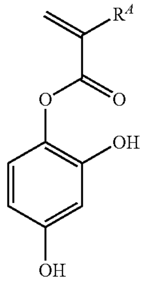
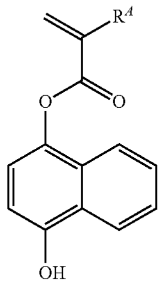
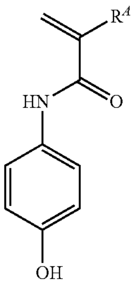
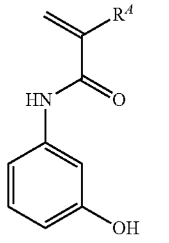
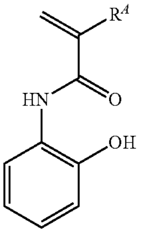

-continued

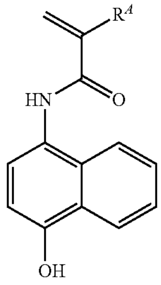
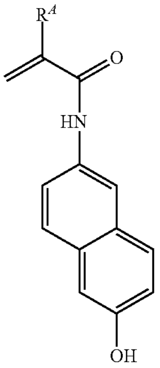
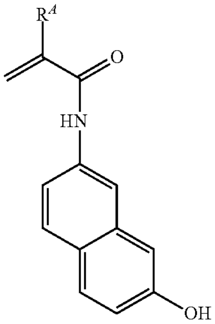
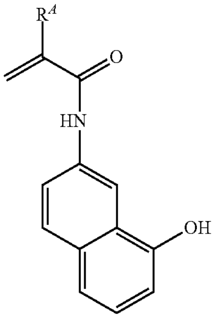
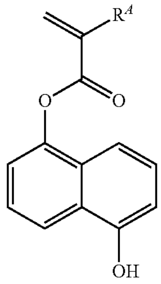
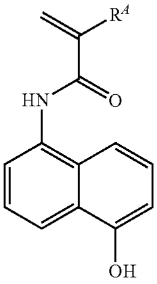

The base polymer may further comprise repeat units having a structural site which is decomposed to generate an acid upon exposure to actinic ray or radiation, which are also referred to as acid generating units, hereinafter. It is believed that the incorporation of acid generating units in a polymer is effective for preventing the acid generator from agglomerating together and making the distribution of acid concentration in a resist film uniform.

Preferably, the acid generating units have the formula (1) or formula (b2), which are also referred to as repeat units (b1) or (b2), hereinafter.

(b1)

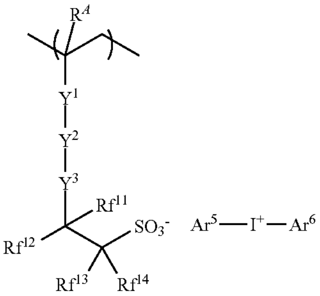

-continued (b2)

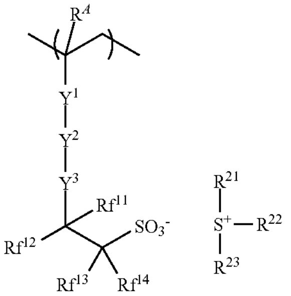

In formulae (b1) and (b2), $R^A$ is hydrogen or methyl. $Y^1$ is a single bond or ester bond. $Y^2$ is a single bond or a $C_1$-$C_{20}$ hydrocarbylene group which may contain at least one moiety selected from an ester bond, ether bond, lactone ring, amide bond, sultone ring and iodine. $Y^3$ is a single bond, ether bond or ester bond. $Rf^{11}$ to $Rf^{14}$ are each independently hydrogen, fluorine, or trifluoromethyl, at least one thereof being fluorine or trifluoromethyl.

The $C_1$-$C_{20}$ hydrocarbylene group $Y^2$ may be saturated or unsaturated and straight, branched or cyclic. Examples thereof include $C_1$-$C_{20}$ alkanediyl groups such as methylene, ethane-1,1-diyl, ethane-1,2-diyl, propane-1,1-diyl, propane-1,2-diyl, propane-1,3-diyl, butane-1,3-diyl, butane-1,4-diyl, pentane-1,5-diyl, hexane-1,6-diyl, heptane-1,7-diyl, octane-1,8-diyl, nonane-1,9-diyl, decane-1,10-diyl, 2,2-dimethylpropane-1,3-diyl; $C_3$-$C_{20}$ cyclic saturated hydrocarbylene groups such as cyclopentanediyl, cyclohexanediyl, norbornanediyl and adamantanediyl; $C_1$-$C_{20}$ alkenediyl groups such as ethene-1,2-diyl, 1-propene-1,3-diyl, 2-butene-1,4-diyl, and 1-methyl-1-butene-1,4-diyl; $C_3$-$C_{20}$ cyclic unsaturated aliphatic hydrocarbylene groups such as 2-cyclohexene-1,4-diyl; $C_6$-$C_{20}$ arylene groups such as phenylene and naphthylene; and combinations thereof.

Examples of the anion in the monomer from which repeat unit (b1) or (b2) is derived are shown below, but not limited thereto.

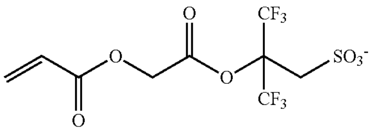

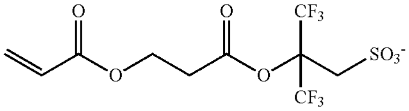

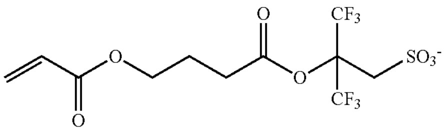

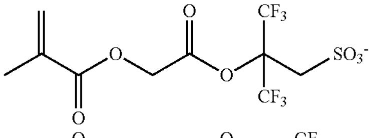

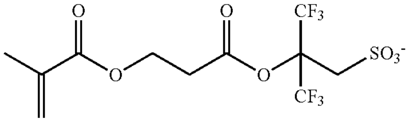

-continued

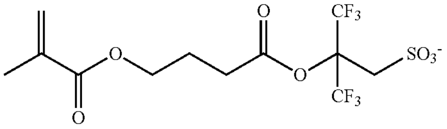

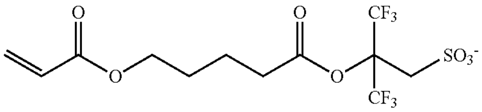

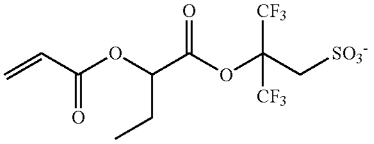

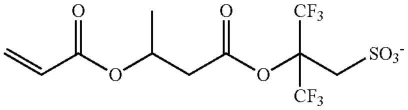

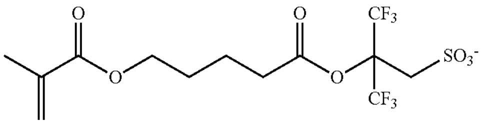

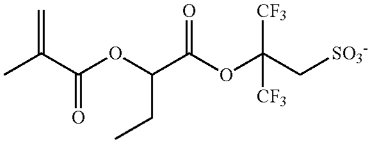

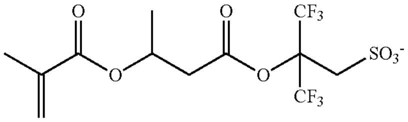

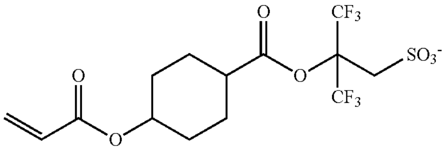

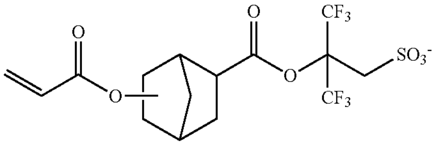

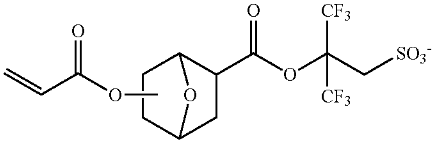

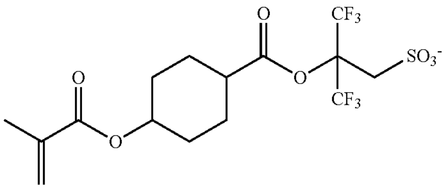

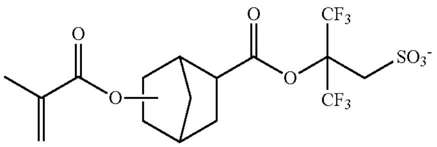

-continued
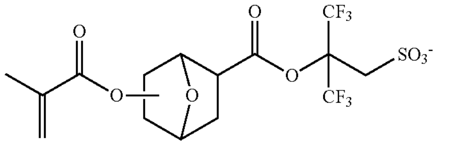
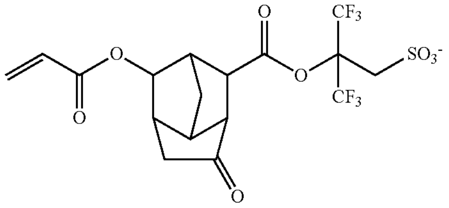
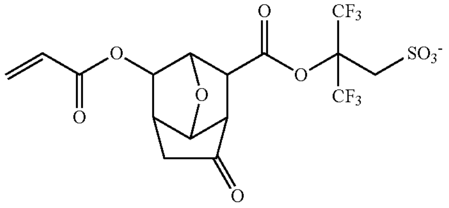
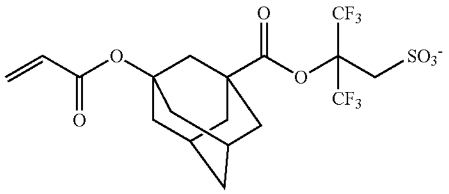
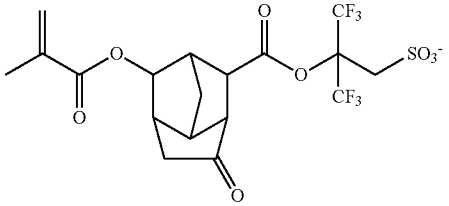
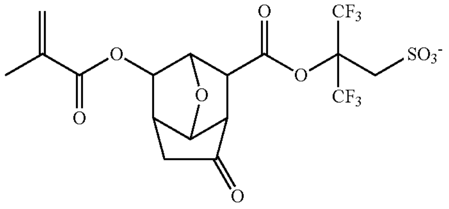
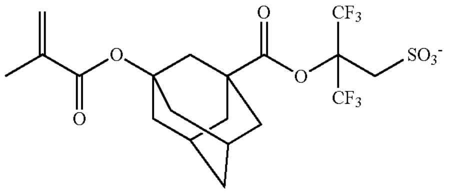
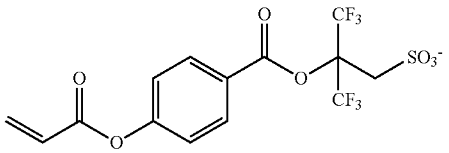
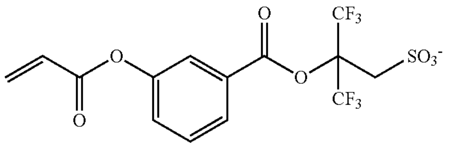
-continued
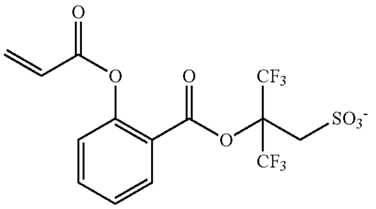
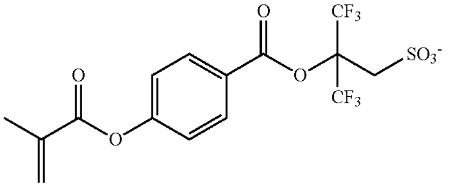
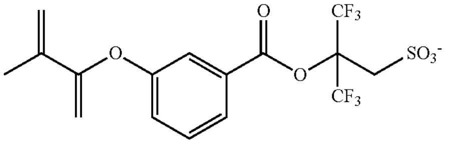
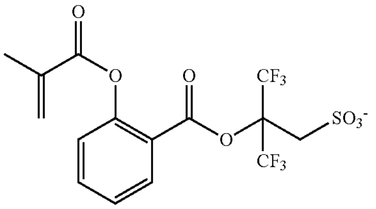
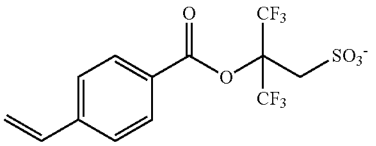
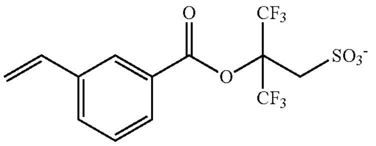
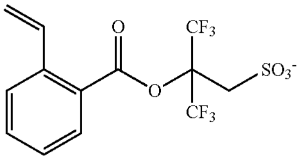
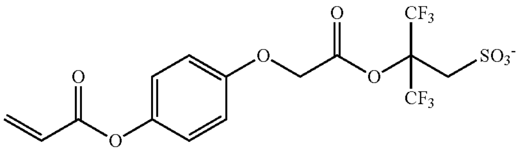
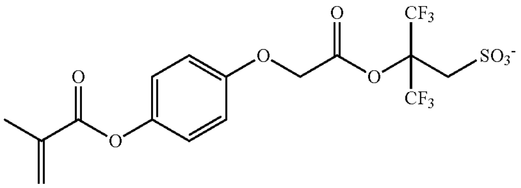
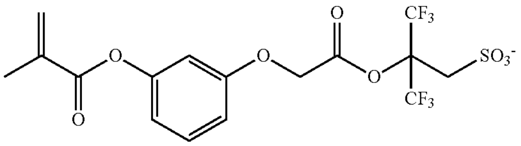

-continued
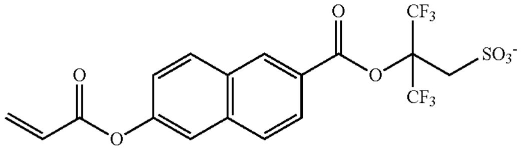
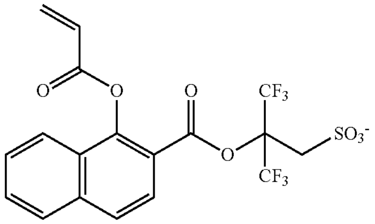
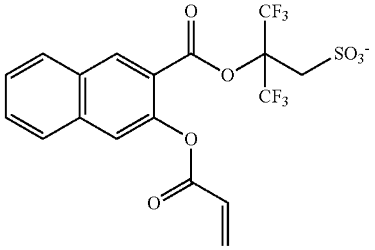
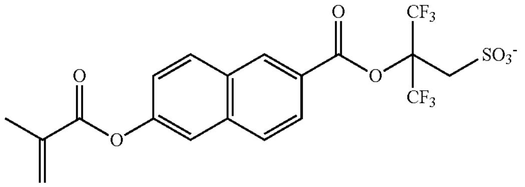
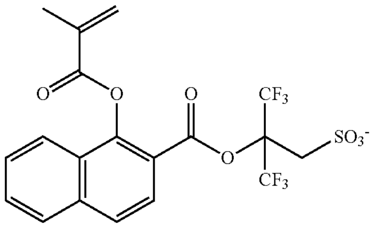
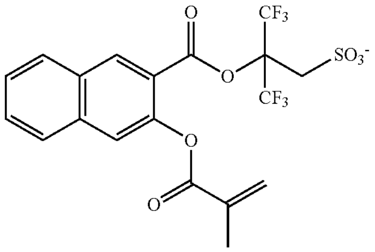
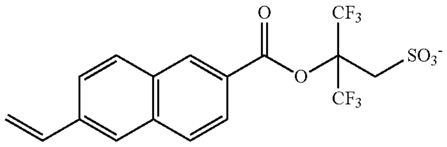
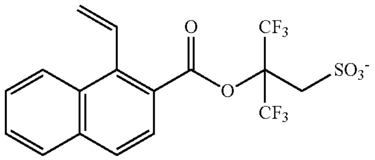
-continued
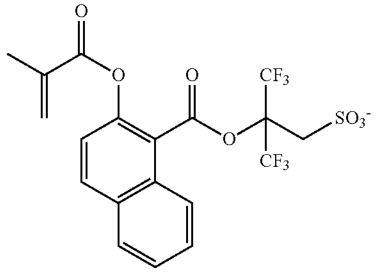
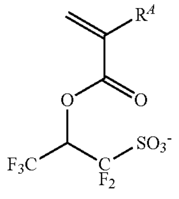
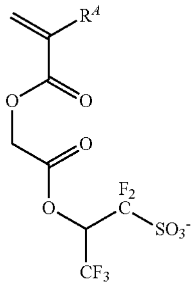
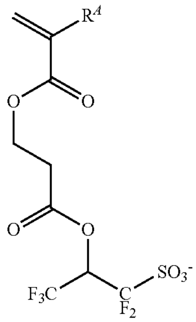
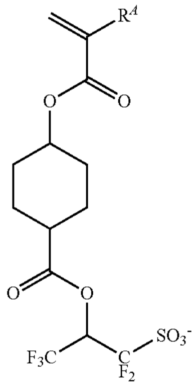
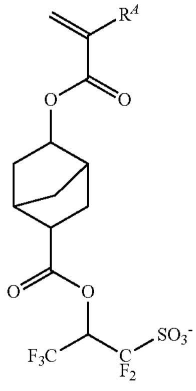
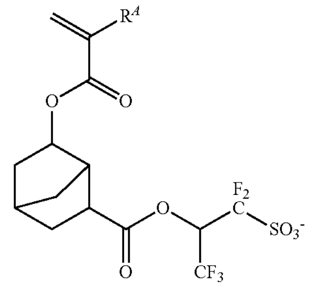
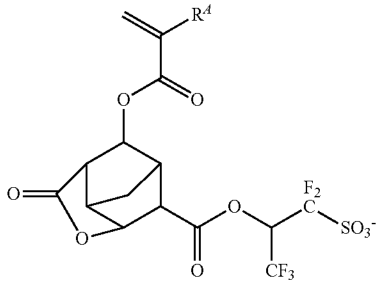

-continued
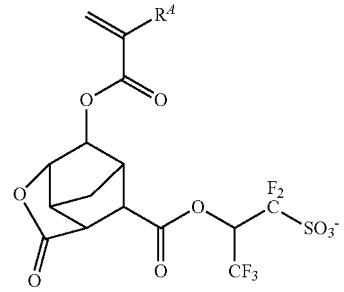
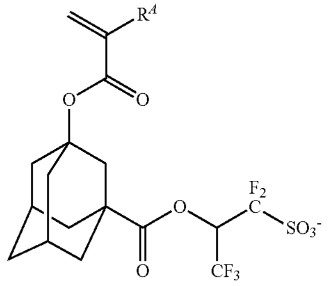
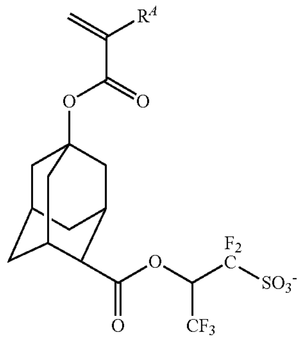
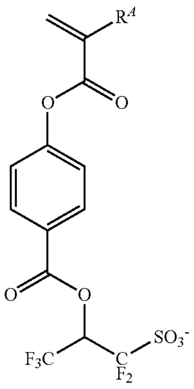
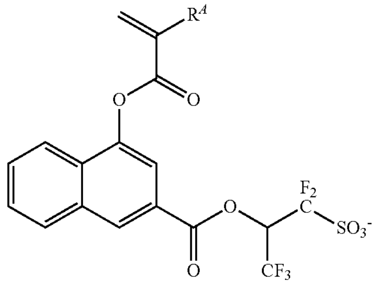
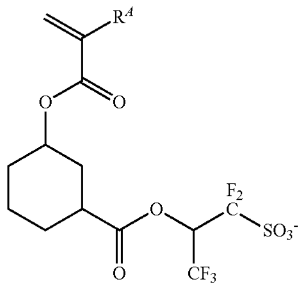
-continued
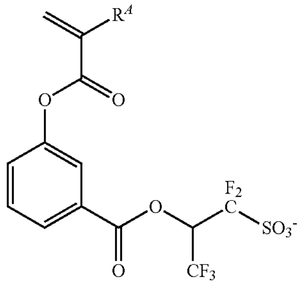
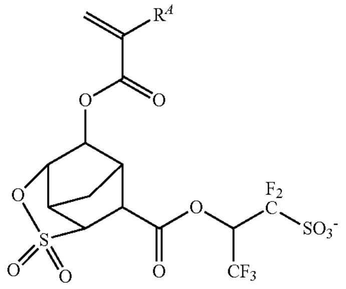
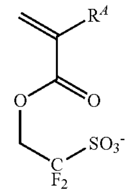
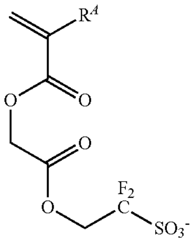
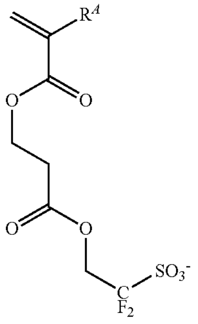
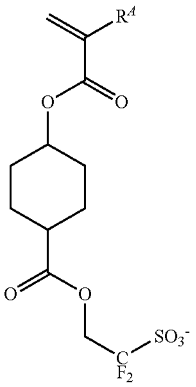
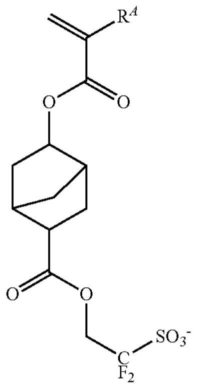
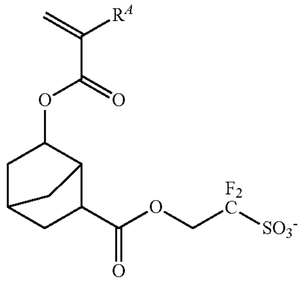

-continued
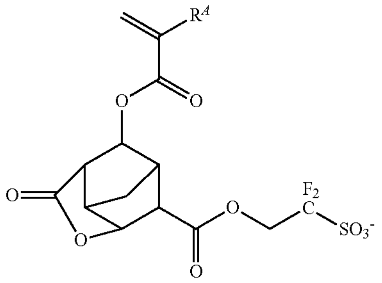
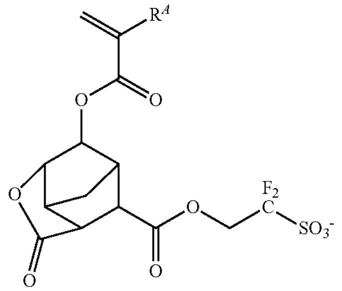
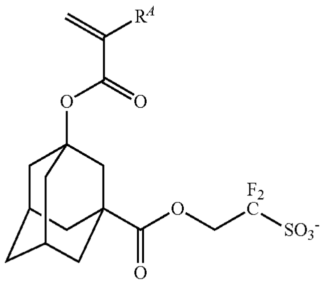
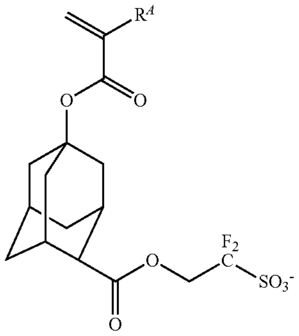
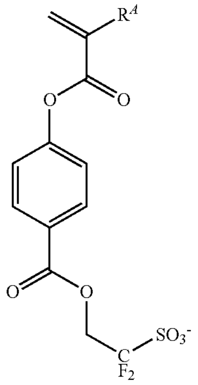
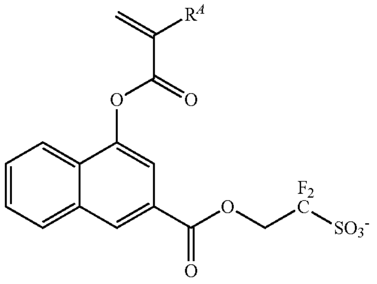
-continued
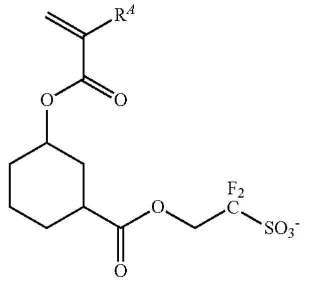
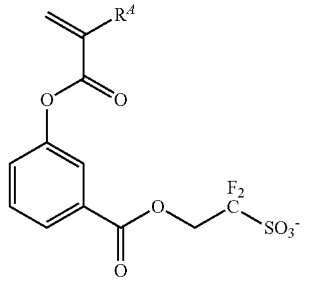
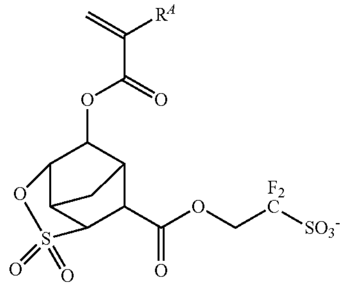
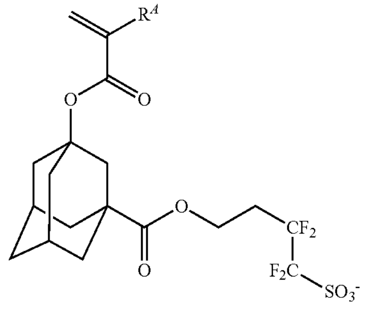
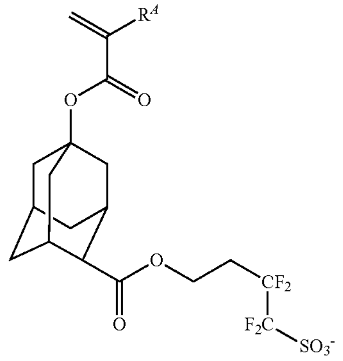

-continued
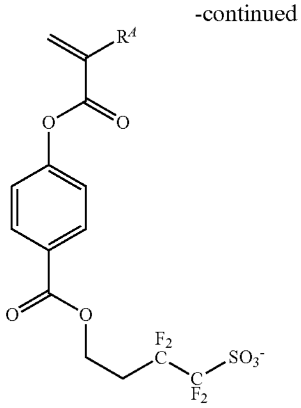
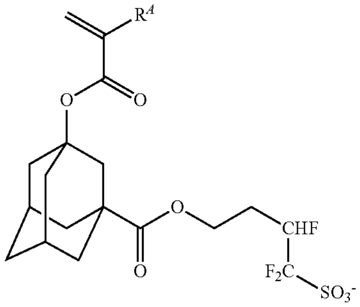
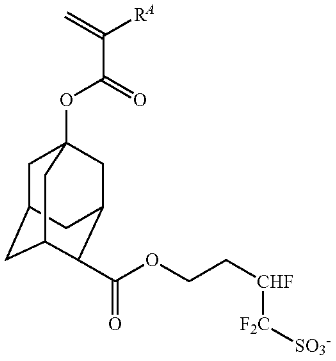
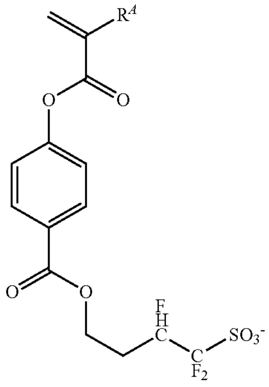
-continued
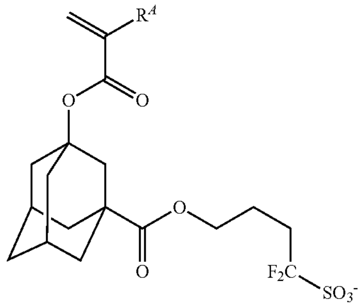
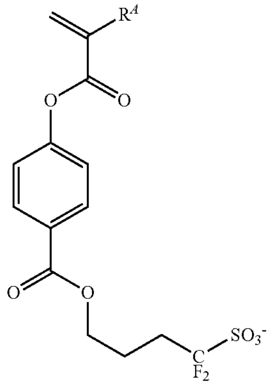
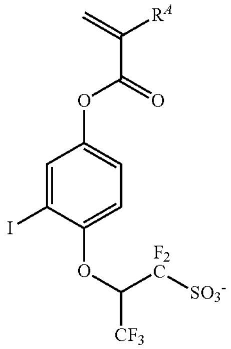
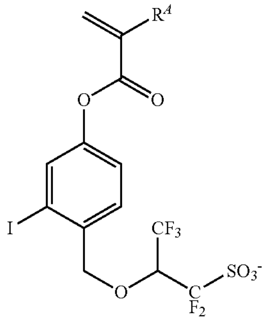
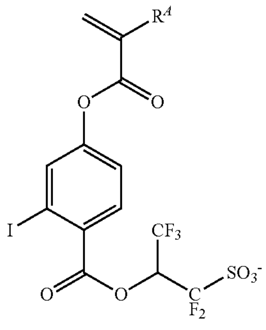
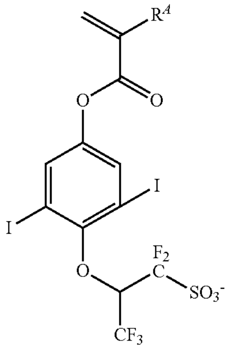
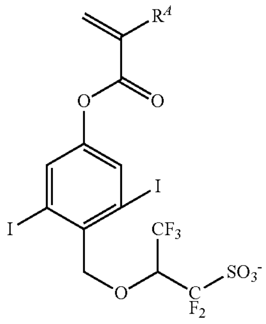

-continued

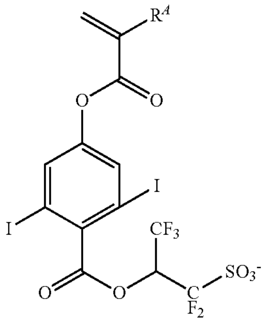

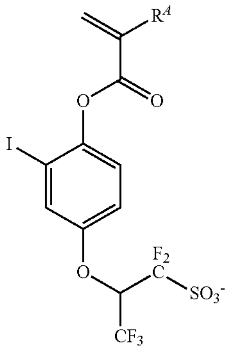

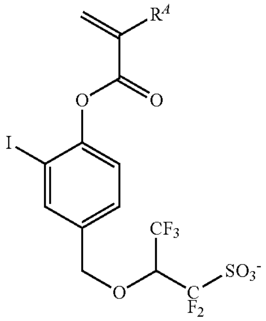

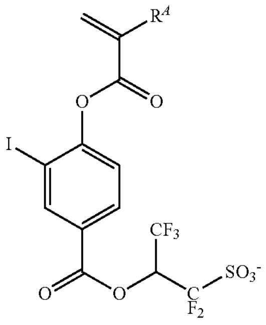

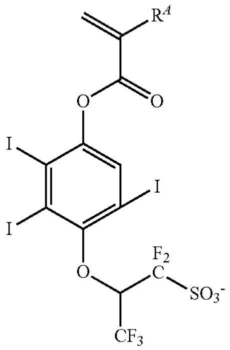

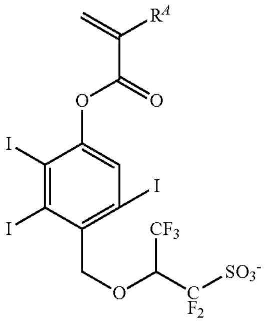

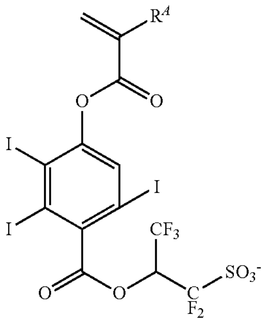

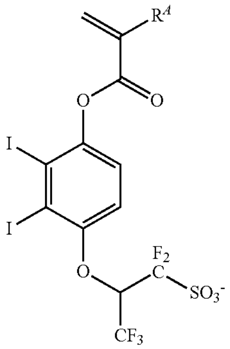

-continued

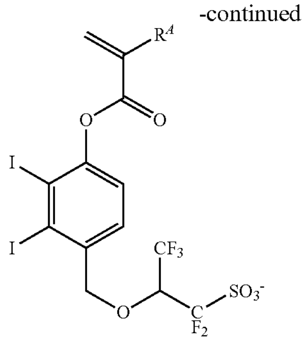

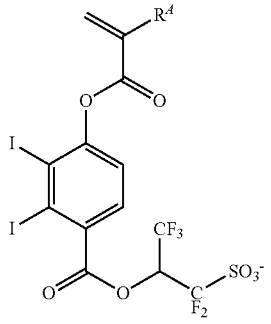

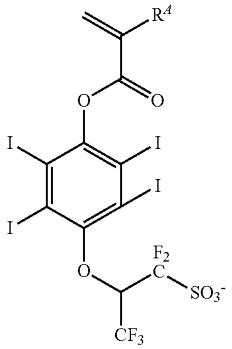

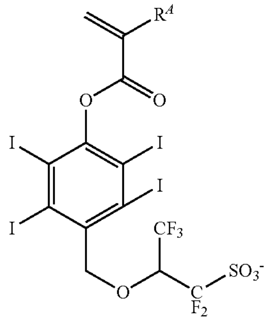

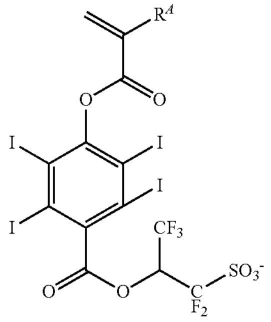

In formula (b1), $Ar^5$ and $Ar^6$ are each independently a $C_6$-$C_{18}$ aryl group which may contain a heteroatom. Examples of the aryl group include phenyl, methylphenyl, ethylphenyl, n-propylphenyl, isopropylphenyl, n-butylphenyl, isobutylphenyl, sec-butylphenyl, tert-butylphenyl, cyclohexylphenyl, naphthyl, methylnaphthyl, ethylnaphthyl, n-propylnaphthyl, isopropylnaphthyl, n-butylnaphthyl, isobutylnaphthyl, sec-butylnaphthyl, tert-butylnaphthyl, and cyclohexylnaphthyl. In the aryl group, some or all of the hydrogen atoms may be substituted by a moiety containing a heteroatom such as oxygen, sulfur, nitrogen or halogen, and some constituent —$CH_2$— may be replaced by a moiety containing a heteroatom such as oxygen, sulfur or nitrogen, so that the group may contain a hydroxy, fluorine, chlorine, bromine, iodine, cyano, carbonyl, ether bond, ester bond, sulfonic ester bond, carbonate bond, lactone ring, sultone ring, carboxylic anhydride (—C(═O)—O—C(═O)—), or haloalkyl moiety.

Examples of the cation in the monomer from which repeat unit (b1) is derived are shown below, but not limited thereto.

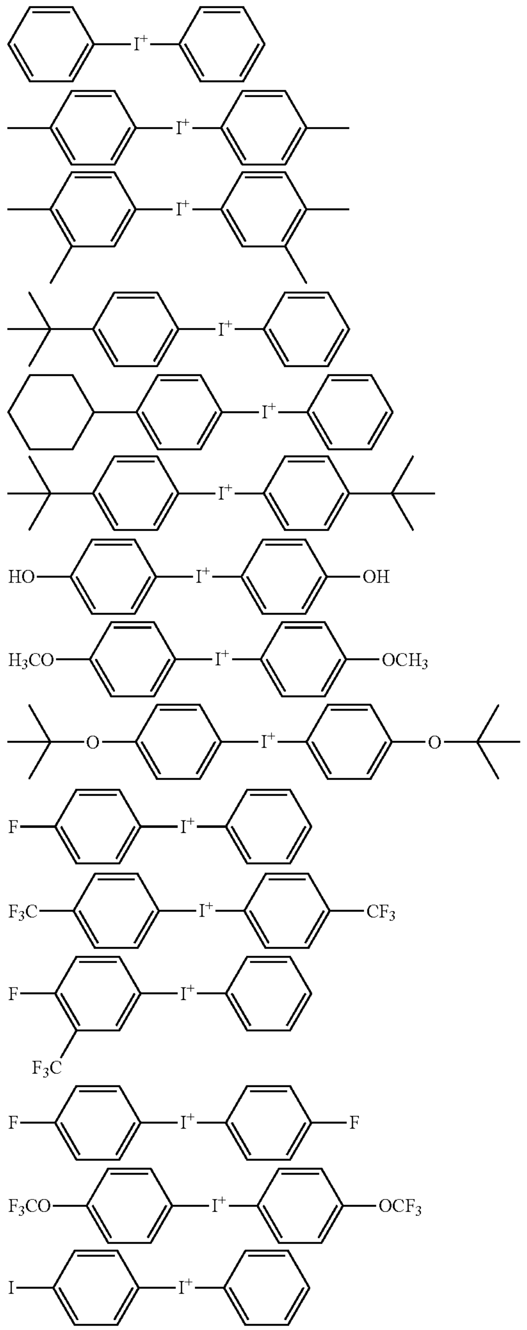

In formula (b2), $R^{21}$ to $R^{23}$ are each independently a $C_1$-$C_{20}$ hydrocarbyl group which may contain a heteroatom. The $C_1$-$C_{20}$ hydrocarbyl group may be saturated or unsaturated and straight, branched or cyclic. Examples thereof include $C_1$-$C_{20}$ alkyl groups such as methyl, ethyl, n-propyl, isopropyl, n-butyl, isobutyl, sec-butyl, tert-butyl, n-pentyl, n-hexyl, n-octyl, n-nonyl, n-decyl, undecyl, dodecyl, tridecyl, tetradecyl, pentadecyl, heptadecyl, octadecyl, nonadecyl, icosyl; $C_3$-$C_{20}$ cyclic saturated hydrocarbyl groups such as cyclopropyl, cyclopentyl, cyclohexyl, cyclopropylmethyl, 4-methylcyclohexyl, cyclohexylmethyl, norbornyl, adamantyl; $C_2$-$C_{20}$ alkenyl groups such as vinyl, propenyl, butenyl, hexenyl, $C_2$-$C_{20}$ alkynyl groups such as ethynyl, propynyl, butynyl; $C_3$-$C_{20}$ cyclic unsaturated aliphatic hydrocarbyl groups such as cyclohexenyl, norbornenyl; $C_6$-$C_{20}$ aryl groups such as phenyl, methylphenyl, ethylphenyl, n-propylphenyl, isopropylphenyl, n-butylphenyl, isobutylphenyl sec-butylphenyl, tert-butylphenyl, naphthyl, methylnaphthyl, ethylnaphthyl, n-propylnaphthyl, isopropylnaphthyl, n-butylnaphthyl, isobutylnaphthyl, sec-butylnaphthyl, tert-butylnaphthyl; $C_7$-$C_{20}$ aralkyl groups such as benzyl and phenethyl; and combinations thereof. In the hydrocarbyl group, some or all of the hydrogen atoms may be substituted by a moiety containing a heteroatom such as oxygen, sulfur, nitrogen or halogen, and some constituent —$CH_2$— may be replaced by a moiety containing a heteroatom such as oxygen, sulfur or nitrogen, so that the group may contain a hydroxy, fluorine, chlorine, bromine, iodine, cyano, carbonyl, ether bond, ester bond, sulfonic ester bond, carbonate bond, lactone ring, sultone ring, carboxylic anhydride (—C(═O)—O—C(═O)—), or haloalkyl moiety.

$R^{21}$ and $R^{22}$ may bond together to form a ring with the sulfur atom to which they are attached. Examples of the ring are shown by the following structures.

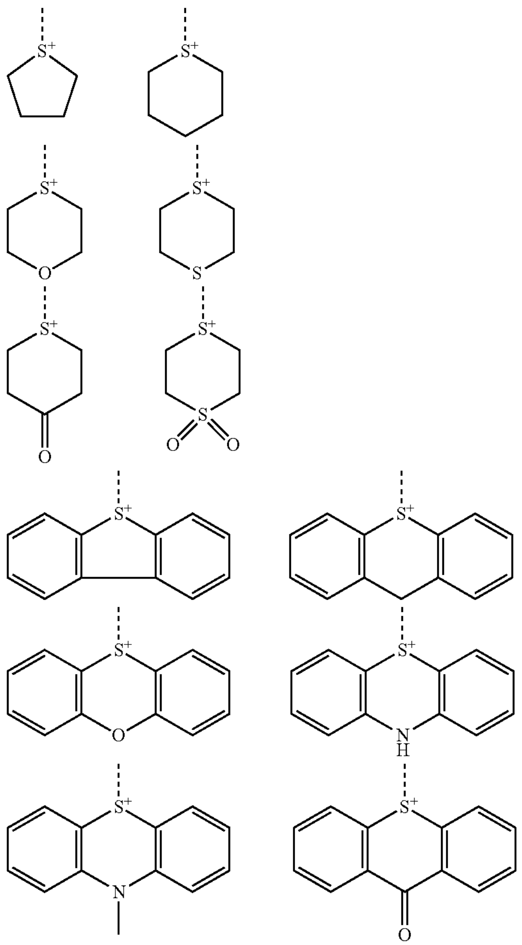

-continued
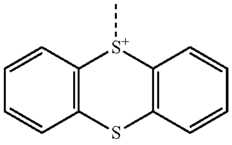
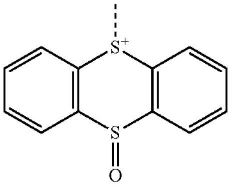
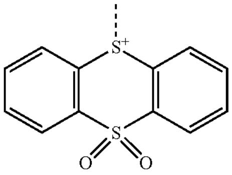
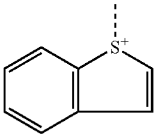
Herein the broken line designates a point of attachment to $R^{23}$.
Examples of the cation in the monomer from which repeat unit (b2) is derived are shown below, but not limited thereto.
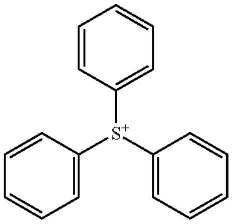
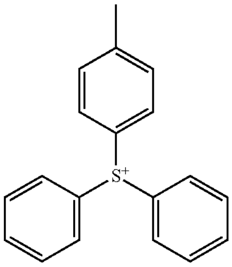
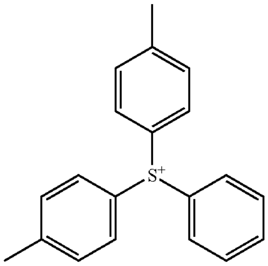
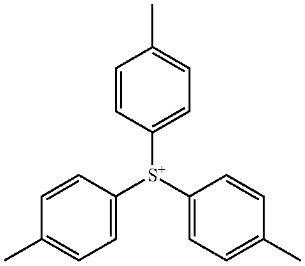
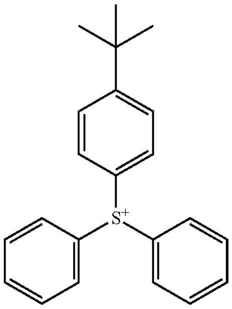
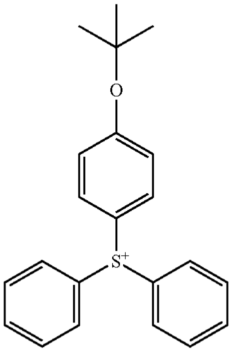
-continued
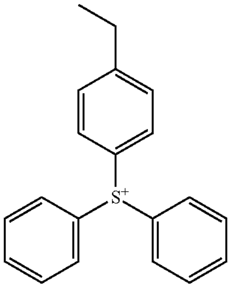
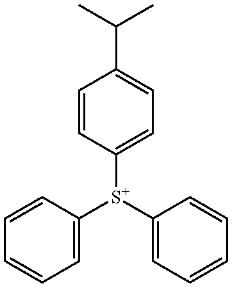
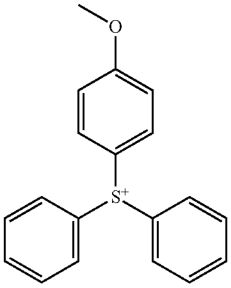
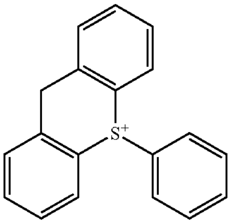
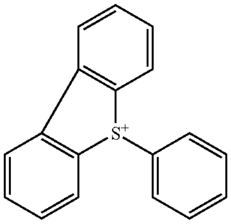
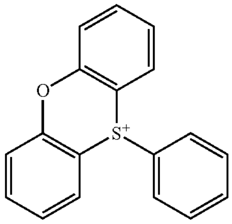
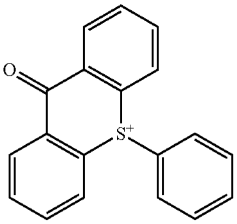
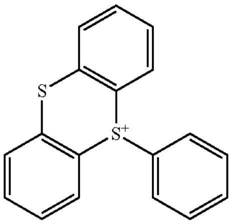
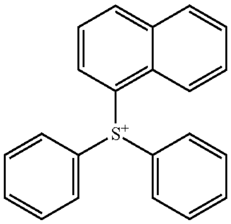
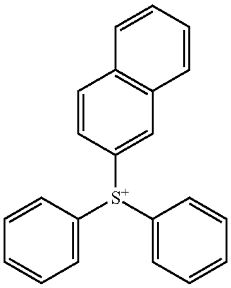
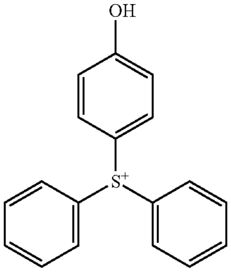
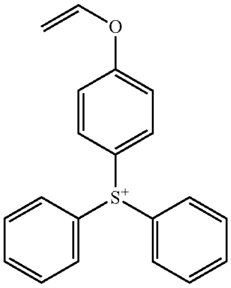

-continued
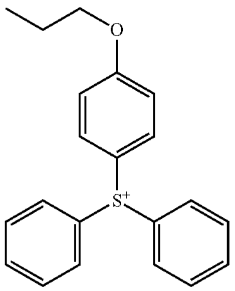
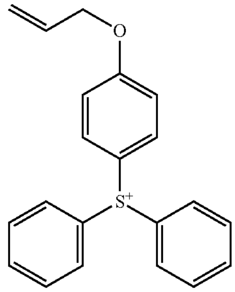
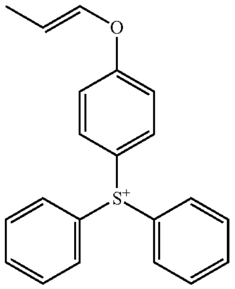
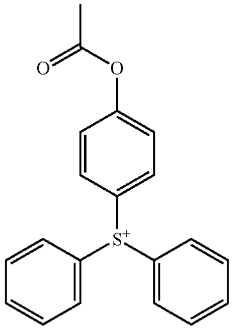
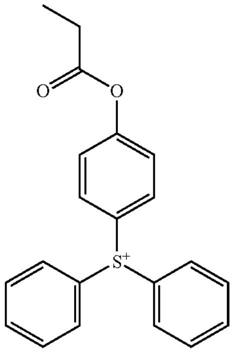
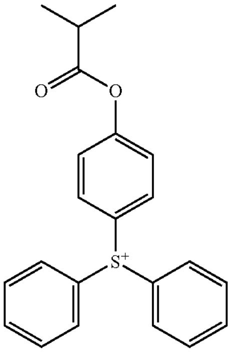
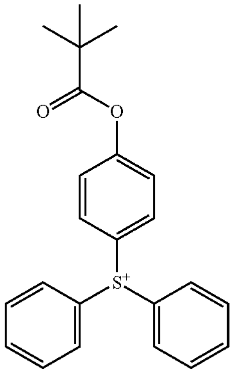
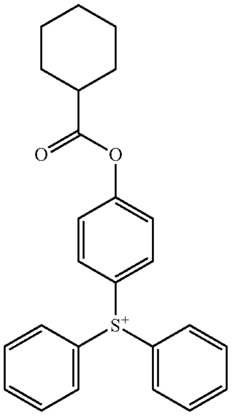
-continued
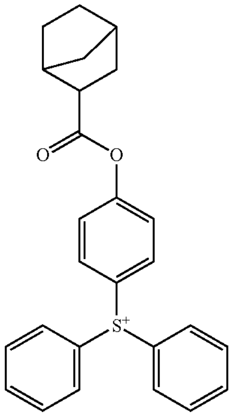
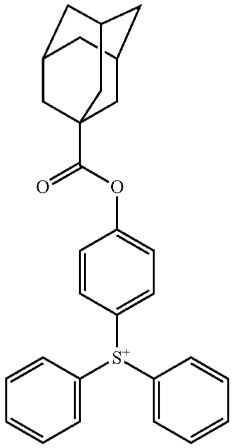
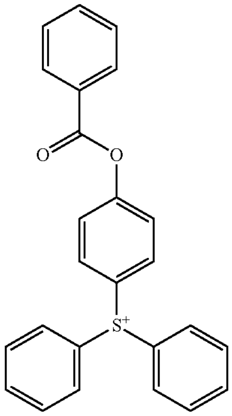
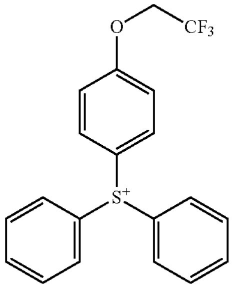
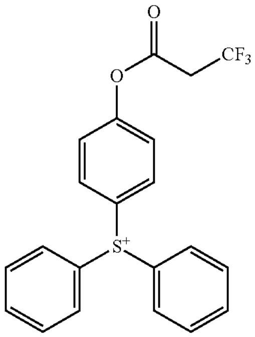
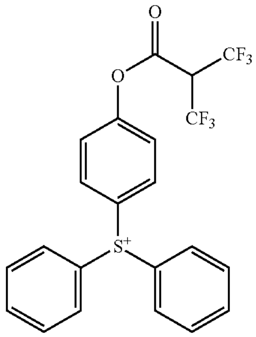
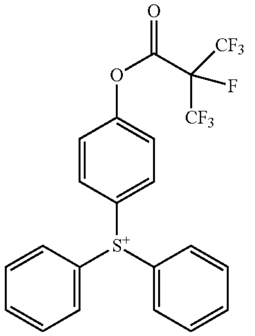
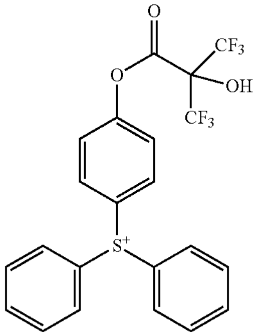

-continued
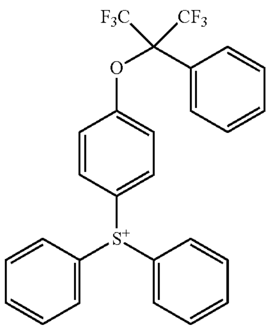
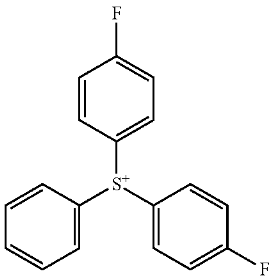
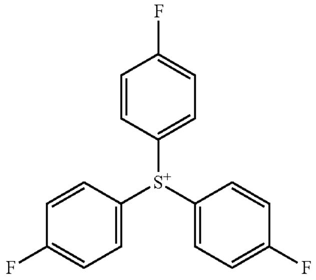
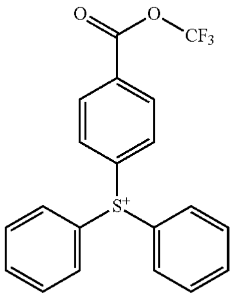
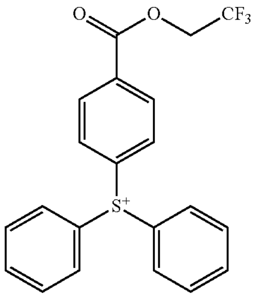
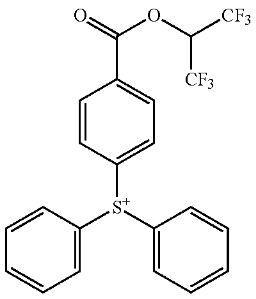
-continued
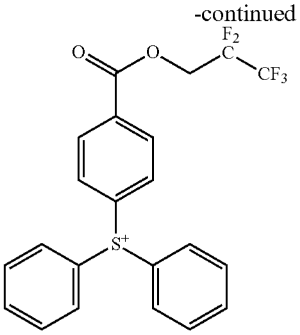
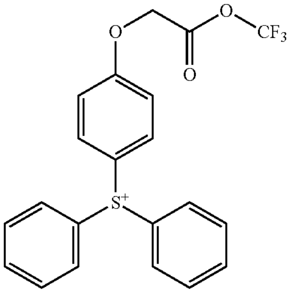
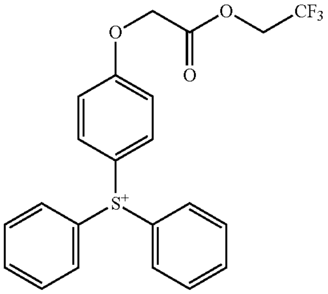
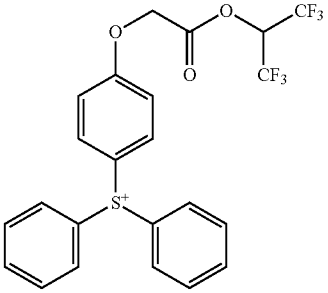
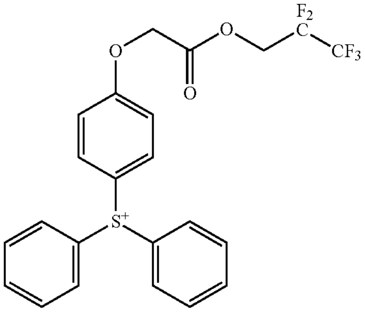
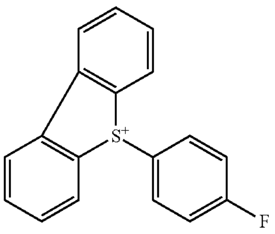

-continued

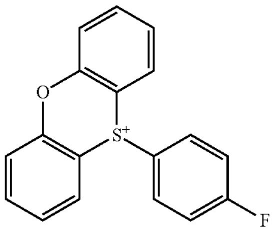
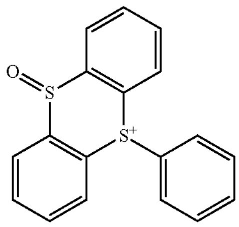
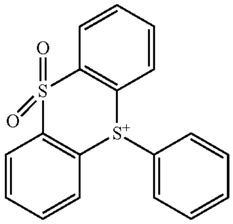
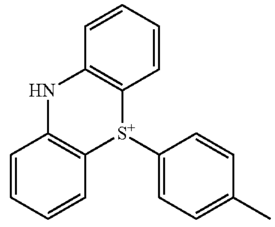
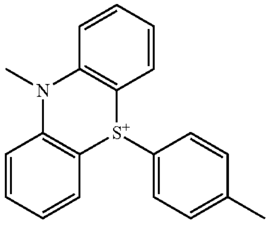
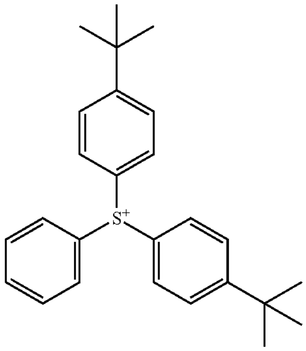
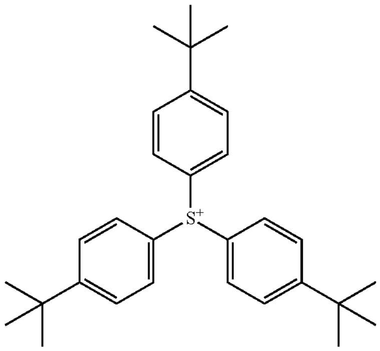 [SMILES: CC(C)(C)c1ccc([S+](c2ccc(C(C)(C)C)cc2)c2ccc(C(C)(C)C)cc2)cc1]

It is noted that when the base polymer includes repeat units (b1), the resist composition may or may not comprise the PAG (II). When the base polymer does not include repeat units (b1), the resist composition comprises either one or both of the PAG (II) and the photo-decomposable quencher (III).

The base polymer may further comprise repeat units (c) having a carboxy group whose hydrogen is substituted by an acid labile group. The typical repeat unit (c) has the formula (c).

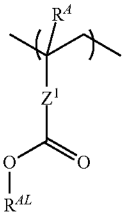

(c)

In formula (c), $R^A$ is hydrogen or methyl. $Z^1$ is a single bond, phenylene group, naphthylene group, or a $C_1$-$C_{12}$ linking group containing at least one moiety selected from an ester bond, ether bond and lactone ring. $R^{AL}$ is an acid labile group.

Examples of the monomer from which repeat unit (c) is derived are shown below, but not limited thereto. Herein, $R^A$ and $R^{AL}$ are as defined above.

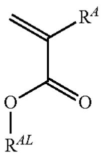
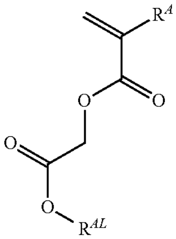
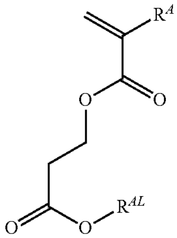
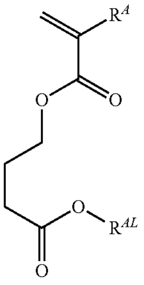
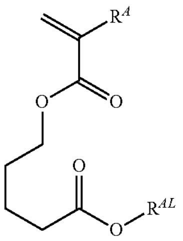
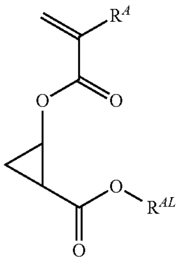
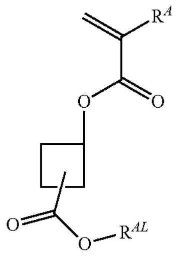
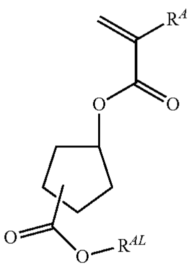
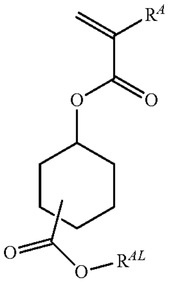

-continued
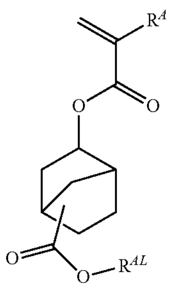
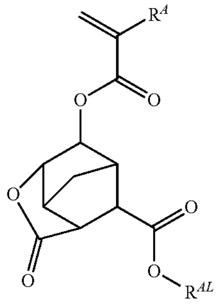
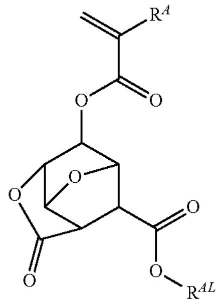
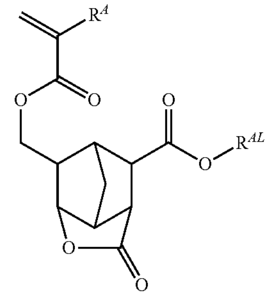
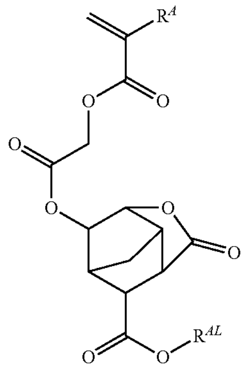
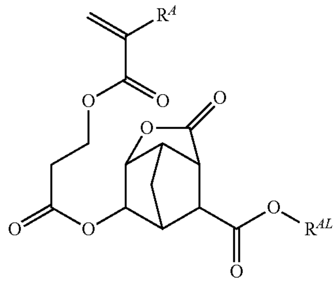
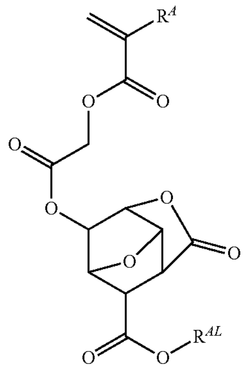
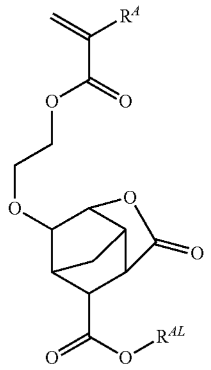
-continued
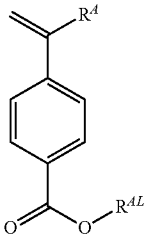
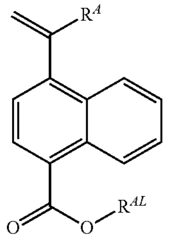
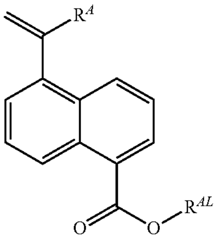
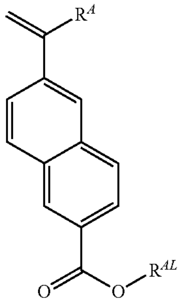
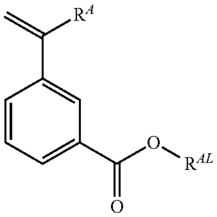
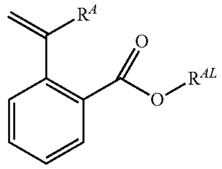
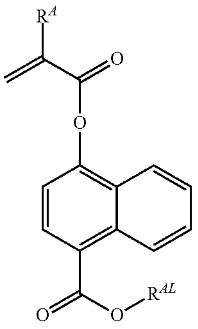
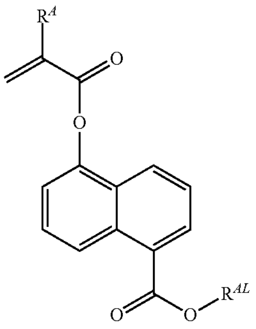
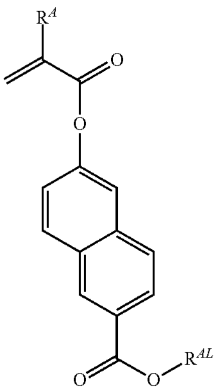
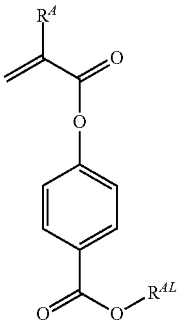

-continued
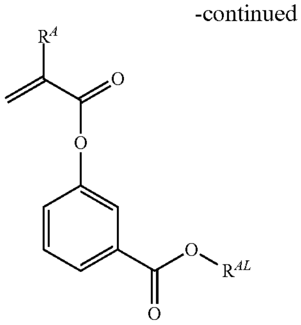
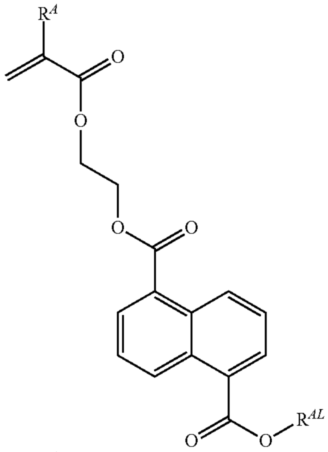
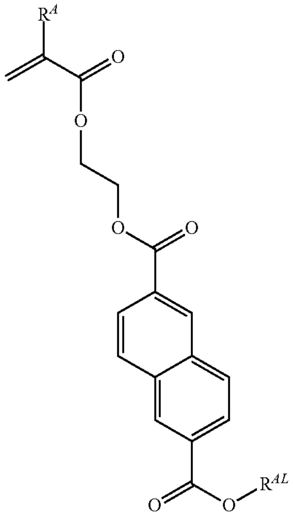
Suitable examples of the acid labile group $R^{AL}$ include those having the formulae (AL-1) to (AL-19), but are not limited thereto.
(AL-1)
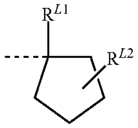
(AL-2)
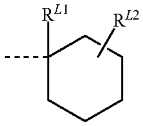
-continued
(AL-3)
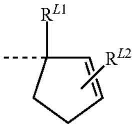
(AL-4)
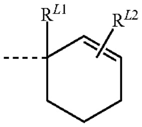
(AL-5)
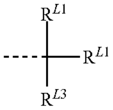
(AL-6)
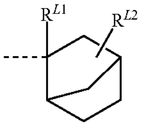
(AL-7)
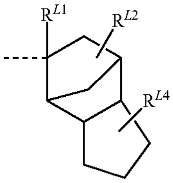
(AL-8)
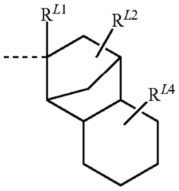
(AL-9)
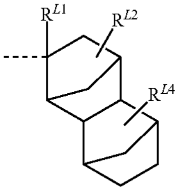
(AL-10)
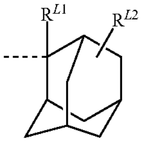
(AL-11)
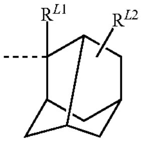

-continued (AL-12)

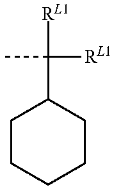

(AL-13)

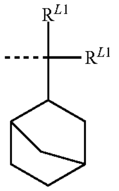

(AL-14)

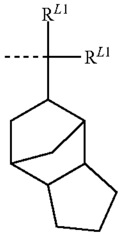

(AL-15)

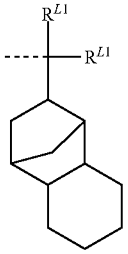

(AL-16)

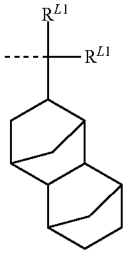

(AL-17)

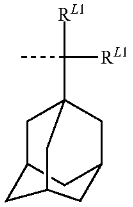

(AL-18)

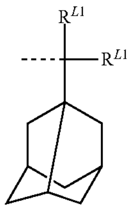

-continued (AL-19)

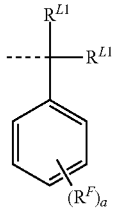

In formulae (AL-1) to (AL-19), $R^{L1}$ is each independently a $C_1$-$C_8$ saturated hydrocarbyl group or $C_6$-$C_{20}$ aryl group. $R^{L2}$ and $R^{L4}$ are each independently hydrogen or a $C_1$-$C_{20}$ saturated hydrocarbyl group. $R^{L3}$ is a $C_6$-$C_{20}$ aryl group. The saturated hydrocarbyl group may be straight, branched or cyclic. Typical of the aryl group is phenyl. $R^F$ is fluorine or trifluoromethyl. The subscript "a" is an integer of 1 to 5.

The base polymer may comprise repeat units other than the repeat units (a) to (c), which are referred to as repeat units (d), hereinafter. The repeat units (d) may be selected from well-known units commonly used in the base polymer in prior art resist compositions, for example, (meth)acrylate units and (meth)acrylic acid units having an adhesive group such as a lactone structure, hydroxy group other than phenolic hydroxy, or carboxy group.

In one embodiment wherein the base polymer includes repeat units (c), the resist composition is a positive tone resist composition. In this embodiment, a fraction of repeat units (a), (b1), (b2), (c), and (d) is preferably $0 \leq a < 1.0$, $0 \leq b1 \leq 0.5$, $0 \leq b2 \leq 0.5$, $0 \leq b1+b2 \leq 0.5$, $0 < c < 1.0$, and $0 \leq d < 1.0$; more preferably $0 \leq a \leq 0.9$, $0 \leq b1 \leq 0.4$, $0 \leq b2 \leq 0.4$, $0 \leq b1+b2 \leq 0.4$, $0.1 \leq c \leq 0.9$, and $0 \leq d \leq 0.9$; even more preferably $0 \leq a \leq 0.8$, $0 \leq b1 \leq 0.3$, $0 \leq b2 \leq 0.3$, $0 \leq b1+b2 \leq 0.3$, $0.2 \leq c \leq 0.8$, and $0 \leq d \leq 0.8$. It is noted that $a+b1+b2+c+d \leq 1.0$, preferably $a+b1+b2+c+d=1.0$.

In another embodiment wherein the base polymer does not include acid labile group-substituted repeat units, the resist composition is a negative tone resist composition. In the other embodiment, a fraction of repeat units (a), (b1), (b2), and (d) is preferably $0 < a \leq 1.0$, $0 \leq b1 \leq 0.5$, $0 \leq b2 \leq 0.5$, $0 \leq b1+b2 \leq 0.5$, and $0 \leq d < 1.0$; more preferably $0.1 \leq a \leq 0.9$, $0 \leq b1 \leq 0.4$, $0 \leq b2 \leq 0.4$, $0 \leq b1+b2 \leq 0.4$, and $0 \leq d \leq 0.9$; even more preferably $0.2 \leq a \leq 0.8$, $0 \leq b1 < 0.3$, $0 \leq b2 \leq 0.3$, $0 \leq b1+b2 \leq 0.3$, and $0 \leq d \leq 0.8$. It is noted that $a+b1+b2+d \leq 1.0$, preferably $a+b1+b2+d=1.0$.

(V) Organic Solvent

The resist composition may further comprise an organic solvent as component (V) The organic solvent used herein is not particularly limited as long as the components are soluble therein. Examples of the organic solvent are described in JP-A 2008-111103, paragraphs [0144] to [0145] (U.S. Pat. No. 7,537,880). Suitable solvents include ketones such as cyclohexanone, cyclopentanone, methyl-2-n-pentyl ketone and 2-heptanone; alcohols such as 3-methoxybutanol, 3-methyl-3-methoxybutanol, 1-methoxy-2-propanol, 1-ethoxy-2-propanol, and diacetone alcohol; ethers such as propylene glycol monomethyl ether (PGME), ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate (EL), ethyl pyruvate, butyl acetate, methyl 3-methoxypropionate, ethyl 3-ethoxypropionate, t-butyl acetate, t-butyl propionate, and propylene glycol mono-t-butyl ether acetate; and lactones such as γ-butyrolactone (GBL).

In the resist composition, the organic solvent is preferably used in an amount of 100 to 10,000 parts, more preferably 200 to 8,000 parts by weight per 80 parts by weight of the base polymer. The organic solvent may be used alone or in admixture.

(VI) Surfactant

The resist composition may further contain a surfactant as component (VI). Suitable surfactants are described in JP-A 2008-111103, paragraphs [0165-0166]. The addition of a surfactant is effective for improving or controlling the coating characteristics of the resist composition. In the resist composition, the surfactant is preferably used in an amount of 0.0001 to 10 parts by weight per 80 parts by weight of the base polymer. The surfactant may be used alone or in admixture.

(VII) Crosslinker

In one embodiment wherein the resist composition is of negative tone, a crosslinker is preferably added as component (VII). The addition of a crosslinker causes the base polymer in the exposed region to crosslink to reduce the dissolution rate of the resist film in developer for thereby forming a negative tone pattern.

Suitable crosslinkers include epoxy compounds, melamine compounds, guanamine compounds, glycoluril compounds and urea compounds having substituted thereon at least one group selected from among methylol, alkoxymethyl and acyloxymethyl groups, isocyanate compounds, azide compounds, and compounds having a double bond such as an alkenyloxy group.

Examples of the epoxy compound include tris(2,3-epoxypropyl) isocyanurate, trimethylolmethane triglycidyl ether, trimethylolpropane triglycidyl ether, and triethylolethane triglycidyl ether. Examples of the melamine compound include hexamethylol melamine, hexamethoxymethyl melamine, hexamethylol melamine compounds having 1 to 6 methylol groups methoxymethylated and mixtures thereof, hexamethoxyethyl melamine, hexaacyloxymethyl melamine, hexamethylol melamine compounds having 1 to 6 methylol groups acyloxymethylated and mixtures thereof. Examples of the guanamine compound include tetramethylol guanamine, tetramethoxymethyl guanamine, tetramethylol guanamine compounds having 1 to 4 methylol groups methoxymethylated and mixtures thereof, tetramethoxyethyl guanamine, tetraacyloxyguanamine, tetramethylol guanamine compounds having 1 to 4 methylol groups acyloxymethylated and mixtures thereof. Examples of the glycoluril compound include tetramethylol glycoluril, tetramethoxyglycoluril, tetramethoxymethyl glycoluril, tetramethylol glycoluril compounds having 1 to 4 methylol groups methoxymethylated and mixtures thereof, tetramethylol glycoluril compounds having 1 to 4 methylol groups acyloxymethylated and mixtures thereof. Examples of the urea compound include tetramethylol urea, tetramethoxymethyl urea, tetramethylol urea compounds having 1 to 4 methylol groups methoxymethylated and mixtures thereof, and tetramethoxyethyl urea.

Suitable isocyanate compounds include tolylene diisocyanate, diphenylmethane diisocyanate, hexamethylene diisocyanate and cyclohexane diisocyanate. Suitable azide compounds include 1,1'-biphenyl-4,4'-bisazide, 4,4"-methylidenebisazide, and 4,4'-oxybisazide. Examples of the alkenyloxy group-containing compound include ethylene glycol divinyl ether, triethylene glycol divinyl ether, 1,2-propanediol divinyl ether, 1,4-butanediol divinyl ether, tetramethylene glycol divinyl ether, neopentyl glycol divinyl ether, trimethylol propane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, and trimethylol propane trivinyl ether.

When the resist composition contains a crosslinker as component (VII), the crosslinker is preferably added in an amount of 0.1 to 50 parts, more preferably 1 to 30 parts by weight per 80 parts by weight of the base polymer. The crosslinker may be used alone or in admixture.

Pattern Forming Process

The resist composition is used in the fabrication of various integrated circuits. Pattern formation using the resist composition may be performed by well-known lithography processes. The process generally involves the steps of:

(i) applying the resist composition onto a substrate to form a resist film thereon, (ii) exposing the resist film to high-energy radiation, and (iii) developing the exposed resist film in a developer.

Step (i)

The resist composition is applied onto a substrate on which an integrated circuit is to be formed (e.g., Si, $SiO_2$, SiN, SiON, TiN, WSi, BPSG, SOG, or organic antireflective coating) or a substrate on which a mask circuit is to be formed (e.g., Cr, CrO, CrON, $MoSi_2$, or $SiO_2$) by a suitable coating technique such as spin coating, roll coating, flow coating, dipping, spraying or doctor coating. The coating is prebaked on a hotplate preferably at a suitable temperature for 30 seconds to 20 minutes to form a resist film having a thickness of 0.01 to 2 μm.

Step (ii)

The resist film is then exposed to a desired pattern of high-energy radiation such as UV deep-UV, EB, EUV of wavelength 3 to 15 nm, x-ray, soft x-ray, excimer laser light, γ-ray or synchrotron radiation. When UV, deep-UV, EUV, x-ray, soft x-ray, excimer laser light, γ-ray or synchrotron radiation is used as the high-energy radiation, the resist film is exposed thereto directly or through a mask having a desired pattern in a dose of preferably about 1 to 200 $mJ/cm^2$, more preferably about 10 to 100 $mJ/cm^2$. When EB is used as the high-energy radiation, the resist film is exposed thereto directly or through a mask having a desired pattern in a dose of preferably about 0.1 to 100 $\mu C/cm^2$, more preferably about 0.5 to 50 $\mu C/cm^2$. It is appreciated that the inventive resist composition is suited in micropatterning using KrF excimer laser, ArF excimer laser, EB, EUV, x-ray, soft x-ray, γ-ray or synchrotron radiation, especially in micropatterning using EB or EUV.

After the exposure, the resist film may be baked (PEB) on a hotplate or in an oven preferably at 50 to 150° C. for 10 seconds to 30 minutes, more preferably at 60 to 120° C. for 30 seconds to 20 minutes.

Step (iii)

After the exposure or PEB, the resist film is developed in a developer in the form of an aqueous base solution for 3 seconds to 3 minutes, preferably 5 seconds to 2 minutes by conventional techniques such as dip, puddle and spray techniques. A typical developer is a 0.1 to 10 wt %, preferably 2 to 5 wt % aqueous solution of tetramethylammonium hydroxide (TMAH), tetraethylammonium hydroxide (TEAH), tetrapropylammonium hydroxide (TPAH), or tetrabutylammonium hydroxide (TBAH). In the case of positive tone, the resist film in the exposed area is dissolved in the developer whereas the resist film in the unexposed area is not dissolved. In this way, the desired positive pattern is formed on the substrate. In the case of negative tone, inversely the resist film in the exposed area is insolubilized whereas the resist film in the unexposed area is dissolved away.

In an alternative embodiment, a negative pattern can be obtained from the positive resist composition comprising a base polymer containing acid labile groups by effecting organic solvent development. The developer used herein is preferably selected from among 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, pentyl acetate, butenyl acetate, isopentyl acetate, propyl formate, butyl formate, isobutyl formate, pentyl formate, isopentyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, pentyl lactate, isopentyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate, and mixtures thereof.

At the end of development, the resist film is rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents. Suitable alcohols of 3 to 10 carbon atoms include n-propyl alcohol, isopropyl alcohol, 1-butyl alcohol, 2-butyl alcohol, isobutyl alcohol, t-butyl alcohol, 1-pentanol, 2-pentanol, 3-pentanol, t-pentyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-s-butyl ether, di-n-pentyl ether, diisopentyl ether, di-s-pentyl ether, di-t-pentyl ether, and di-n-hexyl ether. Suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon atoms include hexyne, heptyne, and octyne. Suitable aromatic solvents include toluene, xylene, ethylbenzene, isopropylbenzene, t-butylbenzene and mesitylene.

Rinsing is effective for minimizing the risks of resist pattern collapse and defect formation. However, rinsing is not essential. If rinsing is omitted, the amount of solvent used may be reduced.

A hole or trench pattern after development may be shrunk by the thermal flow, RELACS® or DSA process. A hole pattern is shrunk by coating a shrink agent thereto, and baking such that the shrink agent may undergo crosslinking at the resist surface as a result of the acid catalyst diffusing from the resist layer during bake, and the shrink agent may attach to the sidewall of the hole pattern. The bake is preferably at a temperature of 70 to 180° C. more preferably 80 to 170° C., for a time of 10 to 300 seconds. The extra shrink agent is stripped and the hole pattern is shrunk.

EXAMPLES

Examples of the invention are given below by way of illustration and not by way of limitation. All parts are by weight (pbw).

Examples 1-1 to 1-21 and Comparative Examples 1-1 to 1-13 Preparation of Resist Compositions Resist compositions R-1 to R-21, cR-1 to cR-13 were prepared by dissolving components in a solvent containing 50 ppm of surfactant PolyFox PF-636 (Omnova Solutions Inc.) in accordance with the formulation shown in Tables 1 and 2 and filtering the solution through a filter having a pore size of 0.2 μm.

The components in Tables 1 and 2 are identified below.

Organic Solvents:

PD=mixture of 2800 pbw of propylene glycol monomethyl ether acetate and 1200 pbw of diacetone alcohol PDE=mixture of 1600 pbw of propylene glycol monomethyl ether acetate, 400 pbw of diacetone alcohol and 2000 pbw of ethyl lactate Base Polymers: P-1 to P-14

(P-1)

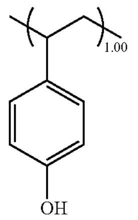

(P-2)

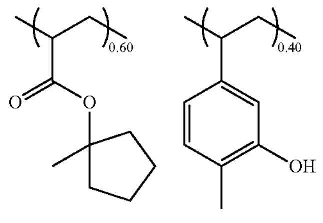

(P-3)

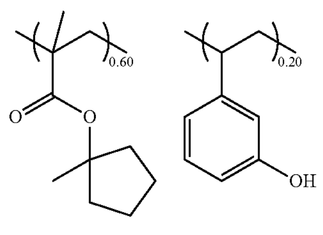

-continued
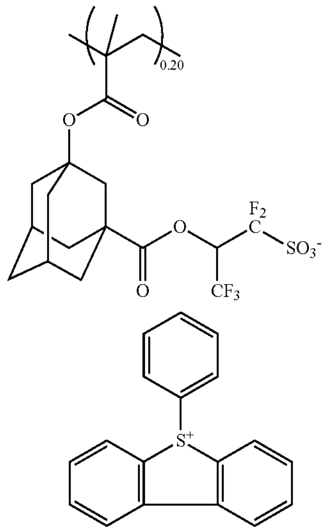
(P-4)
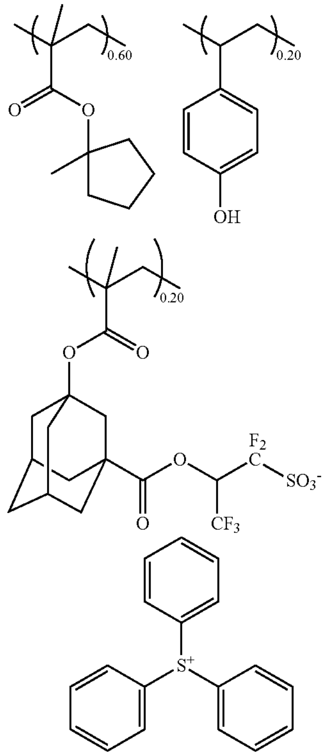
(P-5)
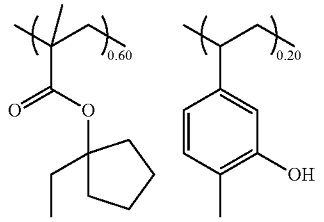
-continued
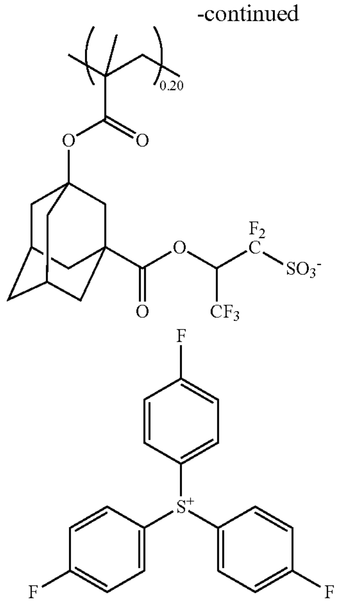
(P-6)
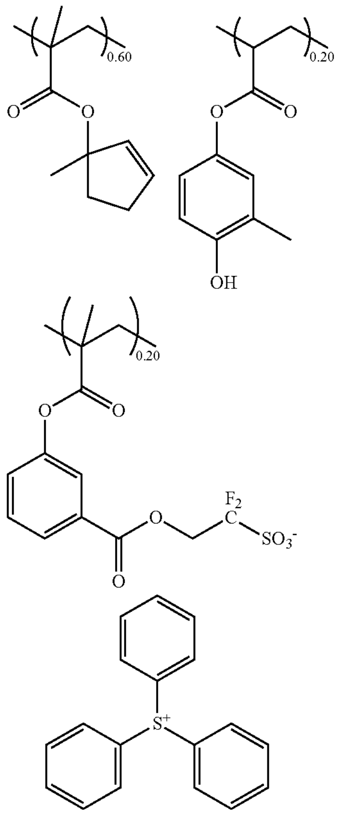
(P-7)
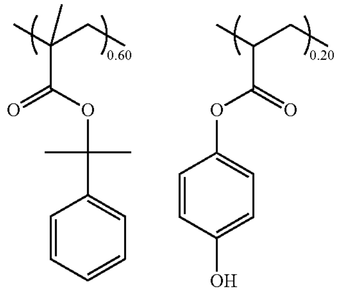

-continued
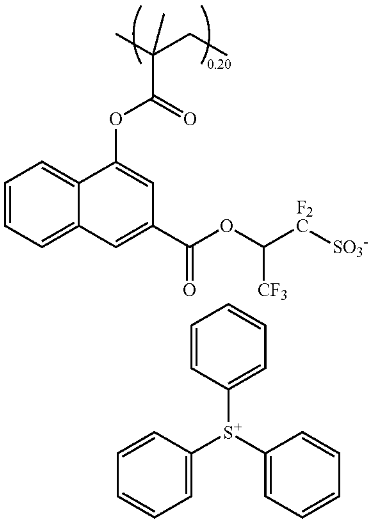
(P-8)
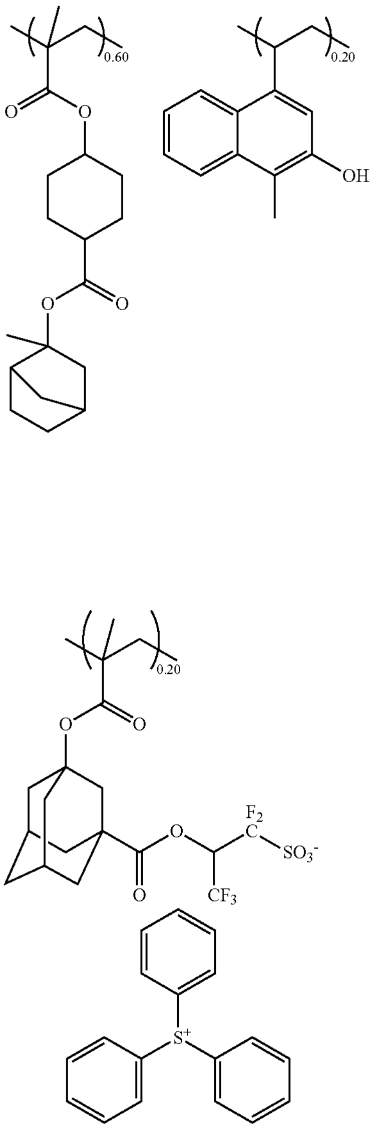
-continued
(P-9)
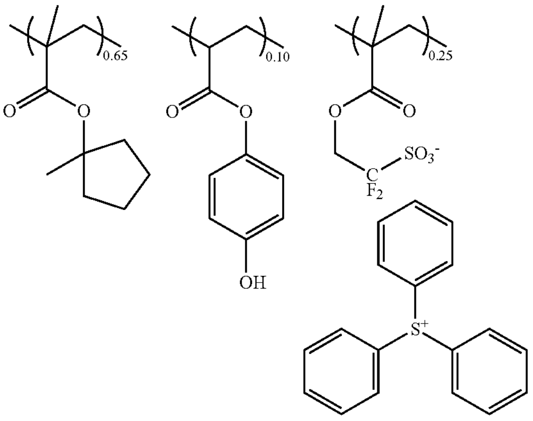
(P-10)
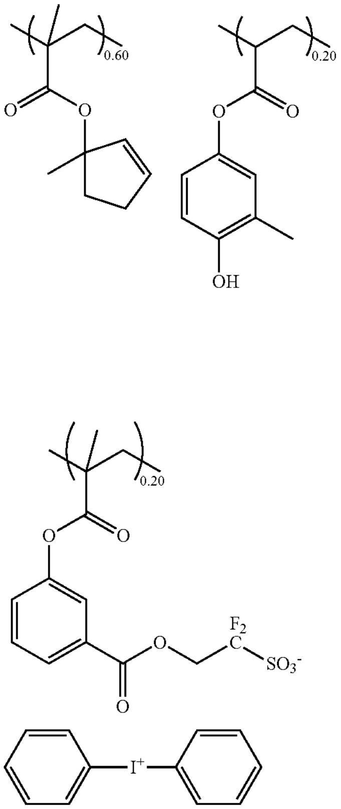
(P-11)
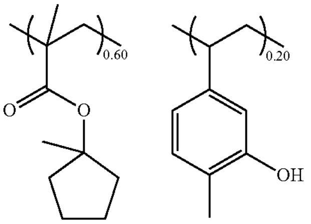

-continued
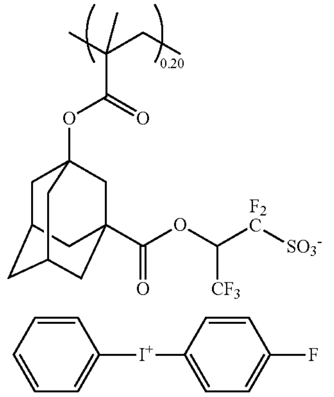
(P-12)
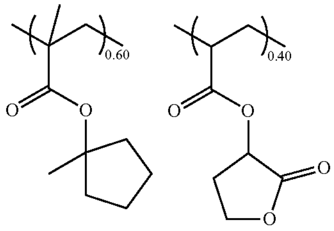
(P-13)
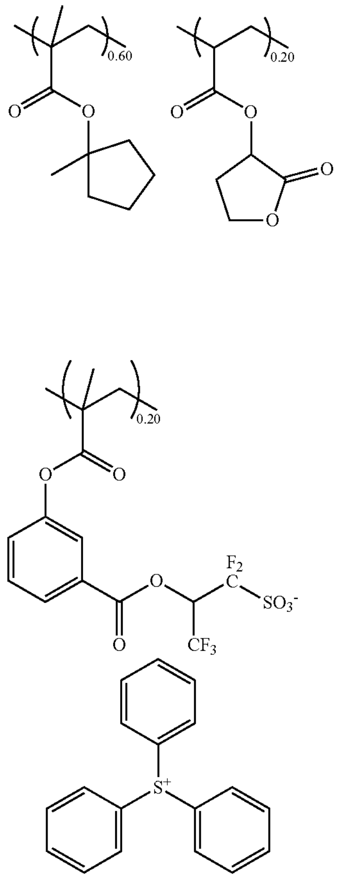
-continued
(P-14)
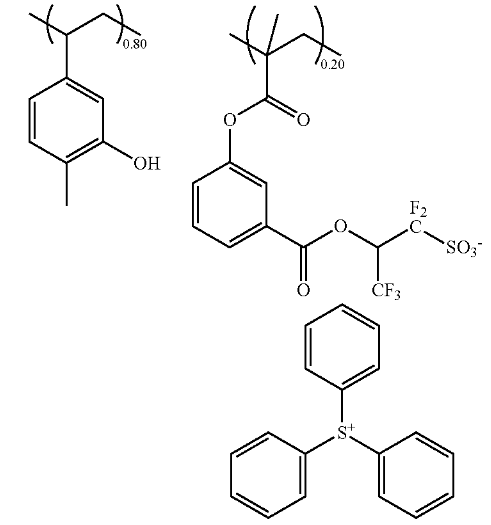
Photoacid Generators: PAG-1 to PAG-4, cPAG-1
(PAG-1)
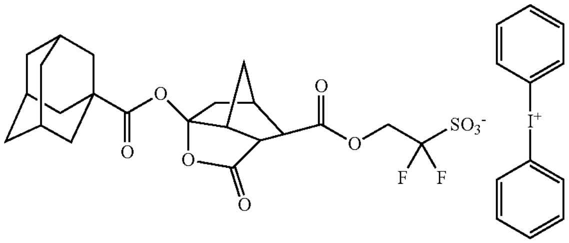
(PAG-2)
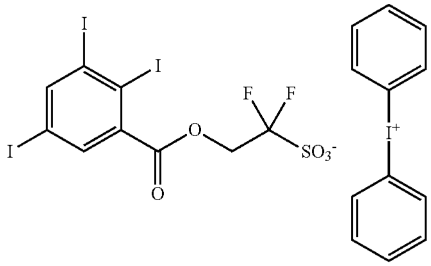
(PAG-3
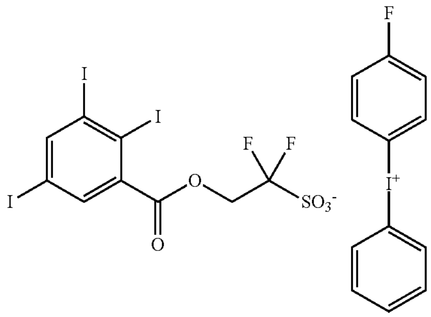

-continued
(PAG-4)
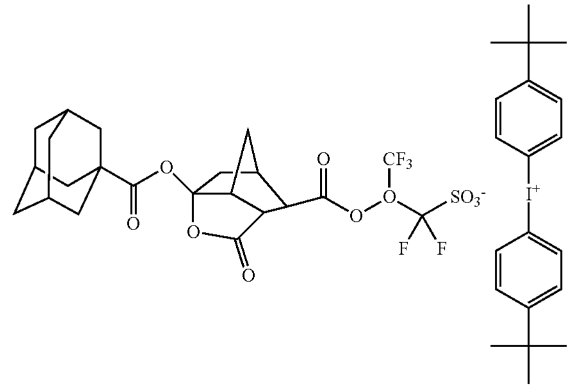
(cPAG-1)
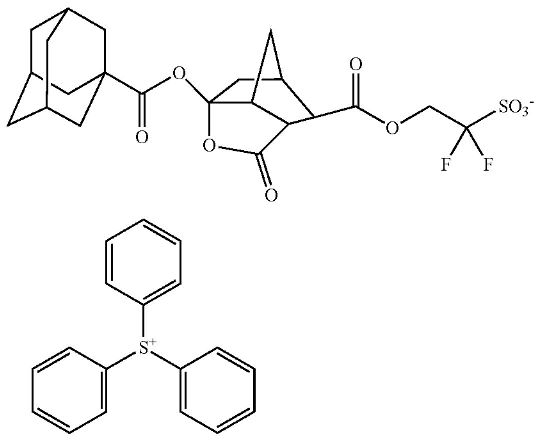
Quenchers: Q-1 to Q-8, cQ-1, cQ-2
(Q-1)
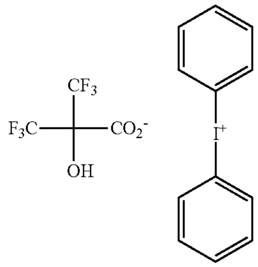
(Q-2)
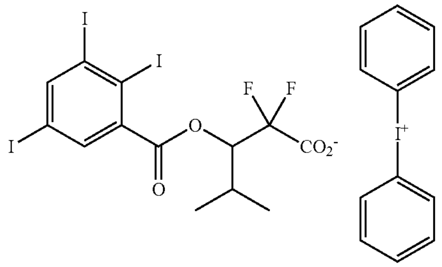
-continued
(Q-3)
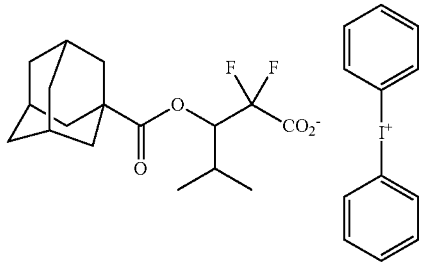
(Q-4)
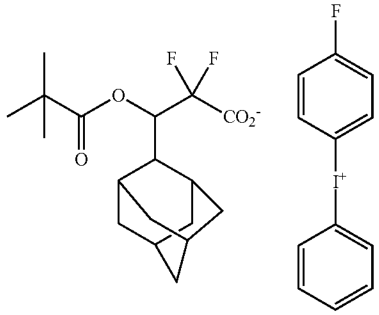
(Q-5)
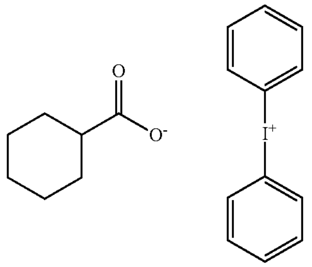
(Q-6)
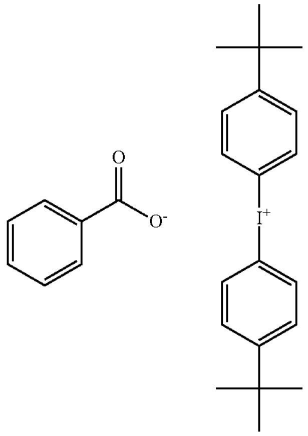
(Q-7)
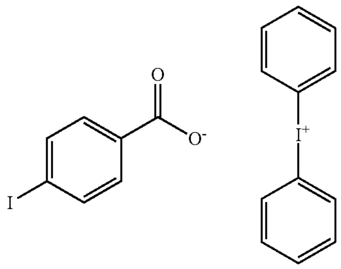

-continued
(Q-8)
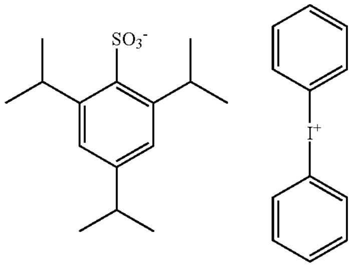
(cQ-1)
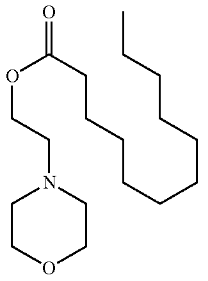
(cQ-2)
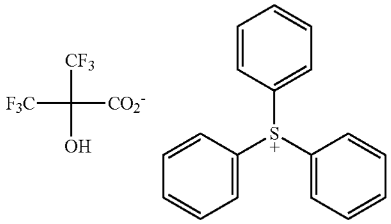
Acid Compounds: a-1 to a-4, ca-1, ca-2
(a-1)
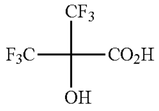
(a-2)
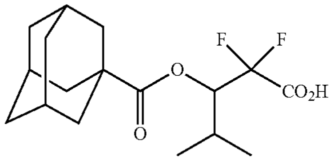
-continued
(a-3)
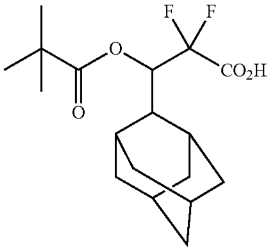
(a-4)
$CF_3CO_2H$
(ca-1)
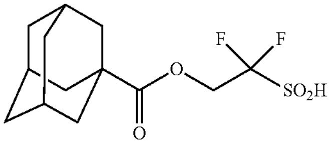
(ca-2)
$CH_3CO_2H$
Crosslinkers: X-1, X-2
(X-1)
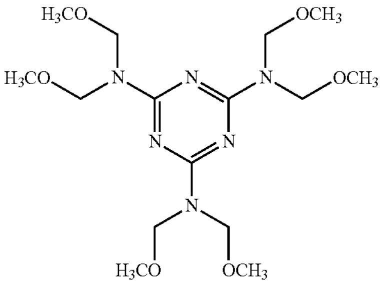
(X-2)
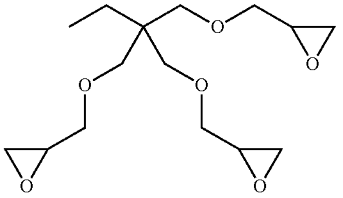
TABLE 1
| | Resist composition | Base polymer (pbw) | Photoacid generator (pbw) | Quencher (pbw) | Acid compound (pbw) | Additive (pbw) | Organic solvent |
|---|---|---|---|---|---|---|---|
| Example 1-1 | R-1 | P-2 (80) | PAG-1 (35) | Q-1 (10) | a-1 (4) | — | PD |
| 1-2 | R-2 | P-2 (80) | PAG-1 (35) | Q-2 (14) | a-2 (5) | — | PD |
| 1-3 | R-3 | P-2 (80) | PAG-2 (36) | Q-3 (12) | a-3 (5) | — | PD |
| 1-4 | R-4 | P-2 (80) | PAG-2 (36) | Q-4 (12) | a-4 (1) | — | PD |
| 1-5 | R-5 | P-2 (80) | PAG-3 (36) | Q-5 (10) | a-1 (1) | — | PD |
| 1-6 | R-6 | P-2 (80) | PAG-3 (36) | Q-6 (10) | a-2 (10) | — | PD |
| 1-7 | R-7 | P-2 (80) | PAG-4 (35) | Q-7 (11) | a-3 (5) | — | PD |

TABLE 1-continued

| | Resist composition | Base polymer (pbw) | Photoacid generator (pbw) | Quencher (pbw) | Acid compound (pbw) | Additive (pbw) | Organic solvent |
|---|---|---|---|---|---|---|---|
| 1-8 | R-8 | P-2 (80) | PAG-4 (35) | Q-8 (11) | a-4 (0.5) | — | PD |
| 1-9 | R-9 | P-3 (80) | PAG-1 (5) | Q-1 (10) | a-1 (0.5) | — | PDE |
| 1-10 | R-10 | P-4 (80) | PAG-2 (6) | Q-2 (14) | a-2 (1) | — | PDE |
| 1-11 | R-11 | P-5 (80) | PAG-3 (6) | Q-3 (12) | a-3 (5) | — | PDE |
| 1-12 | R-12 | P-6 (80) | PAG-4 (5) | Q-4 (12) | a-4 (0.5) | — | PDE |
| 1-13 | R-13 | P-7 (80) | PAG-1 (5) | Q-5 (10) | a-3 (10) | — | PDE |
| 1-14 | R-14 | P-8 (80) | — | Q-6 (10) | a-2 (10) | — | PDE |
| 1-15 | R-15 | P-9 (80) | — | Q-7 (11) | a-1 (0.9) | — | PDE |
| 1-16 | R-16 | P-10 (80) | — | Q-8 (11) | a-3 (2) | — | PDE |
| 1-17 | R-17 | P-11 (80) | — | Q-2 (14) | a-2 (2) | — | PDE |
| 1-18 | R-18 | P-1 (80) | PAG-1 (35) | Q-1 (10) | a-1 (0.9) | X-1 (28) | PD |
| 1-19 | R-19 | P-14 (80) | PAG-2 (6) | Q-2 (14) | a-2 (2) | X-2 (22) | PDE |
| 1-20 | R-20 | P-12 (80) | PAG-1 (5) | Q-1 (10) | a-1 (0.9) | — | PDE |
| 1-21 | R-21 | P-13 (80) | PAG-2 (6) | Q-2 (14) | a-2 (2) | — | PDE |

TABLE 2

| | | Resist composition | Base polymer (pbw) | Photoacid generator (pbw) | Quencher (pbw) | Acid compound (pbw) | Additive (pbw) | Organic solvent |
|---|---|---|---|---|---|---|---|---|
| Comparative Example | 1-1 | cR-1 | P-1 (80) | PAG-1 (35) | Q-1 (10) | — | X-1 (28) | PD |
| | 1-2 | cR-2 | P-14 (80) | PAG-2 (36) | Q-2 (14) | — | X-2 (22) | PD |
| | 1-3 | cR-3 | P-2 (80) | PAG-1 (35) | Q-2 (14) | — | — | PD |
| | 1-4 | cR-4 | P-2 (80) | PAG-2 (36) | Q-5 (10) | — | — | PD |
| | 1-5 | cR-5 | P-3 (80) | — | Q-6 (10) | — | — | PDE |
| | 1-6 | cR-6 | P-4 (80) | — | Q-7 (11) | — | — | PDE |
| | 1-7 | cR-7 | P-5 (80) | — | Q-8 (11) | — | — | PDE |
| | 1-8 | cR-8 | P-6 (80) | — | Q-1 (10) | ca-1 (5) | — | PDE |
| | 1-9 | cR-9 | P-7 (80) | — | Q-2 (14) | ca-2 (2) | — | PDE |
| | 1-10 | cR-10 | P-8 (80) | cPAG-1 (5) | cQ-1 (5) | a-1 (10) | — | PDE |
| | 1-11 | cR-11 | P-2 (80) | cPAG-1 (5) | cQ-2 (10) | a-2 (5) | — | PDE |
| | 1-12 | cR-12 | P-3 (80) | — | cQ-1 (5) | a-1 (10) | — | PDE |
| | 1-13 | cR-13 | P-4 (80) | — | cQ-2 (10) | a-2 (10) | — | PDE |

Examples 2-1 to 2-21 and Comparative Examples 2-1 to 2-9 Evaluation of Storage Stability Resist compositions R-1 to R-21, cR-1 to cR-9 were stored at 40° C. for 2 weeks, after which they were spin coated onto a 8-inch wafer having an antireflective coating of 61 nm thick formed of ARC fluid DUV-42 (Nissan Chemical Corp.) and prebaked on a hotplate for 60 seconds to form a resist film of ~50 nm thick.

Separately, resist compositions R-1 to R-21, cR-1 to cR-9 were stored at −10° C. for 2 weeks, after which they were spin coated onto a 8-inch wafer having an antireflective coating of 61 nm thick formed of ARC fluid DUV-42 (Nissan Chemical Corp.) and prebaked on a hotplate for 60 seconds to form a resist film of ~50 nm thick. For film thickness measurement, film thickness gauge VM-2210 (Hitachi High-Technologies Corp.) was used.

Using KrF excimer laser scanner S206D (Nikon Corp., NA=0.68, σ0.75, ⅔ annular illumination), the resist film was exposed to KrF through a 6% half-tone phase shift mask. The resist film was baked (PEB) on a hotplate at 95° C. for 60 seconds. After PEB, resist compositions R-1 to R-7, R-10 to R-21, cR-1 to cR-9 were developed in a 2.38 wt % TMAH aqueous solution for 30 seconds. Resist compositions R-8 and R-9 were developed in butyl acetate. The pattern as developed was observed under CD-SEM (S9380 by Hitachi High-Technologies Corp.) for evaluating sensitivity.

The dose at which a pattern having a line width of 90 nm was printed from a resist film was reported as the sensitivity. The range of sensitivity variation between the resist film of 40° C. storage and the resist film of −10° C. storage is shown in Tables 3 and 4. Storage stability was evaluated according to the following criterion. The results of Examples 2-1 to 2-21 are shown in Table 3 and the results of Comparative Examples 2-1 to 2-9 are shown in Table 4. Example 2-2 and Comparative Example 2-4 are selected as typical compositions for evaluating storage stability. FIG. 1 graphically, illustrates how the sensitivity variation shifts as the storage period is prolonged. It is noted that the sensitivity variation is calculated according to the following formula:

$$\text{sensitivity variation}=(D_{-10}-D_{40})/D_{-10}\times 100$$

wherein $D_{-10}$ is the sensitivity of the resist composition after storage at −10° C. for 2 weeks and $D_{40}$ is the sensitivity of the resist composition after storage at 40° C. for 2 weeks.

Judgment Criterion

Good: sensitivity variation<3%

Poor: sensitivity variation≥3%

TABLE 3

| | | Resist composition | Sensitivity variation (%) | Judgment |
|---|---|---|---|---|
| Example | 2-1 | R-1 | 2.0 | Good |
| | 2-2 | R-2 | 1.6 | Good |
| | 2-3 | R-3 | 1.0 | Good |
| | 2-4 | R-4 | 1.5 | Good |
| | 2-5 | R-5 | 1.6 | Good |
| | 2-6 | R-6 | 2.6 | Good |
| | 2-7 | R-7 | 2.4 | Good |
| | 2-8 | R-8 | 1.2 | Good |
| | 2-9 | R-9 | 1.7 | Good |
| | 2-10 | R-10 | 1.8 | Good |
| | 2-11 | R-11 | 2.3 | Good |
| | 2-12 | R-12 | 2.0 | Good |
| | 2-13 | R-13 | 2.1 | Good |
| | 2-14 | R-14 | 2.2 | Good |
| | 2-15 | R-15 | 2.2 | Good |
| | 2-16 | R-16 | 1.7 | Good |
| | 2-17 | R-17 | 1.8 | Good |
| | 2-18 | R-18 | 2.5 | Good |
| | 2-19 | R-19 | 2.4 | Good |
| | 2-20 | R-20 | 1.2 | Good |
| | 2-21 | R-21 | 1.1 | Good |

TABLE 4

| | | Resist composition | Sensitivity variation (%) | Judgment |
|---|---|---|---|---|
| Comparative | 2-1 | CR-1 | 5.1 | Poor |
| Example | 2-2 | CR-3 | 4.2 | Poor |
| | 2-3 | CR-3 | 4.5 | Poor |
| | 2-4 | CR-4 | 3.3 | Poor |
| | 2-5 | CR-5 | 3.6 | Poor |
| | 2-6 | CR-6 | 4.0 | Poor |
| | 2-7 | CR-7 | 4.1 | Poor |
| | 2-8 | CR-8 | 3.2 | Poor |
| | 2-9 | CR-9 | 3.1 | Poor |

As seen from Tables 3 and 4 and FIG. 1, the resist compositions containing the PAG of iodonium salt type and/or the photo-decomposable quencher, but not the acid compound gradually increase their sensitivity during storage at 40° C., marking a large difference from the sensitivity of the resist compositions of −10° C. storage. In contrast, the resist compositions containing the PAG of iodonium salt type and/or the photo-decomposable quencher, and the acid compound show a narrow range of sensitivity variation. It is believed that the addition of the acid compound is effective for restraining decomposition of the iodonium salt during storage.

Examples 3-1 to 3-17 and Comparative Examples 3-1 to 3-4 EUV Lithography Test Each of the resist compositions R-1 to R-17 and cR-10 to cR-13 was spin coated on a silicon substrate having a 20-nm coating of silicon-containing spin-on hard mask SHB-A940 (silicon content 43 wt %, Shin-Etsu Chemical Co., Ltd.) and prebaked on a hotplate at 105° C. for 60 seconds to form a resist film of 50 nm thick. Using an EUV seamier NXE3300 (ASML, NA 0.33, σ0.9/0.6, dipole illumination), the resist film was exposed to EUV of wavelength 13.5 nm through a mask hearing a line-and-space (LS) pattern having an on-wafer size of 18 nm and a pitch 36 nm while the dose and focus of EUV were varied at a dose pitch of 1 mJ/cm$^2$ and a focus pitch of 0.020 μm. The resist film was baked (PEB) on a hotplate at 95° C. for 60 seconds. After PEB, resist compositions R-1 to R-7, R-10 to R-17 and cR-10 to cR-13 were puddle developed in a 2.38 wt % TMAH aqueous solution for 30 seconds and spin dried to form a positive pattern. Resist compositions R-8 and R-9 were developed in butyl acetate to form a negative pattern. The LS pattern as developed was observed wider CD-SEM (CG6300 by Hitachi High-Technologies Corp.). The optimum dose Eop (mJ/cm$^2$) at which a LS pattern having a line width of 18 nm and a pitch of 36 nm was printed was determined and reported as sensitivity. The pattern size was measured, from which a 3-fold value (3σ) of the standard deviation (σ) was computed and reported as line width roughness (LWR). The results of Examples 3-1 to 3-17 are shown in Table 5 and the results of Comparative Examples 3-1 to 3-4 are shown in Table 6.

Judgment Criterion

Excellent: Eop<30 mJ/cm$^2$ and LWR<4.0

Good: Eop<30 mJ/cm$^2$ and 4.0≤LWR<4.5

Poor: Eop≥30 mJ/cm$^2$ and LWR≥4.5

TABLE 5

| | | Resist composition | Eop | LWR | Judgment |
|---|---|---|---|---|---|
| Example | 3-1 | R-1 | 29.3 | 4.2 | Good |
| | 3-2 | R-2 | 29.1 | 4.1 | Good |
| | 3-3 | R-3 | 27.8 | 4.0 | Good |

TABLE 5-continued

| | Resist composition | Eop | LWR | Judgment |
|---|---|---|---|---|
| 3-4 | R-4 | 27.7 | 4.4 | Good |
| 3-5 | R-5 | 26.8 | 4.2 | Good |
| 3-6 | R-6 | 29.4 | 4.3 | Good |
| 3-7 | R-7 | 29.2 | 4.1 | Good |
| 3-8 | R-8 | 28.6 | 4.2 | Good |
| 3-9 | R-9 | 28.7 | 3.6 | Excellent |
| 3-10 | R-10 | 28.9 | 3.6 | Excellent |
| 3-11 | R-11 | 27.9 | 3.6 | Excellent |
| 3-12 | R-12 | 29.0 | 3.5 | Excellent |
| 3-13 | R-13 | 28.4 | 3.6 | Excellent |
| 3-14 | R-14 | 28.4 | 3.6 | Excellent |
| 3-15 | R-15 | 29.2 | 3.6 | Excellent |
| 3-16 | R-16 | 28.2 | 3.5 | Excellent |
| 3-17 | R-17 | 28.1 | 3.5 | Excellent |

TABLE 6

| | | Resist composition | Eop | LWR | Judgment |
|---|---|---|---|---|---|
| Comparative Example | 3-1 | CR-10 | 35.0 | 5.2 | Poor |
| | 3-2 | CR-11 | 35.2 | 5.3 | Poor |
| | 3-3 | CR-12 | 36.4 | 5.0 | Poor |
| | 3-4 | CR-13 | 34.2 | 5.1 | Poor |

As is evident from Tables 5 and 6, the resist compositions within the scope of the invention show reduced edge roughness and size variation, indicating satisfactory storage stability.

Japanese Patent Application No. 2022-126073 is incorporated herein by reference. Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A resist composition comprising (I) an acid compound having the formula (A):

(A)

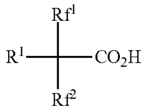

wherein $R^1$ is fluorine, hydroxy or a $C_1$-$C_{20}$ hydrocarbyl group which may contain a heteroatom, $Rf^1$ and $Rf^2$ are each independently fluorine or trifluoromethyl, (II) an acid generator having the formula (1):

$$Ar^1—I^+—Ar^2(Xa^{n-})_{1/n} \quad (1)$$

wherein $Ar^1$ and $Ar^2$ are each independently a $C_6$-$C_{18}$ aryl group which may contain a heteroatom, $Xa^{n-}$ is an n-valent anion of strong acid, and n is an integer of at least 1 and/or (III) a photo-decomposable quencher having the formula (2):

$$Ar^3—I^+—Ar^4(Xq^{m-})_{1/m} \quad (2)$$

wherein $Ar^3$ and $Ar^4$ are each independently a $C_6$-$C_{18}$ aryl group which may contain a heteroatom, $Xq^{m-}$ is an m-valent anion of weak acid, and m is an integer of at least 1, and (IV) a base polymer adapted to change its dissolution rate in a developer under the action of an acid.

2. A resist composition comprising (I) an acid compound having the formula (A):

(A)

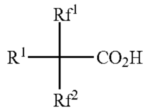

wherein $R^1$ is fluorine, hydroxy or a $C_1$-$C_{20}$ hydrocarbyl group which may contain a heteroatom, $Rf^1$ and $Rf^2$ are each independently fluorine or trifluoromethyl, and (IV') a base polymer adapted to change its dissolution rate in a developer under the action of an acid and comprising repeat units having the formula (b1):

(b1)

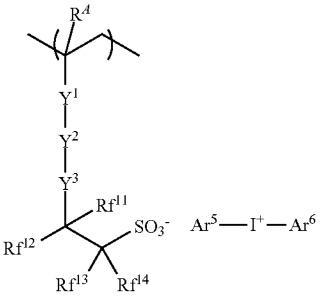

wherein $R^A$ is hydrogen or methyl, $Y^1$ is a single bond or ester bond, $Y^2$ is a single bond or a $C_1$-$C_{20}$ hydrocarbylene group which may contain at least one moiety selected from an ester bond, ether bond, lactone ring, amide bond, sultone ring and iodine, $Y^3$ is a single bond, ether bond or ester bond, $Rf^{11}$ to $Rf^{14}$ are each independently hydrogen, fluorine or trifluoromethyl, at least one thereof being fluorine or trifluoromethyl, and $Ar^5$ and $Ar^6$ are each independently a $C_6$-$C_{18}$ aryl group which may contain a heteroatom.

3. The resist composition of claim 2, further comprising (III) a photo-decomposable quencher having the formula (2):

$$Ar^3—I^+—Ar^4(Xq^{m-})_{1/m} \quad (2)$$

wherein $Ar^3$ and $Ar^4$ are each independently a $C_6$-$C_{18}$ aryl group which may contain a heteroatom, $Xq^{m-}$ is an m-valent anion of weak acid, and m is an integer of at least 1.

4. The resist composition of claim 1 wherein the acid compound having formula (A) has any one of the formulae (A-1) to (A-3):

(A-1)

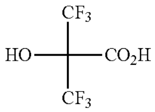

-continued (A-2)

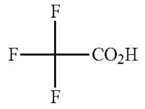

(A-3)

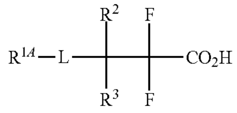

wherein $R^{1A}$ is hydrogen or a $C_1$-$C_{20}$ hydrocarbyl group which may contain a heteroatom, $R^2$ and $R^3$ are each independently hydrogen or a $C_1$-$C_{20}$ hydrocarbyl group, $R^2$ and $R^3$ may bond together to form a ring with the carbon atom to which they are attached, and L is a single bond, ether bond or ester bond.

5. The resist composition of claim 1 wherein the base polymer comprises repeat units having the formula (a):

(a)

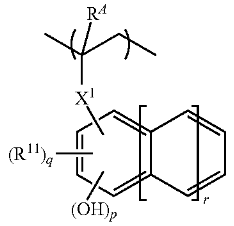

wherein $R^A$ is hydrogen or methyl, $X^1$ is a single bond, ester bond, amide bond, or a $C_1$-$C_{12}$ divalent linking group containing at least one moiety selected from phenylene, naphthylene, ester bond, ether bond, lactone ring, and amide bond, $R^{11}$ is hydrogen, fluorine, or a $C_1$-$C_6$ saturated hydrocarbyl group, $R^{11}$ and $X^1$ may bond together to form a ring with the carbon atoms on the aromatic ring to which they are attached, p is 1 or 2, q is an integer of 0 to 4, p+q is from 1 to 5, and r is 0 or 1.

6. The resist composition of claim 1 wherein the base polymer comprises repeat units having a structural site which is decomposed to generate an acid upon exposure to actinic ray or radiation.

7. The resist composition of claim 6 wherein the repeat units having a structural site which is decomposed to generate an acid upon exposure to actinic ray or radiation have the formula (b2):

(b2)

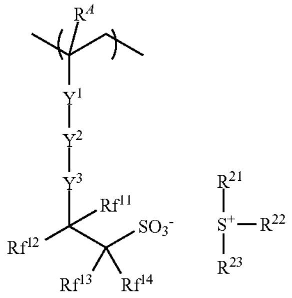

wherein $R^A$ is hydrogen or methyl, $Y^1$ is a single bond or ester bond, $Y^2$ is a single bond or a $C_1$-$C_{20}$ hydrocarbylene group which may contain at least one moiety selected from an ester bond, ether bond, lactone ring, amide bond, sultone ring and iodine, $Y^3$ is a single bond, ether bond or ester bond, $Rf^{11}$ to $Rf^{14}$ are each independently hydrogen, fluorine or trifluoromethyl, at least one thereof being fluorine or trifluoromethyl, $R^{21}$ to $R^{23}$ are each independently a $C_1$-$C_{20}$ hydrocarbyl group which may contain a heteroatom, $R^{21}$ and $R^{22}$ may bond together to form a ring with the sulfur atom to which they are attached.

8. The resist composition of claim 1 wherein the base polymer further comprises repeat units (c) having a carboxy group whose hydrogen is substituted by an acid labile group.

9. The resist composition of claim 8 wherein the repeat units (c) have the formula (c):

(c)

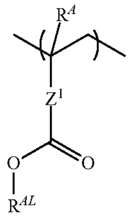

wherein $R^A$ is hydrogen or methyl, $Z^1$ is a single bond, phenylene group, naphthylene group, or a $C_1$-$C_{12}$ linking group containing at least one moiety selected from an ester bond, ether bond and lactone ring, and $R^{AL}$ is an acid labile group.

10. The resist composition of claim 1 wherein the base polymer is free of repeat units substituted with an acid labile group.

11. The resist composition of claim 10, further comprising a crosslinker.

12. A pattern forming process comprising the steps of (i) applying the resist composition of claim 1 onto a substrate to form a resist film thereon, (ii) exposing the resist film to high-energy radiation, and (iii) developing the exposed resist film in a developer.

* * * * *